US012369381B2

(12) United States Patent
Yamanaka et al.

(10) Patent No.: US 12,369,381 B2
(45) Date of Patent: Jul. 22, 2025

(54) SEMICONDUCTOR DEVICE

(71) Applicant: ROHM CO., LTD., Kyoto (JP)

(72) Inventors: Takaaki Yamanaka, Kyoto (JP); Yuki Nakano, Kyoto (JP); Kenji Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 726 days.

(21) Appl. No.: 17/639,528

(22) PCT Filed: Sep. 25, 2020

(86) PCT No.: PCT/JP2020/036289
§ 371 (c)(1),
(2) Date: Mar. 1, 2022

(87) PCT Pub. No.: WO2021/065722
PCT Pub. Date: Apr. 8, 2021

(65) Prior Publication Data
US 2022/0336598 A1 Oct. 20, 2022

(30) Foreign Application Priority Data

Sep. 30, 2019 (JP) ................. 2019-180861

(51) Int. Cl.
H10D 64/23 (2025.01)
H01L 21/04 (2006.01)
(Continued)

(52) U.S. Cl.
CPC ......... H10D 64/23 (2025.01); H01L 21/0475 (2013.01); H01L 21/0495 (2013.01);
(Continued)

(58) Field of Classification Search
CPC ............... H01L 29/417; H01L 21/0475; H01L 21/0495; H01L 23/3121; H01L 23/3675;
(Continued)

(56) References Cited

U.S. PATENT DOCUMENTS

2012/0146055 A1* 6/2012 Mitani ................. H10D 62/126
257/77
2014/0118934 A1* 5/2014 Tokuyama ............... H01L 24/33
361/689
(Continued)

FOREIGN PATENT DOCUMENTS

JP 2013009501 1/2013
JP 2014187073 10/2014
(Continued)

OTHER PUBLICATIONS

International Search Report and Written Opinion issued for International Patent Application No. PCT/JP2020/036289, Date of mailing: Dec. 22, 2020, 13 pages including English translation of Search Report.

(Continued)

Primary Examiner — Khaja Ahmad
Assistant Examiner — Khatib A Rahman
(74) Attorney, Agent, or Firm — XSENSUS LLP

(57) ABSTRACT

A semiconductor device includes a chip, an electrode that is formed on the chip, an inorganic insulating layer that covers the electrode and has a first opening exposing the electrode, an organic insulating layer that covers the inorganic insulating layer, has a second opening surrounding the first opening at an interval from the first opening, and exposes an inner peripheral edge of the inorganic insulating layer in a region between the first opening and the second opening, and an Ni plating layer that covers the electrode inside the first opening and covers the inner peripheral edge of the inorganic insulating layer inside the second opening.

20 Claims, 43 Drawing Sheets

(51) Int. Cl.
  *H01L 23/31*    (2006.01)
  *H01L 23/367*   (2006.01)
  *H10D 8/01*     (2025.01)
  *H10D 8/60*     (2025.01)
  *H10D 62/832*   (2025.01)
  *H10D 64/64*    (2025.01)

(52) U.S. Cl.
  CPC ...... *H01L 23/3121* (2013.01); *H01L 23/3675* (2013.01); *H10D 8/051* (2025.01); *H10D 8/60* (2025.01); *H10D 62/8325* (2025.01); *H10D 64/64* (2025.01)

(58) Field of Classification Search
  CPC ................. H01L 29/1608; H01L 29/47; H01L 29/6606; H01L 29/872; H01L 23/4334; H01L 23/49537; H01L 23/49562; H01L 23/49575; H01L 2224/4514; H01L 24/05; H01L 2224/02126; H01L 2224/0603; H01L 23/3171; H01L 23/3192; H01L 29/7397; H01L 29/0623; H01L 29/0696; H01L 29/1095; H01L 29/407; H01L 29/42372; H01L 29/66068; H01L 23/53295; H01L 24/33; H01L 24/48; H01L 29/7811; H01L 29/7813; H01L 2224/33181; H01L 2224/45124; H01L 2224/45144; H01L 2224/48091; H01L 2224/48247; H01L 2224/49171; H01L 2224/73215; H01L 2224/73265; H01L 25/07; H01L 25/18; H01L 23/293; H01L 23/522; H01L 23/532; H01L 29/739; H01L 29/78; H01L 2224/4917; H01L 2224/45147; H10D 64/23; H10D 8/051; H10D 8/60; H10D 62/8325; H10D 64/64; H10D 12/481; H10D 12/031; H10D 62/107; H10D 62/127; H10D 64/117; H10D 30/665; H10D 30/668; H10D 64/517; H10D 62/393; H10D 12/00; H10D 30/60

See application file for complete search history.

(56) References Cited

U.S. PATENT DOCUMENTS

| | | | |
|---|---|---|---|
| 2014/0284790 A1* | 9/2014 | Matsumoto | H01L 24/06 257/737 |
| 2016/0240484 A1* | 8/2016 | Shigihara | H01L 23/53238 |
| 2017/0092605 A1 | 3/2017 | Tonegawa | |
| 2017/0186847 A1* | 6/2017 | Hikasa | H10D 64/23 |
| 2017/0294400 A1 | 10/2017 | Haga et al. | |
| 2018/0315826 A1* | 11/2018 | Hikasa | H10D 64/01 |
| 2019/0229211 A1* | 7/2019 | Bu | H01L 29/66068 |
| 2019/0333986 A1* | 10/2019 | Fukui | H10D 62/154 |
| 2019/0341308 A1* | 11/2019 | Urakami | H01L 21/02104 |
| 2019/0393333 A1 | 12/2019 | Fujita et al. | |
| 2021/0104629 A1* | 4/2021 | Fujioka | H10D 30/66 |

FOREIGN PATENT DOCUMENTS

| | | |
|---|---|---|
| JP | 2017069381 | 4/2017 |
| JP | 2017191840 | 10/2017 |
| WO | 2018167925 | 9/2018 |

OTHER PUBLICATIONS

International Preliminary Report on Patentability issued for International Patent Application No. PCT/JP2020/036289, Date of mailing: Apr. 14, 2022, 15 pages including English translation.

Japanese Notice of Reasons for Refusal issued Jul. 25, 2024 in corresponding Japanese Patent Application No. 2021-551185, 9 pages.

Notice of Reasons for Refusal issued on Jan. 30, 2025 in corresponding Japanese Divisional Patent Application No. 2024-226031 (5 pages; with English machine translation).

* cited by examiner

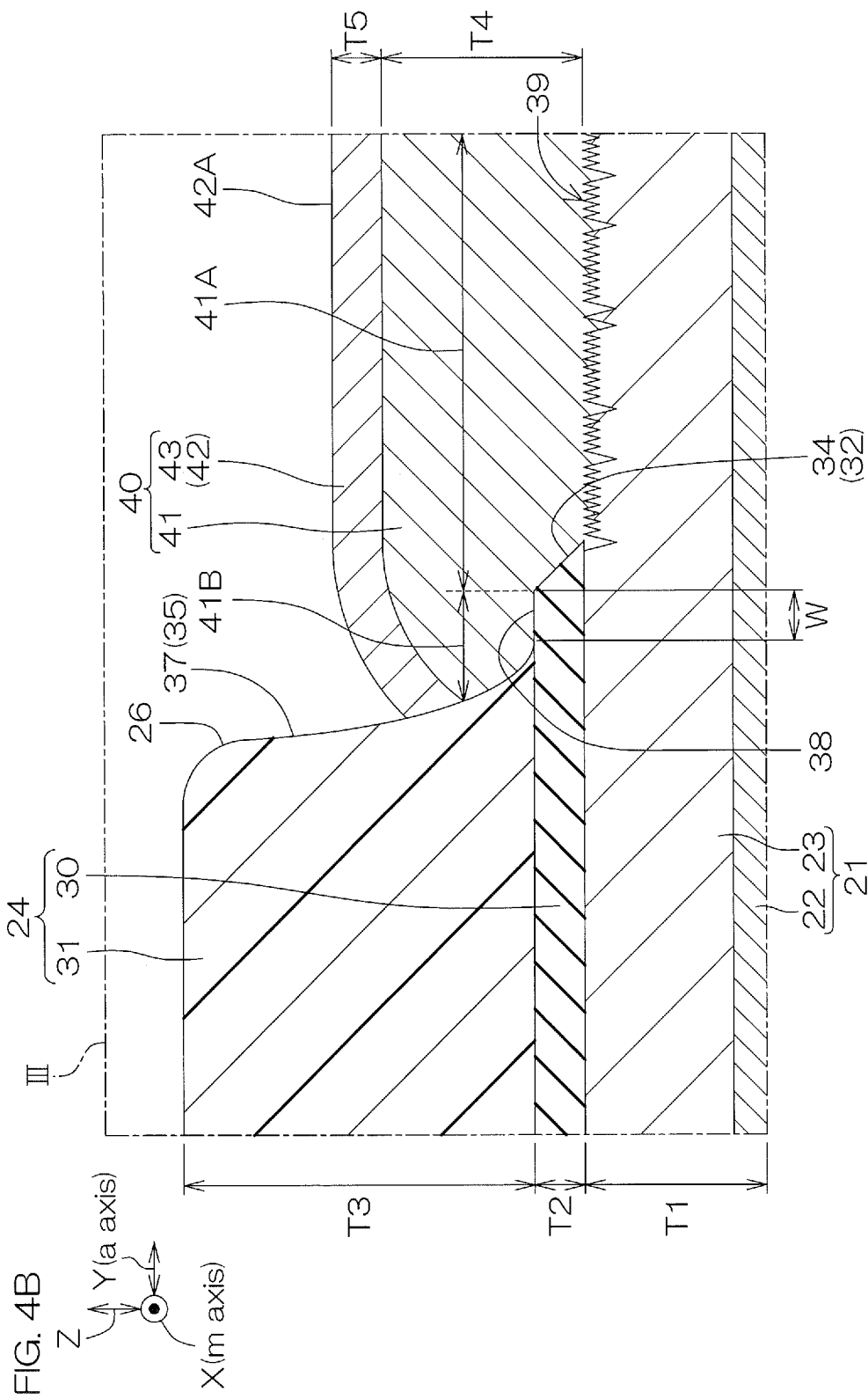

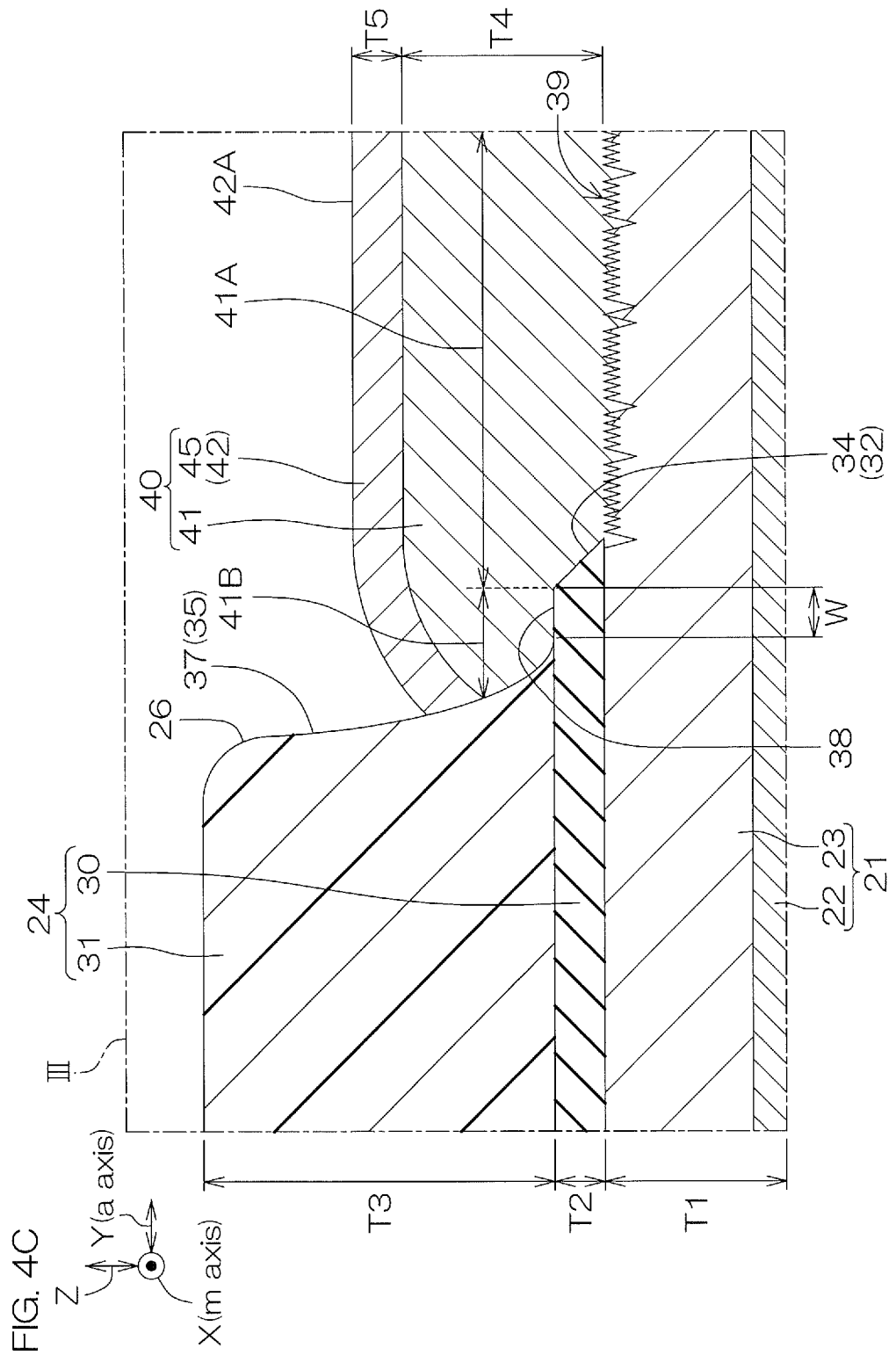

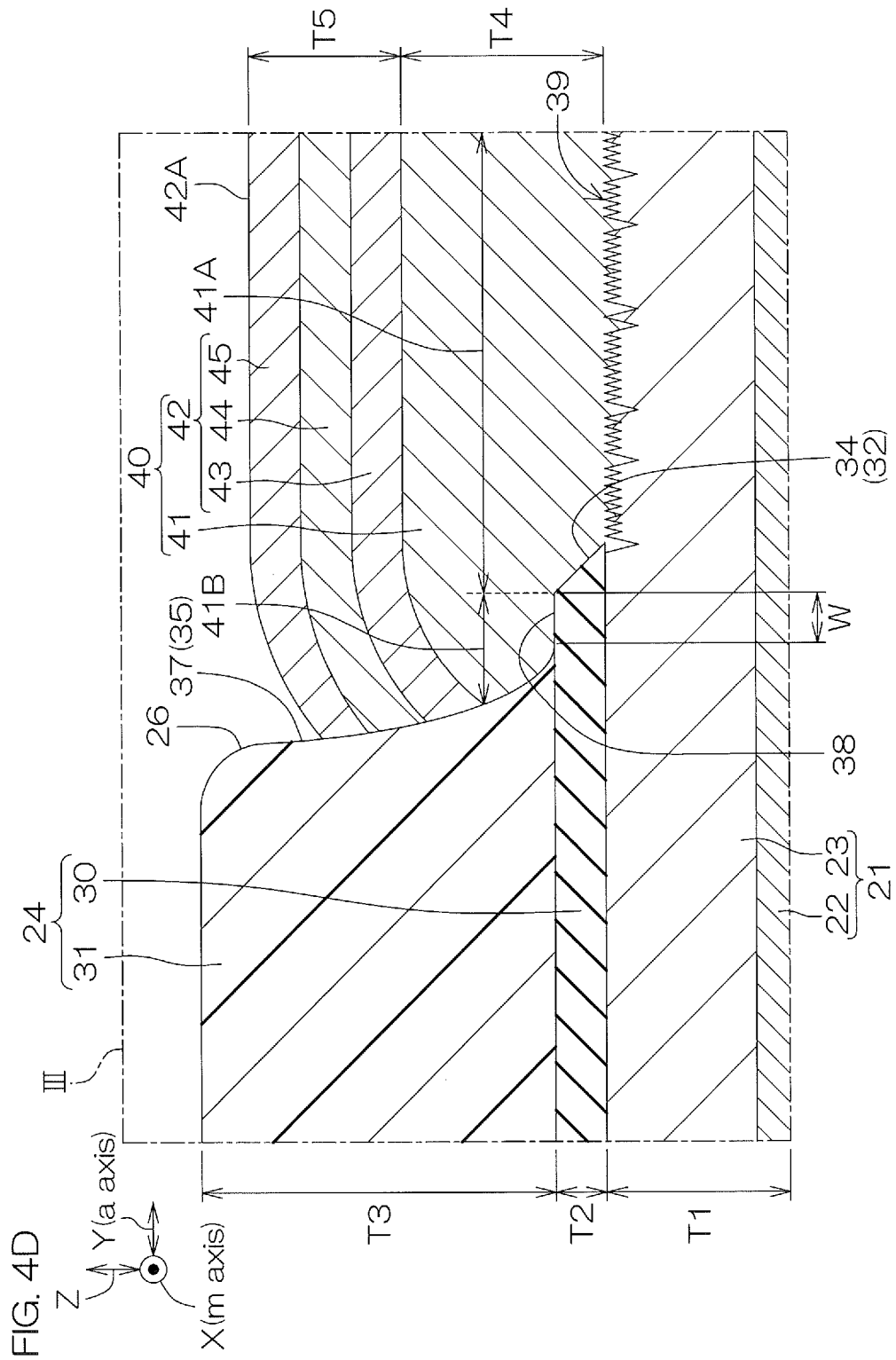

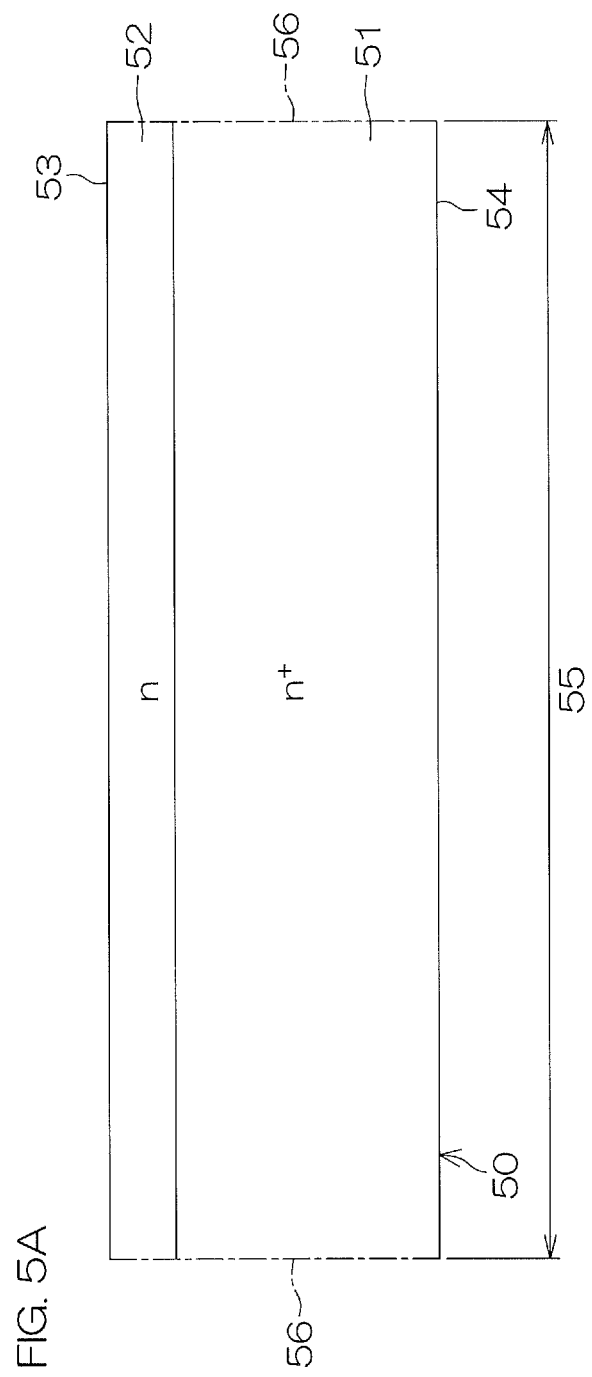

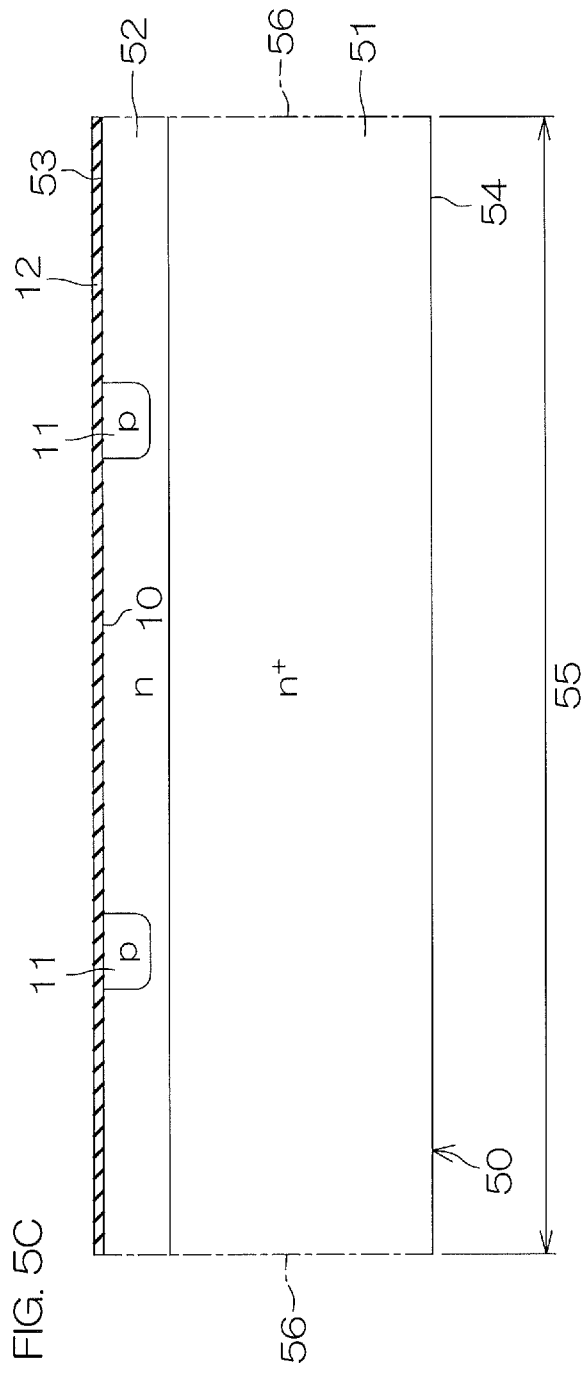

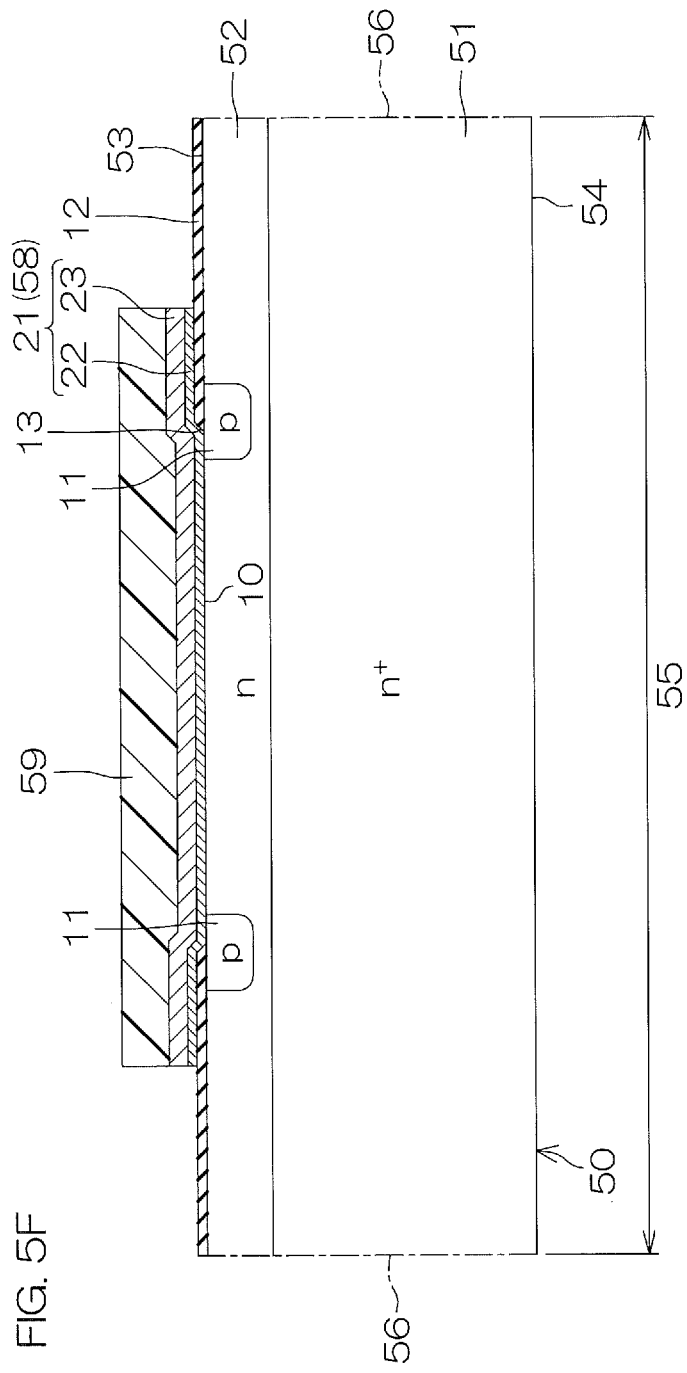

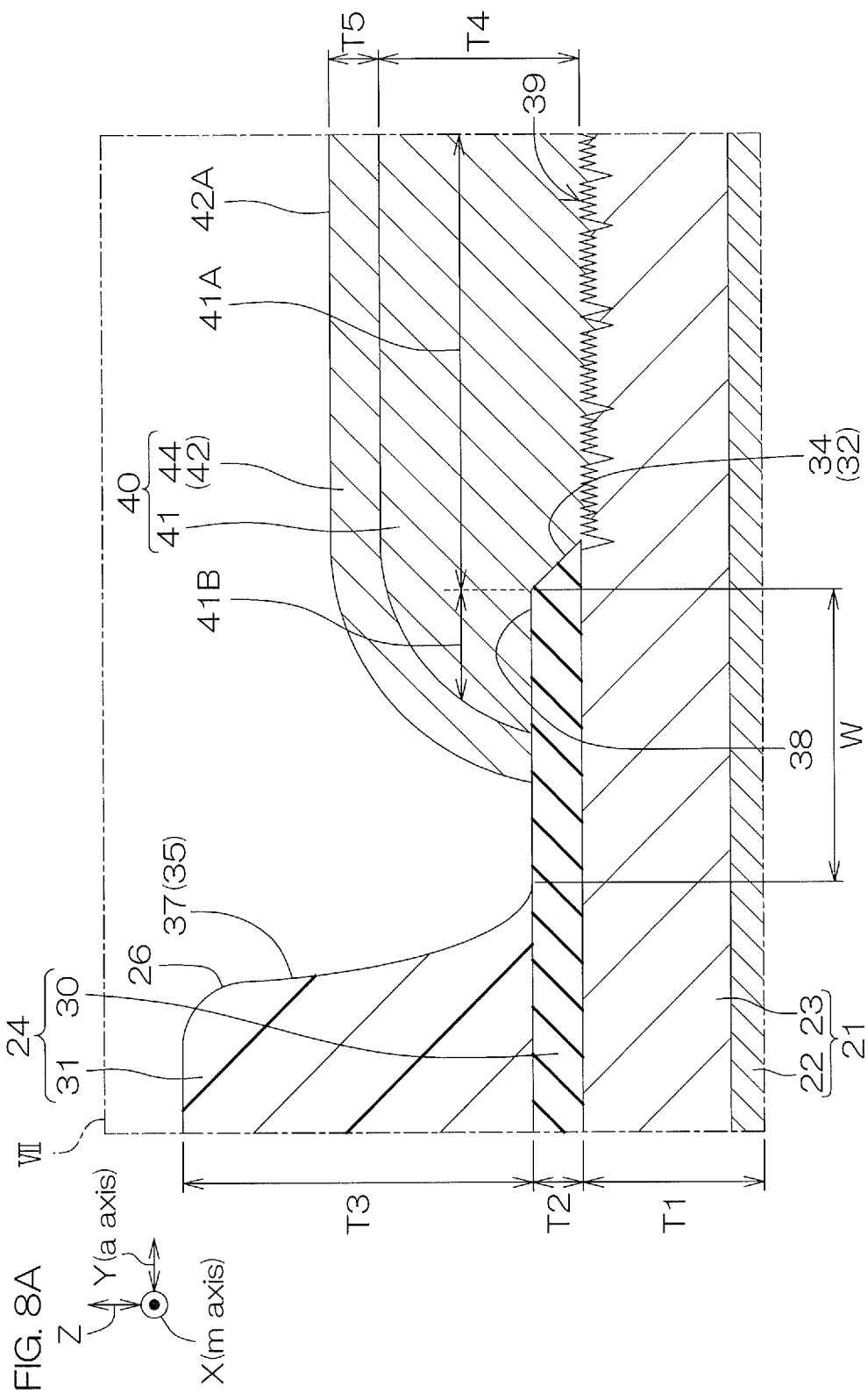

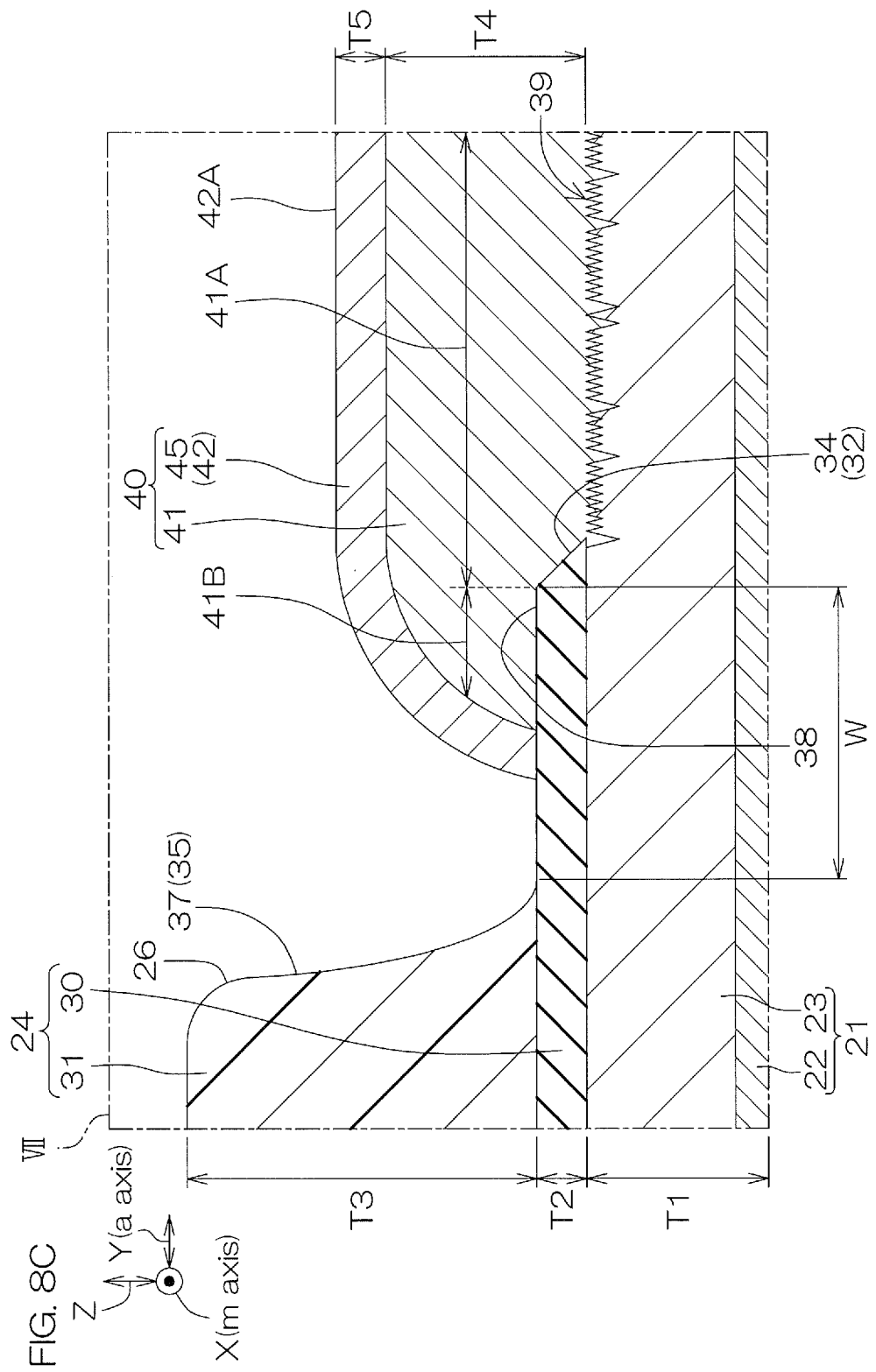

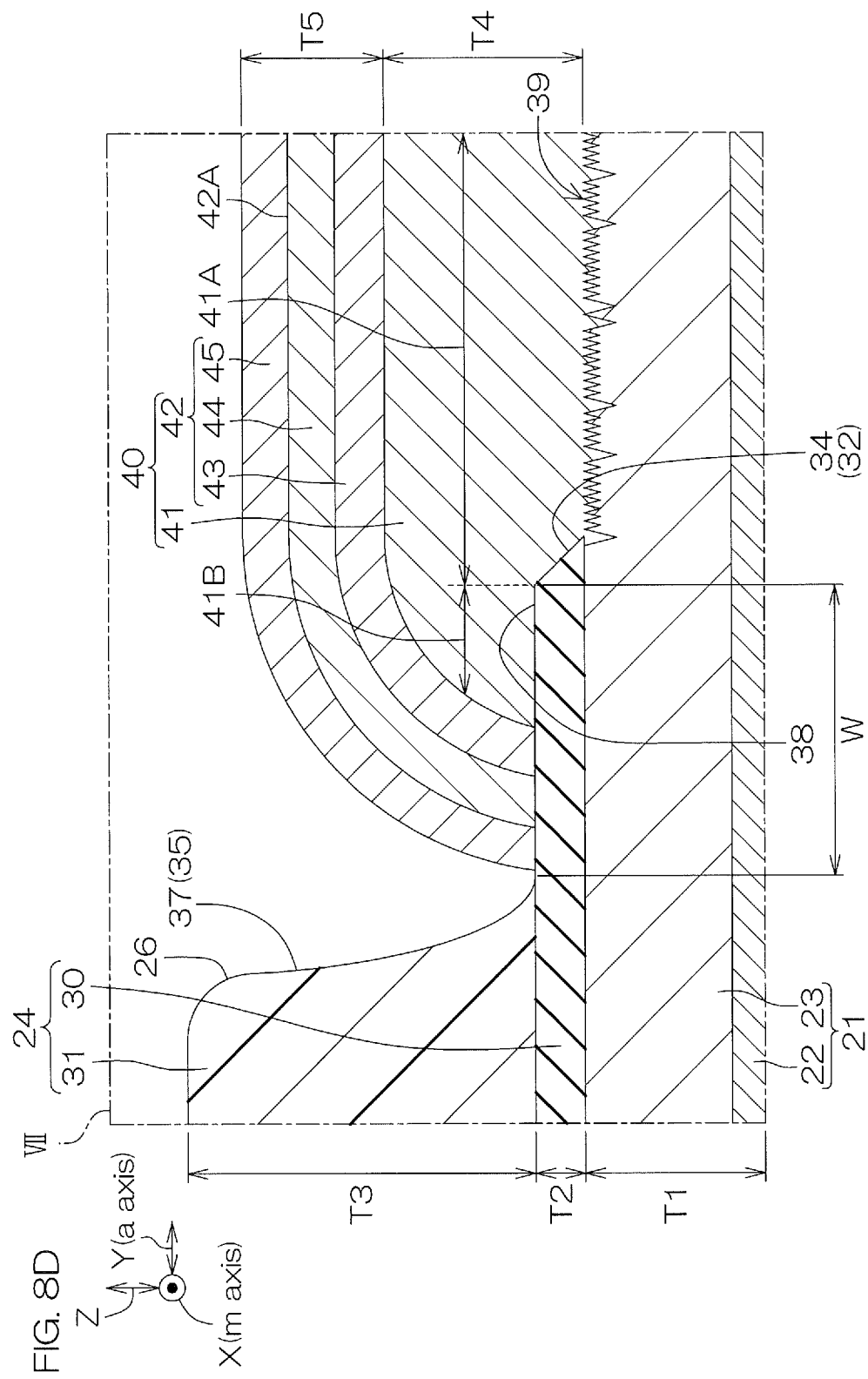

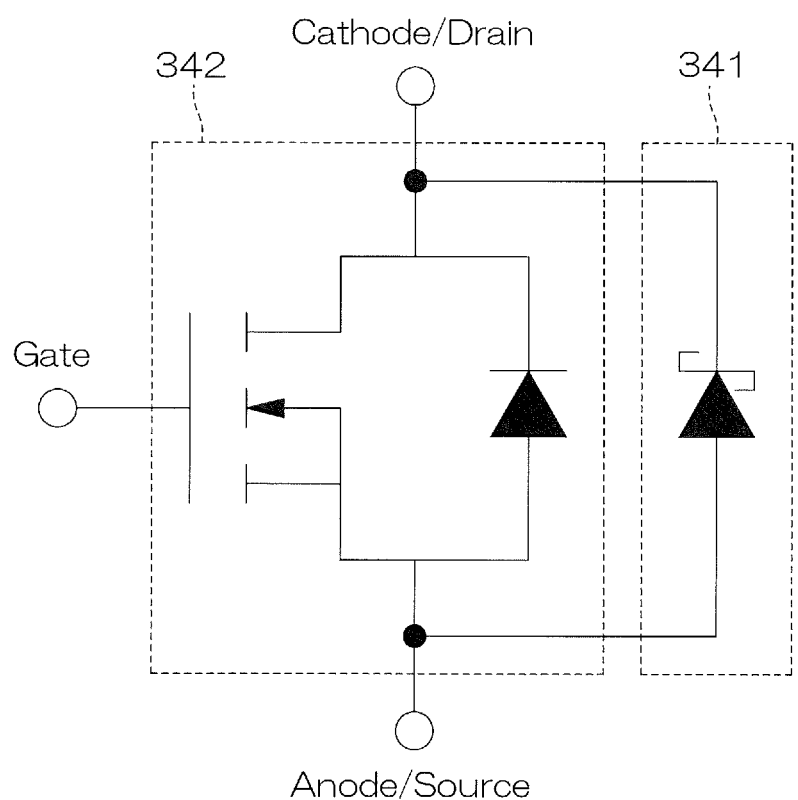

SEMICONDUCTOR DEVICE

TECHNICAL FIELD

The present invention relates to a semiconductor device.

BACKGROUND ART

Patent Literature 1 (FIG. 4) discloses a semiconductor device including a semiconductor substrate, an aluminum film (electrode), a polyimide film (organic insulating layer), and an Ni plating film (Ni plating layer). The aluminum film is formed on the semiconductor substrate. The polyimide film is formed on the aluminum film and has an opening that exposes the aluminum film. The Ni plating film is formed on the aluminum film that is exposed from the opening of the polyimide film.

CITATION LIST

Patent Literature

Patent Literature 1: WO 2018/167925 A1

SUMMARY OF INVENTION

Technical Problem

An organic insulating layer has a property of being low in adhesion to Ni. Therefore, if an Ni plating layer is formed on an electrode exposed from an opening of the organic insulating layer, the Ni plating layer forms a gap that extends toward the electrode with the organic insulating layer. Consequently, connection of the Ni plating layer to the electrode becomes insufficient and reliability of the Ni plating layer decreases.

One embodiment of the present invention provides a semiconductor device with which reliability of an Ni plating layer can be improved in a structure in which the Ni plating layer is formed on an electrode exposed from an opening of an organic insulating layer.

Solution to Problem

One embodiment of the present invention provides a semiconductor device including a chip, an electrode that is formed on the chip, an inorganic insulating layer that covers the electrode and has a first opening exposing the electrode, an organic insulating layer that covers the inorganic insulating layer, has a second opening surrounding the first opening at an interval from the first opening, and exposes an inner peripheral edge of the inorganic insulating layer in a region between the first opening and the second opening, and an Ni plating layer that covers the electrode inside the first opening and covers the inner peripheral edge of the inorganic insulating layer inside the second opening.

According to this semiconductor device, the Ni plating layer covers the inner peripheral edge of the inorganic insulating layer that is high in adhesion to Ni in comparison to the organic insulating layer. A region of forming of a gap can thereby be situated away from the electrode and, at the same time, the forming of the gap that extends toward the electrode can be suppressed. In comparison to a structure in which the inner peripheral edge of the inorganic insulating layer is not exposed, the region of forming of the gap with the organic insulating layer can be reduced. Reliability of the Ni plating layer can thus be improved.

The aforementioned as well as yet other objects, features, and effects of the present invention will be made clear by the following description of the preferred embodiments, with reference to the accompanying drawings.

BRIEF DESCRIPTION OF DRAWINGS

FIG. 4B is a diagram corresponding to FIG. 3 and is an enlarged view of the outer surface plating layer according to a third configuration example.

FIG. 4C is a diagram corresponding to FIG. 3 and is an enlarged view of the outer surface plating layer according to a fourth configuration example.

FIG. 4D is a diagram corresponding to FIG. 3 and is an enlarged view of the outer surface plating layer according to a fifth configuration example.

FIG. 5A is a sectional view for describing an example of a method for manufacturing the semiconductor device shown in FIG. 1.

FIG. 5C is a sectional view of a step subsequent to that of FIG. 5B.

FIG. 5F is a sectional view of a step subsequent to that of FIG. 5E.

FIG. 5O is a sectional view of a step subsequent to that of FIG. 5N.

FIG. 8A is a diagram corresponding to FIG. 7 and is an enlarged view of the outer surface plating layer according to a second configuration example.

FIG. 8C is a diagram corresponding to FIG. 7 and is an enlarged view of the outer surface plating layer according to a fourth configuration example.

FIG. 8D is a diagram corresponding to FIG. 7 and is an enlarged view of the outer surface plating layer according to a fifth configuration example.

FIG. 23 is a circuit diagram of the semiconductor package shown in FIG. 18.

DESCRIPTION OF EMBODIMENTS

Figure 1:
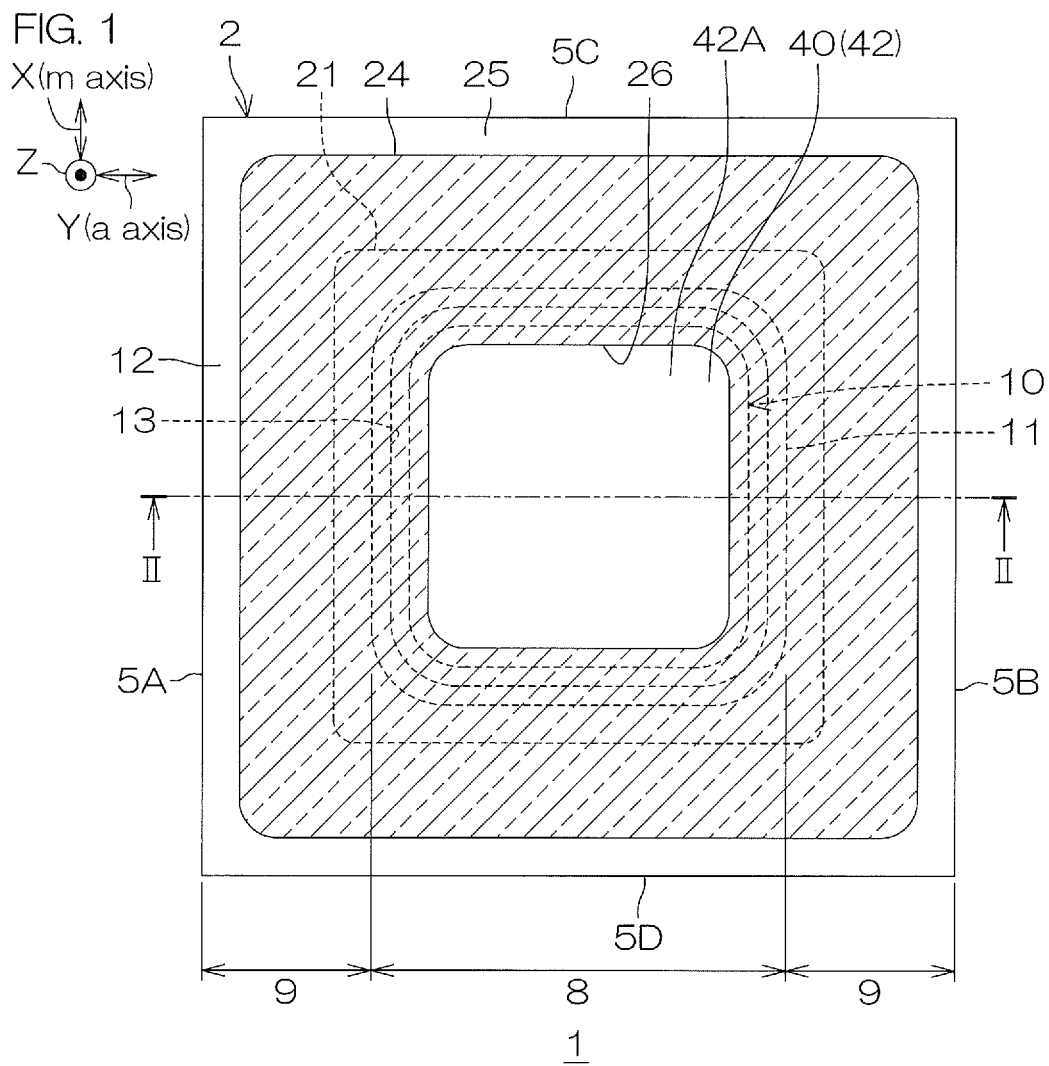
FIG. 1 is a plan view of a semiconductor device according to a first preferred embodiment of the present invention.
Figure 2:
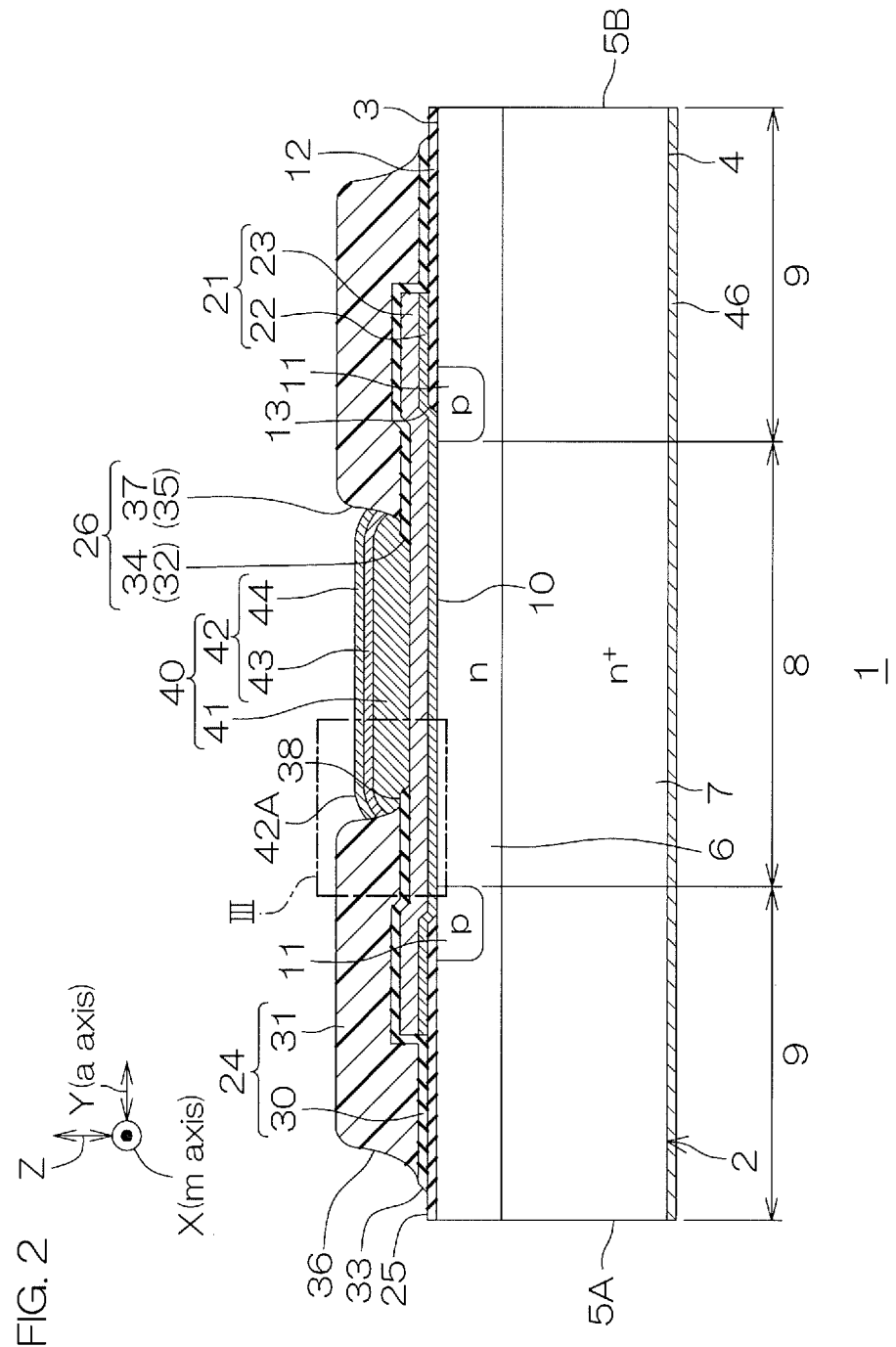
FIG. 2 is a sectional view showing a sectional view taken along line II-II shown in FIG. 1 together with an outer surface plating layer according to a first configuration example.
Figure 3:
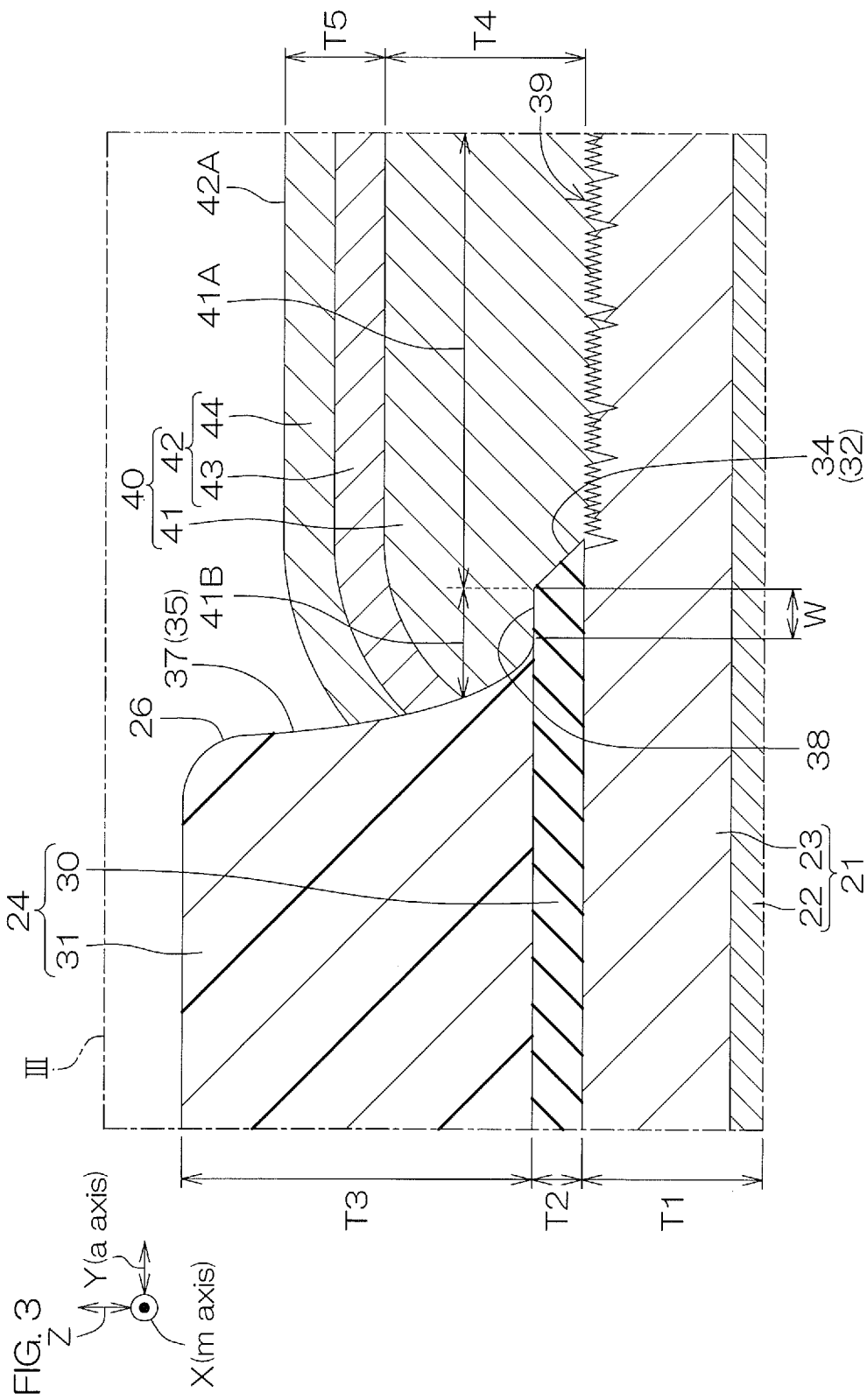
FIG. 3 is an enlarged view of a region III shown in FIG. 2.

FIG. 1 is a plan view of a semiconductor device 1 according to a first preferred embodiment of the present invention. FIG. 2 is a sectional view showing a sectional view taken along line II-II shown in FIG. 1 together with an outer surface plating layer 42 according to a first configuration example. FIG. 3 is an enlarged view of a region III shown in FIG. 2.

Referring to FIG. 1 to FIG. 3, in this embodiment, the semiconductor device 1 is constituted of an SiC semiconductor device that includes an SiC chip 2 (chip). The SiC chip 2 includes an SiC monocrystal constituted of a hexagonal crystal. The SiC monocrystal constituted of the hexagonal crystal has a plurality of polytypes including a 2H (hexagonal)-SiC monocrystal, a 4H-SiC monocrystal, a 6H-SiC monocrystal, etc. Although the SiC chip 2 is constituted of a 4H-SiC monocrystal in this embodiment, this does not exclude other polytypes.

The SiC chip 2 is formed in a rectangular parallelepiped shape. The SiC chip 2 has a first main surface 3 at one side, a second main surface 4 at another side, and side surfaces 5A, 5B, 5C, and 5D connecting the first main surface 3 and the second main surface 4. The first main surface 3 and the second main surface 4 are formed in quadrilateral shapes (square shapes in this embodiment) in a plan view as viewed in a normal direction Z thereto (hereinafter referred to simply as "plan view").

A thickness of the SiC chip 2 may be not less than 40 μm and not more than 300 μm. The thickness of the SiC chip 2 may be not less than 40 μm and not more than 100 μm, not less than 100 μm and not more than 150 μm, not less than 150 μm and not more than 200 μm, not less than 200 μm and not more than 250 μm, or not less than 250 μm and not more than 300 μm. The thickness of the SiC chip 2 is preferably not less than 60 μm and not more than 150 μm.

The first main surface 3 and the second main surface 4 are arranged along c-planes of the SiC monocrystal. The first main surface 3 is arranged along a silicon plane ((0001) plane) of the SiC monocrystal and the second main surface 4 is arranged along a carbon plane ((000-1) plane) of the SiC monocrystal. The second main surface 4 may be constituted of a rough surface having either or both of grinding marks and annealing marks. An annealing mark is a laser irradiation mark. The second main surface 4 may be an ohmic surface having annealing marks.

The first main surface 3 and the second main surface 4 may have a predetermined off angle and be inclined at the off angle in a predetermined direction with respect to the c-planes of the SiC monocrystal. The off direction is preferably an a-axis direction ([11-20] direction) of the SiC monocrystal. The off angle is preferably an angle of inclining at not less than 0° and not more than 10° in the off direction. The off angle may be not less than 0° and not more than 6°. The off angle may be not less than 0° and not more than 2°, not less than 2° and not more than 4°, or not less than 4° and not more than 6°.

Preferably, the off angle exceeds 0° and is not more than 4.5°. The off angle may be not less than 3° and not more than 4.5°. In this case, the off angle is preferably not less than 3° and not more than 3.5° or not less than 3.5° and not more than 4°. The off angle may be not less than 1.5° and not more than 3°. In this case, the off angle is preferably not less than 1.5° and not more than 2° or not less than 2° and not more than 2.5°.

The side surfaces 5A to 5D include the first side surface 5A, the second side surface 5B, the third side surface 5C, and the fourth side surface 5D. The first side surface 5A and the second side surface 5B extend along a first direction X and oppose each other in a second direction Y intersecting the first direction X. The third side surface 5C and the fourth side surface 5D extend along the second direction Y and oppose each other in the first direction X. Specifically, the second direction Y is orthogonal to the first direction X.

The first side surface 5A and the second side surface 5B are formed by a-planes of the SiC monocrystal. The first side surface 5A and the second side surface 5B may form inclined surfaces that, when the normal direction Z is taken as a basis, are inclined toward a c-axis direction ([0001] direction) of the SiC monocrystal with respect to the normal direction Z. The first side surface 5A and the second side surface 5B may be inclined at an angle in accordance with the off angle with respect to the normal direction Z when the normal direction Z is set to 0°. The angle in accordance with the off angle may be equal to the off angle or may be an angle that exceeds 0° and is less than the off angle.

The third side surface 5C and the fourth side surface 5D are formed by m-planes of the SiC monocrystal. The third side surface 5C and the fourth side surface 5D extend as planes along the normal direction Z. Specifically, the third side surface 5C and the fourth side surface 5D are formed substantially perpendicular to the first main surface 3 and the second main surface 4.

The side surfaces 5A to 5D may be constituted of cleavage surfaces or ground surfaces. A length of the side surfaces 5A to 5D may be not less than 0.1 mm and not more than 10 mm. Preferably, the length of the side surfaces 5A to 5D is not less than 0.5 mm and not more than 2.5 mm.

In this embodiment, the SiC chip 2 has a laminated structure that includes an SiC substrate 6 of an n⁺-type and an SiC epitaxial layer 7 of an n-type. The second main surface 4 and portions of the side surfaces 5A to 5D of the SiC chip 2 are formed by the SiC substrate 6. The first main surface 3 and portions of the side surfaces 5A to 5D of the SiC chip 2 are formed by the SiC epitaxial layer 7.

An n-type impurity concentration of the SiC epitaxial layer 7 is less than an n-type impurity concentration of the SiC substrate 6. The n-type impurity concentration of the SiC substrate 6 may be not less than $1.0 \times 10^{18}$ cm$^{-3}$ and not more than $1.0 \times 10^{21}$ cm$^{-3}$. The n-type impurity concentration of the SiC epitaxial layer 7 may be not less than $1.0 \times 10^{15}$ cm$^{-3}$ and not more than $1.0 \times 10^{18}$ cm$^{-3}$.

A thickness of the SiC substrate 6 may be not less than 40 μm and not more than 250 μm. The thickness of the SiC substrate 6 may be not less than 40 μm and not more than 100 μm, not less than 100 μm and not more than 150 μm, not less than 150 μm and not more than 200 μm, or not less than 200 μm and not more than 250 μm. The thickness of the SiC substrate 6 is preferably not less than 40 μm and not more than 150 μm. By thinning the SiC substrate 6, a resistance value of the SiC substrate 6 can be reduced.

A thickness of the SiC epitaxial layer 7 may be not less than 1 μm and not more than 50 μm. The thickness of the SiC epitaxial layer 7 may be not less than 1 μm and not more than 5 μm, not less than 5 μm and not more than 10 μm, not less than 10 μm and not more than 15 μm, not less than 15 μm and not more than 20 μm, not less than 20 μm and not more than 30 μm, not less than 30 μm and not more than 40 μm, or not less than 40 μm and not more than 50 μm. The thickness of the SiC epitaxial layer 7 is preferably not less than 5 μm and not more than 15 μm.

The SiC chip 2 includes an active region 8 and an outer region 9. The active region 8 is a region that includes an SBD (Schottky barrier diode) as an example of a functional device (diode). In plan view, the active region is formed in a central portion of the SiC chip 2 at intervals inward from the side surfaces 5A to 5D. In plan view, the active region 8 is formed in a quadrilateral shape having four sides parallel to the side surfaces 5A to 5D.

The outer region 9 is a region outside the active region 8. The outer region 9 is formed in a region between the side surfaces 5A to 5D and the active region 8. The outer region 9 is formed in an annular shape (specifically, an endless shape) surrounding the active region 8 in plan view.

The semiconductor device 1 includes a diode region 10 of the n-type formed in a surface layer portion of the first main surface 3 in the active region 8. The diode region 10 is formed in a central portion of the first main surface 3. A planar shape of the diode region 10 is arbitrary. The diode region 10 may be formed in a quadrilateral shape having four sides parallel to the side surfaces 5A to 5D in plan view.

In this embodiment, the diode region 10 is formed using a portion of the SiC epitaxial layer 7. An n-type impurity concentration of the diode region 10 is equal to the n-type impurity concentration of the SiC epitaxial layer 7. The n-type impurity concentration of the diode region 10 may exceed the n-type impurity concentration of the SiC epitaxial layer 7. In this case, the diode region 10 is formed by introduction of an n-type impurity into a surface layer portion of the SiC epitaxial layer 7.

A guard region 11 including a p-type impurity is formed in a surface layer portion of the first main surface 3 in the outer region 9. The p-type impurity of the guard region 11 may be non-activated or may be activated. The guard region 11 is formed as a band extending along the diode region 10 in plan view. Specifically, the guard region 11 is formed in an annular shape (specifically, an endless shape) surrounding the diode region 10 in plan view.

The guard region 11 is thereby formed as a guard ring region. The guard region 11 defines the active region 8 (diode region 10). A planar shape of the active region 8 (diode region 10) is adjusted by a planar shape of the guard region 11. The guard region 11 may be formed in a polygonal annular shape or a circular annular shape in plan view.

The semiconductor device 1 includes a main surface insulating layer 12 formed on the first main surface 3. The main surface insulating layer 12 may have a laminated structure that includes a silicon oxide layer and a silicon nitride layer. The main surface insulating layer may have a single layer structure constituted of a silicon oxide layer or a silicon nitride layer. In this embodiment, the main surface insulating layer 12 has a single layer structure constituted of a silicon oxide layer.

The main surface insulating layer 12 includes a contact opening 13 that exposes the diode region 10. The contact opening 13 also exposes an inner peripheral edge of the guard region 11. A planar shape of the contact opening 13 is arbitrary. The contact opening 13 may be demarcated in a quadrilateral shape having four sides parallel to the side surfaces 5A to 5D in plan view.

A peripheral edge of the main surface insulating layer 12 is exposed from the side surfaces 5A to 5D. In this embodiment, the peripheral edge of the main surface insulating layer 12 is continuous to the side surfaces 5A to 5D. The peripheral edge of the main surface insulating layer 12 may be formed at intervals inward from the side surfaces 5A to 5D. In this case, the main surface insulating layer 12 exposes a portion of the first main surface 3 positioned in the outer region 9.

A thickness of the main surface insulating layer 12 may be not less than 0.1 μm and not more than 10 μm. The thickness of the main surface insulating layer 12 may be not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness of the main surface insulating layer 12 is preferably not less than 0.5 μm and not more than 5 μm.

The semiconductor device 1 includes a first main surface electrode 21 (electrode) formed on the first main surface 3. The first main surface electrode 21 is connected to the diode region 10 and the guard region 11 inside the contact opening 13. The first main surface electrode 21 is led out onto the main surface insulating layer 12 from the contact opening 13. A peripheral edge of the first main surface electrode 21 is formed on the main surface insulating layer 12 at intervals inward from the side surfaces 5A to 5D. The first main surface electrode 21 thereby exposes a peripheral edge portion of the main surface insulating layer 12.

A thickness T1 of the first main surface electrode 21 may be not less than 10 μm and not more than 100 μm. The thickness T1 may be not less than 10 µm and not more than 20 µm, not less than 20 µm and not more than 40 µm, not less than 40 µm and not more than 60 µm, not less than 60 µm and not more than 80 µm, or not less than 80 µm and not more than 100 µm. The thickness T1 is preferably not less than 20 µm and not more than 60 µm.

Specifically, the first main surface electrode has a laminated structure that includes a barrier electrode 22 and a principal electrode 23 laminated in that order from the first main surface 3 side. The barrier electrode 22 is formed as a film along the first main surface 3 and the main surface insulating layer 12. The barrier electrode 22 forms a Schottky junction with the diode region 10. The SBD having the first main surface electrode 21 as an anode and the diode region 10 as a cathode is thereby formed. That is, the first main surface electrode 21 is an anode electrode of the SBD.

The barrier electrode 22 may include at least one among a Ti layer, a Pd layer, a Cr layer, a V layer, an Mo layer, a W layer, a Pt layer, and an Ni layer. A thickness of the barrier electrode 22 may be not less than 0.01 µm and not more than 1 µm. The thickness of the barrier electrode 22 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

The principal electrode 23 is formed as a film on the barrier electrode 22. The principal electrode 23 covers an entire area of a main surface of the barrier electrode 22. The principal electrode 23 is constituted of an Al-based metal layer. Specifically, the principal electrode 23 includes at least one among a pure Al layer (an Al layer constituted of Al of a purity of not less than 99%), an AlSi alloy layer, an AlCu alloy layer, and an AlSiCu alloy layer.

The principal electrode 23 may have a laminated structure in which two or more among a pure Al layer, an AlSi alloy layer, an AlCu alloy layer, and an AlSiCu alloy layer are laminated in any order. The principal electrode 23 may have a single layer structure constituted of a pure Al layer, an AlSi alloy layer, an AlCu alloy layer, or an AlSiCu alloy layer. The principal electrode 23 preferably has a single layer structure constituted of an AlSi alloy layer, an AlCu alloy layer, or an AlSiCu alloy layer.

A thickness of the principal electrode 23 exceeds the thickness of the barrier electrode 22. The thickness of the principal electrode 23 may be not less than 10 µm and not more than 100 µm. The thickness of the principal electrode 23 may be not less than 10 µm and not more than 20 µm, not less than 20 µm and not more than 40 µm, not less than 40 µm and not more than 60 µm, not less than 60 µm and not more than 80 µm, or not less than 80 µm and not more than 100 µm. The thickness of the principal electrode 23 is preferably not less than 20 µm and not more than 60 µm. Since the thickness of the barrier electrode 22 is extremely small in comparison to the thickness of the principal electrode 23, the thickness T1 of the first main surface electrode 21 is approximated by the thickness of the principal electrode 23.

The semiconductor device 1 includes an insulating layer 24 that covers the first main surface electrode 21 above the first main surface 3. In FIG. 1, the insulating layer 24 is shown with hatching. Specifically, the insulating layer 24 is formed on the main surface insulating layer 12. A peripheral edge of the insulating layer 24 is formed at intervals inward from the side surfaces 5A to 5D. The insulating layer 24 thereby exposes a peripheral edge portion of the main surface insulating layer 12.

The peripheral edge of the insulating layer 24 demarcates a dicing street 25 with the side surfaces 5A to 5D. According to the dicing street 25, it is made unnecessary to physically cut the insulating layer 24 when cutting out the semiconductor device 1 from a wafer. The semiconductor device 1 can thereby be cut out smoothly from the wafer, and at the same time, peeling and degradation of the insulating layer 24 can be suppressed. Consequently, protection objects, such as the SiC chip 2, the first main surface electrode 21, etc., can be protected appropriately by the insulating layer 24.

A width of the dicing street 25 may be not less than 1 µm and not more than 25 µm. The width of the dicing street 25 is a width in a direction orthogonal to a direction in which the dicing street 25 extends. The width of the dicing street 25 may be not less than 1 µm and not more than 5 µm, not less than 5 µm and not more than 10 µm, not less than 10 µm and not more than 15 µm, not less than 15 µm and not more than 20 µm, or not less than 20 µm and not more than 25 µm.

The insulating layer 24 has a pad opening 26 that exposes the first main surface electrode 21. The pad opening 26 exposes the first main surface electrode 21 inside a region surrounded by the contact opening 13 in plan view. The pad opening 26 may surround the contact opening 13 in a region outside the contact opening 13 in plan view. A planar shape of the pad opening 26 is arbitrary. The pad opening 26 may be formed in a quadrilateral shape having four sides parallel to the side surfaces 5A to 5D in plan view.

Specifically, the insulating layer 24 has a laminated structure that includes an inorganic insulating layer 30 and an organic insulating layer 31 laminated in that order from the SiC chip 2 side. The inorganic insulating layer 30 is formed as a film along the main surface insulating layer 12 and the first main surface electrode 21. The inorganic insulating layer 30 includes a first inner wall 32 and a first outer wall 33. The first inner wall 32 of the inorganic insulating layer 30 demarcates a first opening 34 that exposes a portion of the first main surface electrode 21. The first opening 34 forms a portion of the pad opening 26.

The first opening 34 is demarcated inside a region surrounded by the contact opening 13 in plan view. The first opening 34 may surround the contact opening 13 from outside the contact opening 13 in plan view. A planar shape of the first opening 34 is arbitrary. The first opening 34 may be demarcated in a quadrilateral shape having four sides parallel to the side surfaces 5A to 5D in plan view.

The first outer wall 33 of the inorganic insulating layer 30 is formed at intervals inward from the side surfaces 5A to 5D and exposes the a peripheral edge portion of the main surface insulating layer 12. The inorganic insulating layer 30 demarcates a portion of the dicing street 25 with the side surfaces 5A to 5D. The first outer wall 33 may be formed in a quadrilateral shape having four sides parallel to the side surfaces 5A to 5D in plan view.

An angle that the first inner wall 32 (first outer wall 33) forms inside the inorganic insulating layer 30 with a main surface of the first main surface electrode 21 may be not less than 30° and not more than 90°. The angle that the first inner wall 32 (first outer wall 33) forms inside the inorganic insulating layer 30 with the main surface of the first main surface electrode 21 is preferably not less than 45° and less than 90°. The angle of the first inner wall 32 (first outer wall 33) is defined by an angle that a straight line joining a lower end portion and an upper end portion of the first inner wall 32 (first outer wall 33) forms with the main surface of the first main surface electrode 21.

The inorganic insulating layer 30 has a property of being high in adhesion to Ni. The inorganic insulating layer 30 includes at least one among a silicon oxide layer and a silicon nitride layer. The inorganic insulating layer 30 may have a laminated structure that includes a silicon oxide layer and a silicon nitride layer laminated in that order from the SiC chip 2 side. The inorganic insulating layer 30 may have a single layer structure constituted of a silicon oxide layer or a silicon nitride layer. The inorganic insulating layer 30 preferably includes an insulating material differing from the main surface insulating layer 12. In this embodiment, the inorganic insulating layer 30 has a single layer structure constituted of a silicon nitride layer.

A thickness T2 of the inorganic insulating layer 30 is preferably less than the thickness T1 of the first main surface electrode 21 (T2<T1). The thickness T2 may be not less than 0.1 μm and not more than 10 μm. The thickness T2 may be not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness T2 is preferably not less than 1 μm and not more than 5 μm. The thickness T2 is especially preferably not less than 1 μm and not more than 2 μm.

The organic insulating layer 31 is formed as a film on the inorganic insulating layer 30. The organic insulating layer 31 includes a second inner wall 35 and a second outer wall 36. The second inner wall 35 of the organic insulating layer 31 demarcates a second opening 37 that exposes a portion of the first main surface electrode 21. In this embodiment, the second inner wall 35 is formed in a curved shape that is depressed toward the inorganic insulating layer 30 side.

Referring to FIG. 3, the second opening 37 is in communication with the first opening 34 of the inorganic insulating layer 30 and forms the pad opening 26 with the first opening 34. The second opening 37 is demarcated inside a region surrounded by the contact opening 13 in plan view. The second opening 37 may surround the contact opening 13 from outside the contact opening 13 in plan view. A planar shape of the second opening 37 is arbitrary. The second opening 37 may be demarcated in a quadrilateral shape having four sides parallel to the side surfaces 5A to 5D in plan view.

The second opening 37 surrounds the first opening 34 at an interval from the first opening 34 and exposes a portion of the inorganic insulating layer 30. Specifically, the organic insulating layer 31 exposes a portion of a main surface of the inorganic insulating layer 30 as an inner peripheral edge 38 in a region between the first opening 34 and the second opening 37.

A width W of the inner peripheral edge 38 of the inorganic insulating layer 30 may exceed 0 μm and be not more than 10 μm. The width W may exceed 0 μm and be not more than 1 μm or be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The width W is preferably not less than 1 μm and not more than 5 μm. Although the width W is arbitrary, it is preferably not more than the thickness T2 of the inorganic insulating layer 30 (W≤T2). The width W is especially preferably not less than 1 μm and not more than 2 μm.

In this embodiment, the second outer wall 36 is formed in a curved shape that is depressed toward the inorganic insulating layer 30 side. The second outer wall is formed on the inorganic insulating layer 30 at intervals inward from the side surfaces 5A to 5D and demarcates a portion of the dicing street 25 with the side surfaces 5A to 5D. The organic insulating layer 31 thereby exposes the peripheral edge portion of the main surface insulating layer 12. The second outer wall 36 may be formed in a quadrilateral shape having four sides parallel to the side surfaces 5A to 5D in plan view.

The second outer wall 36 of the organic insulating layer 31 may traverse the first outer wall 33 of the inorganic insulating layer 30 and be formed on the main surface insulating layer 12. In this case, the dicing street 25 is demarcated by the second outer wall 36 of the organic insulating layer 31.

An angle that the second inner wall 35 (second outer wall 36) of the organic insulating layer 31 forms inside the organic insulating layer 31 with the main surface of the inorganic insulating layer 30 may be not less than 30° and not more than 90°. The angle that the second inner wall 35 (second outer wall 36) forms inside the organic insulating layer 31 with the main surface of the inorganic insulating layer 30 is preferably not less than 45° and less than 90°. The angle of the second inner wall 35 (second outer wall 36) is defined by an angle that a straight line joining a lower end portion and an upper end portion of the second inner wall 35 (second outer wall 36) forms with the main surface of the inorganic insulating layer 30.

The organic insulating layer 31 has property of being low in adhesion to Ni in comparison to the inorganic insulating layer 30. The organic insulating layer 31 includes a photosensitive resin of a negative type or a positive type. The organic insulating layer 31 may include at least one among a polyimide, a polyamide, and a polybenzoxazole. In this embodiment, the organic insulating layer 31 includes a polyimide.

The organic insulating layer 31 preferably has a thickness T3 that exceeds the thickness T2 of the inorganic insulating layer 30 (T2<T3). A ratio T3/T2 of the thickness T3 of the organic insulating layer 31 with respect to the thickness T2 of the inorganic insulating layer 30 may exceed 1 and be not more than 10. The ratio T3/T2 may exceed 1 and be not more than 2 or be not less than 2 and not more than 4, not less than 4 and not more than 6, not less than 6 and not more than 8, or not less than 8 and not more than 10. The ratio T3/T2 is preferably not less than 2 and not more than 6.

The thickness T3 may be not less than 1 μm and not more than 50 μm. The thickness T3 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm. The thickness T3 is preferably not less than 5 μm and not more than 30 μm.

The semiconductor device 1 includes a rough surface region 39 formed on an exposed surface of the first main surface electrode 21 that is exposed from the pad opening 26 (first opening 34 of the inorganic insulating layer 30). The rough surface region 39 includes a depression formed in a region directly below the first inner wall 32 of the inorganic insulating layer 30. Thereby, the first inner wall 32 of the inorganic insulating layer 30 includes a portion that overhangs above the rough surface region 39.

The semiconductor device 1 includes a pad electrode 40 that is formed inside the pad opening 26. The pad electrode 40 includes an Ni plating layer 41 that is formed on the first main surface electrode 21 inside the pad opening 26. The Ni plating layer 41 covers the first main surface electrode 21 inside the first opening 34 and covers the inner peripheral edge 38 of the inorganic insulating layer 30 inside the second opening 37. The Ni plating layer 41 has an outer surface that is formed at an interval toward the first main surface electrode 21 side from a main surface of the organic insulating layer 31 (insulating layer 24). In this embodiment, the Ni plating layer 41 covers the organic insulating layer 31 inside the second opening 37.

Referring to FIG. 3, the Ni plating layer 41 includes a first portion 41A that covers the first main surface electrode 21 and a second portion 41B that covers the inner peripheral edge 38 of the inorganic insulating layer 30. The first portion 41A of the Ni plating layer 41 fills the rough surface region 39 and covers the first main surface electrode 21 inside the first opening 34. The first portion 41A covers an entire area of the first inner wall 32 of the inorganic insulating layer 30 and protrudes from an opening end of the first opening 34 toward an opening end of the second opening 37. The first portion 41A has a first connecting portion that is connected to the first inner wall 32 of the inorganic insulating layer 30 and extends in a thickness direction of the inorganic insulating layer 30.

The second portion 41B of the Ni plating layer 41 is led out from the first portion 41A toward the organic insulating layer 31 side inside the second opening 37. The second portion 41B is formed in an arcuate shape that is directed toward the organic insulating layer 31 with the opening end of the first opening 34 as a starting point.

The second portion 41B covers the inner peripheral edge 38 of the inorganic insulating layer 30 inside the second opening 37. The second portion 41B thereby opposes the first main surface electrode 21 across the inner peripheral edge 38 of the inorganic insulating layer 30. The second portion 41B has a second connecting portion that is connected to the main surface of the inorganic insulating layer 30 and extends in a width direction of the inorganic insulating layer 30.

In this embodiment, the second portion 41B further covers the second inner wall 35 of the organic insulating layer 31 inside the second opening 37. The second portion 41B covers a region at the inorganic insulating layer 30 side with respect to an intermediate portion of the second inner wall 35 of the organic insulating layer 31. In other words, the second portion 41B covers the organic insulating layer 31 such that an exposed area of the second inner wall 35 (organic insulating layer 31) exceeds a hidden area of the second inner wall 35 (organic insulating layer 31). The Ni plating layer 41 is thus formed such that the first portion 41A and the second portion 41B are engaged with the opening end of the first opening 34 from two different directions.

The Ni plating layer 41 has a thickness T4 that exceeds the thickness T2 of the inorganic insulating layer 30 (T2<T4). The thickness T4 is less than the thickness T3 of the organic insulating layer 31 (T4<T3). The thickness T4 exceeds a value resulting from adding the width W of the inner peripheral edge 38 to the thickness T2 of the inorganic insulating layer 30 (T2+W) (T2+W<T4). This is a condition by which the Ni plating layer 41 contacts the second inner wall 35 of the organic insulating layer 31. The thickness T4 is defined by a thickness of the Ni plating layer 41 based on the main surface of the first main surface electrode 21.

A ratio T4/T2 of the thickness T4 of the Ni plating layer 41 with respect to the thickness T2 of the inorganic insulating layer 30 may exceed 1 and be not more than 5. The ratio T4/T2 may exceed 1 and be not more than 2 or be not less than 2 and not more than 3, not less than 3 and not more than 4, or not less than 4 and not more than 5.

The thickness T4 may be not less than 0.1 μm and not more than 15 μm. The thickness T4 may be not less than 0.1 μm and not more than 1 μm, not less than 1 μm and not more than 3 μm, not less than 3 μm and not more than 6 μm, not less than 6 μm and not more than 9 μm, not less than 9 μm and not more than 12 μm, or not less than 12 μm and not more than 15 μm. The thickness T4 is preferably not less than 2 μm and not more than 8 μm.

The pad electrode 40 includes the outer surface plating layer 42 that is constituted of a metal material differing from the Ni plating layer 41 and covers the outer surface of the Ni plating layer 41 inside the second opening 37. The outer surface plating layer 42 has a thickness T5 that is less than the thickness T4 of the Ni plating layer (T5<T4). The outer surface plating layer 42 covers the second inner wall 35 of the organic insulating layer 31 inside the second opening 37.

The outer surface plating layer 42 has a terminal surface 42A that is to be externally connected via a conductive bonding material (for example, solder). The terminal surface 42A is positioned at the Ni plating layer side with respect to the main surface of the organic insulating layer 31 (opening end of the second opening 37). The outer surface plating layer 42 thereby exposes a portion of the second inner wall 35 of the organic insulating layer 31.

In this embodiment, the outer surface plating layer 42 has a laminated structure that includes a Pd plating layer 43 and an Au plating layer 44 laminated in that order from the Ni plating layer 41 side. The Pd plating layer 43 is formed as a film along the outer surface of the Ni plating layer 41. The Pd plating layer 43 covers the Ni plating layer 41 at an interval toward the inorganic insulating layer 30 side from the opening end of the second opening 37. The Pd plating layer 43 covers the second inner wall 35 of the organic insulating layer 31 inside the second opening 37.

The Pd plating layer 43 has a thickness less than the thickness T4 of the Ni plating layer 41. The thickness of the Pd plating layer 43 may be not less than 0.01 μm and not more than 1 μm. The thickness of the Pd plating layer 43 may be not less than 0.01 μm and not more than 0.1 μm, not less than 0.1 μm and not more than 0.2 μm, not less than 0.2 μm and not more than 0.4 μm, not less than 0.4 μm and not more than 0.6 μm, not less than 0.6 μm and not more than 0.8 μm, or not less than 0.8 μm and not more than 1 μm.

The Au plating layer 44 is formed as a film along an outer surface of the Pd plating layer 43. The Au plating layer 44 covers the Pd plating layer 43 at an interval toward the inorganic insulating layer 30 side from the opening end of the second opening 37. The Au plating layer 44 covers the second inner wall 35 of the organic insulating layer 31 inside the second opening 37.

The Au plating layer 44 has a thickness less than the thickness T4 of the Ni plating layer 41. The thickness of the Au plating layer 44 may be not less than 0.01 μm and not more than 1 μm. The thickness of the Au plating layer 44 may be not less than 0.01 μm and not more than 0.1 μm, not less than 0.1 μm and not more than 0.2 μm, not less than 0.2 μm and not more than 0.4 μm, not less than 0.4 μm and not more than 0.6 μm, not less than 0.6 μm and not more than 0.8 μm, or not less than 0.8 μm and not more than 1 μm.

The outer surface plating layer 42 may take on any of the various configurations shown in FIG. 4A to FIG. 4D.

Figure 4A:
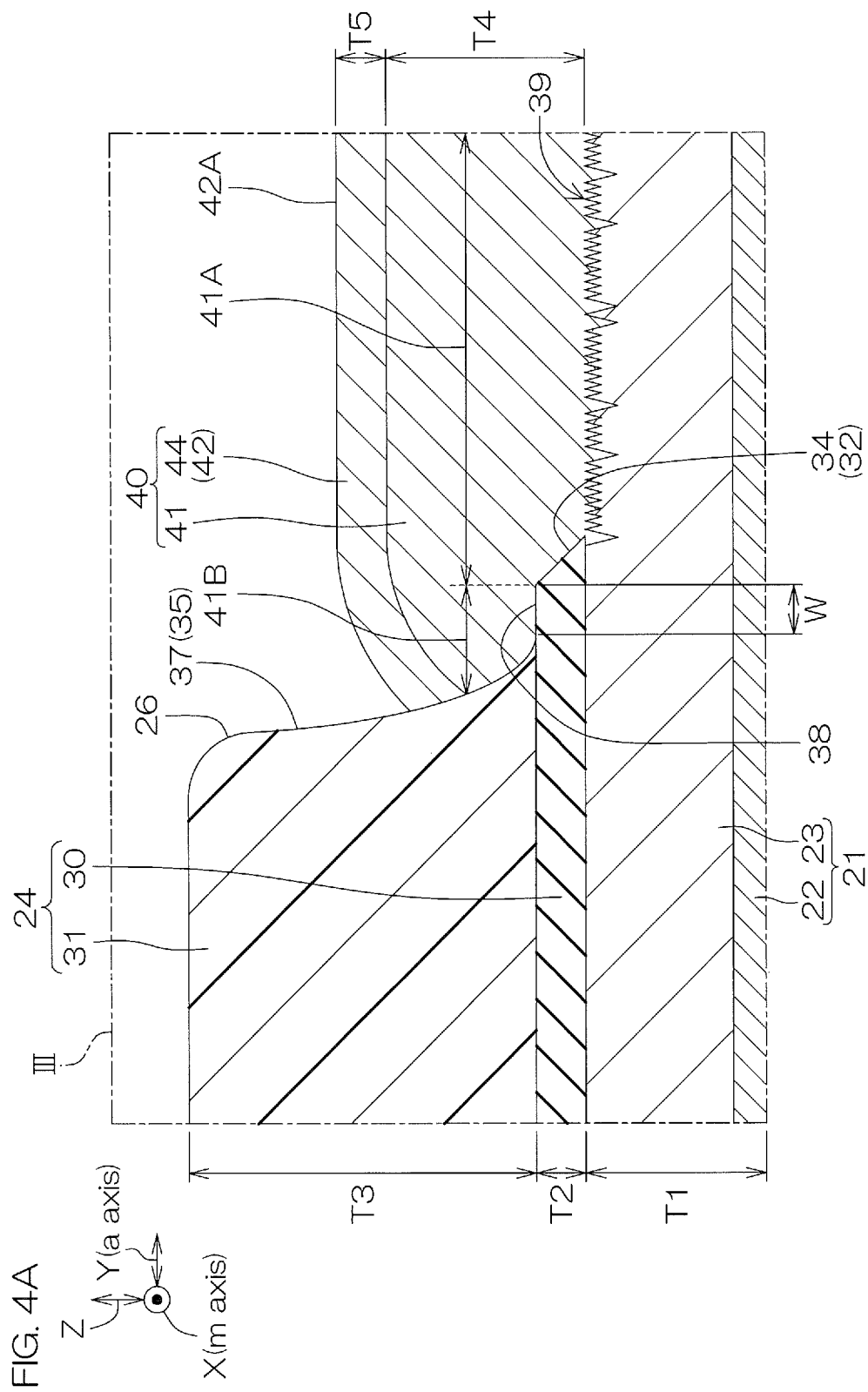
FIG. 4A is a diagram corresponding to FIG. 3 and is an enlarged view of the outer surface plating layer according to a second configuration example.

FIG. 4A is a diagram corresponding to FIG. 3 and is an enlarged view of the outer surface plating layer 42 according to a second configuration example. In the following, portions differing from the outer surface plating layer 42 according to the first configuration example shall be described.

Referring to FIG. 4A, in this embodiment, the outer surface plating layer 42 has a single layer structure constituted of the Au plating layer 44. The Au plating layer 44 is formed as a film along the outer surface of the Ni plating layer 41. The Au plating layer 44 covers the Ni plating layer 41 at an interval toward the inorganic insulating layer 30 side from the opening end of the second opening 37. The Au plating layer 44 covers the second inner wall 35 of the organic insulating layer 31 inside the second opening 37.

FIG. 4B is a diagram corresponding to FIG. 3 and is an enlarged view of the outer surface plating layer 42 according to a third configuration example. In the following, portions differing from the outer surface plating layer 42 according to the first configuration example shall be described.

Referring to FIG. 4B, in this embodiment, the outer surface plating layer 42 has a single layer structure constituted of the Pd plating layer 43. The Pd plating layer 43 is formed as a film along the outer surface of the Ni plating layer 41. The Pd plating layer 43 covers the Ni plating layer 41 at an interval toward the inorganic insulating layer 30 side from the opening end of the second opening 37. The Pd plating layer 43 covers the second inner wall 35 of the organic insulating layer 31 inside the second opening 37.

FIG. 4C is a diagram corresponding to FIG. 3 and is an enlarged view of the outer surface plating layer 42 according to a fourth configuration example. In the following, portions differing from the outer surface plating layer 42 according to the first configuration example shall be described.

Referring to FIG. 4C, in this embodiment, the outer surface plating layer 42 has a single layer structure constituted of an Ag plating layer 45. The Ag plating layer 45 is formed as a film along the outer surface of the Ni plating layer 41. The Ag plating layer 45 covers the Ni plating layer 41 at an interval toward the inorganic insulating layer 30 side from the opening end of the second opening 37. The Ag plating layer 45 covers the second inner wall 35 of the organic insulating layer 31 inside the second opening 37.

The Ag plating layer 45 has a thickness less than the thickness T4 of the Ni plating layer 41. The thickness of the Ag plating layer 45 may be not less than 0.01 µm and not more than 1 µm. The thickness of the Ag plating layer 45 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

FIG. 4D is a diagram corresponding to FIG. 3 and is an enlarged view of the outer surface plating layer 42 according to a fifth configuration example. In the following, portions differing from the outer surface plating layer 42 according to the first configuration example shall be described.

Referring to FIG. 4D, the outer surface plating layer 42 has a laminated structure that includes the Pd plating layer 43, the Au plating layer 44, and the Ag plating layer 45 laminated in that order from the Ni plating layer 41 side.

The Pd plating layer 43 is formed as a film along the outer surface of the Ni plating layer 41. The Pd plating layer 43 covers the Ni plating layer 41 at an interval toward the inorganic insulating layer 30 side from the opening end of the second opening 37. The Pd plating layer 43 covers the second inner wall 35 of the organic insulating layer 31 inside the second opening 37.

The Au plating layer 44 is formed as a film along the outer surface of the Pd plating layer 43. The Au plating layer 44 covers the Pd plating layer 43 at an interval toward the inorganic insulating layer 30 side from the opening end of the second opening 37. The Au plating layer 44 covers the second inner wall 35 of the organic insulating layer 31 inside the second opening 37.

The Ag plating layer 45 is formed as a film along an outer surface of the Au plating layer 44. The Ag plating layer 45 covers the Au plating layer 44 at an interval toward the inorganic insulating layer 30 side from the opening end of the second opening 37. The Ag plating layer 45 covers the second inner wall 35 of the organic insulating layer 31 inside the second opening 37.

Referring again to FIG. 2, the semiconductor device 1 includes a second main surface electrode 46 formed on the second main surface 4. The second main surface electrode 46 covers an entire area of the second main surface 4. The second main surface electrode 46 forms an ohmic contact with the second main surface 4. The second main surface electrode 46 is formed as a cathode electrode of the SBD.

The second main surface electrode 46 includes at least one among a Ti layer, an Ni layer, a Pd layer, an Au layer, and an Ag layer. The second main surface electrode 46 may have a laminated structure in which at least two among a Ti layer, an Ni layer, a Pd layer, an Au layer, and an Ag layer are laminated in any order. The second main surface electrode 46 may have a single layer structure constituted of a Ti layer, an Ni layer, a Pd layer, an Au layer, and an Ag layer. The second main surface electrode 46 preferably includes a Ti layer as an ohmic electrode. In this embodiment, the second main surface electrode 46 has a laminated structure that includes a Ti layer, an Ni layer, a Pd layer, an Au layer, and an Ag layer laminated in that order from the second main surface 4 side.

FIG. 5A to FIG. 5O are sectional views for describing an example of a method for manufacturing the semiconductor device 1 shown in FIG. 1.

Referring to FIG. 5A, first, an SiC epitaxial wafer 50 that is to be a base of the SiC chip 2 is prepared. The SiC epitaxial wafer 50 has a laminated structure that includes an SiC wafer 51 and an SiC epitaxial layer 52. The SiC wafer 51 is a base of the SiC substrate 6. The SiC epitaxial layer 52 is a base of the SiC epitaxial layer 7. The SiC epitaxial layer 52 is formed by epitaxially growing SiC from a main surface of the SiC wafer 51.

The SiC epitaxial wafer 50 has a first wafer main surface 53 at one side and a second wafer main surface 54 at another side. The first wafer main surface 53 and the second wafer main surface 54 respectively correspond to the first main surface 3 and the second main surface 4 of the SiC chip 2.

Figure 5B:
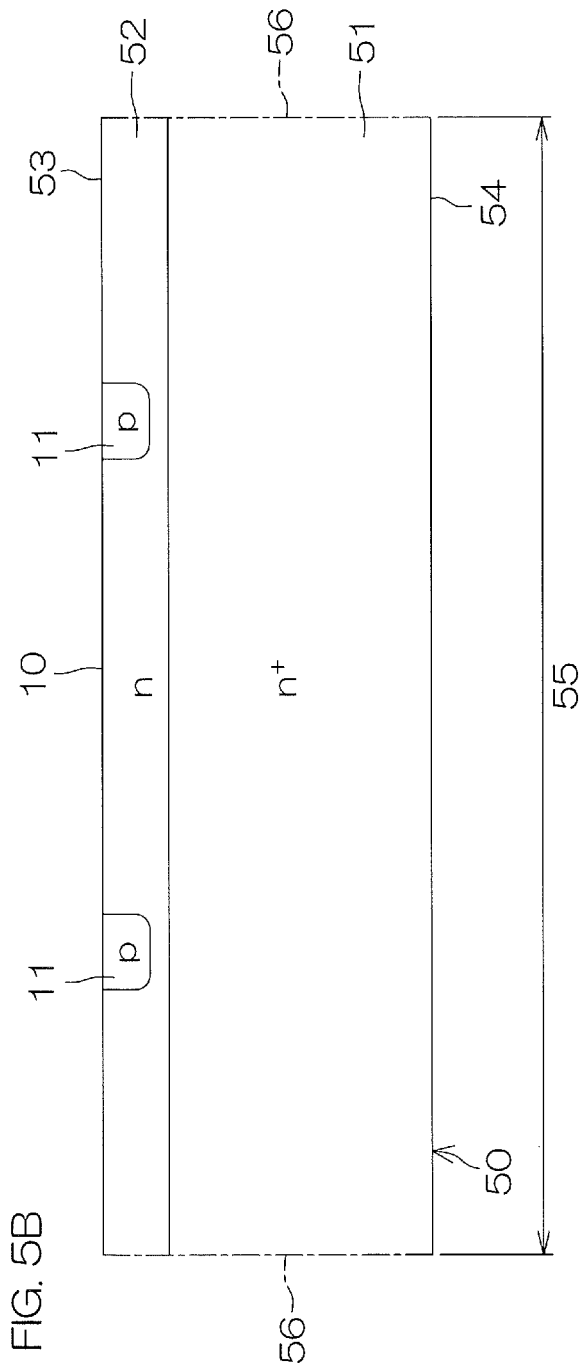
FIG. 5B is a sectional view of a step subsequent to that of FIG. 5A.

A plurality of device regions 55 each corresponding to the semiconductor device 1 and scheduled cutting lines 56 that demarcate the plurality of device regions 55 are set in the SiC epitaxial wafer 50. A single device region 55 is shown in FIG. 5A and illustration of other regions is omitted (hereinafter, the same applies to FIG. 5B to FIG. 5O). The plurality of device regions 55 are set in a matrix along the first direction X and the second direction Y. The scheduled cutting lines 56 are set in a lattice extending in the first direction X and the second direction Y.

Next, referring to FIG. 5B, a main portion of the functional device is formed in each device region 55. In this embodiment, an n-type impurity and/or a p-type impurity is or are selectively introduced into surface layer portions of the first wafer main surface 53 to form the diode region 10 of the n-type and the guard region 11 of the p-type. The n-type impurity and/or the p-type impurity is or are introduced into the surface layer portions of the first wafer main surface 53 by an ion implantation method via an ion implantation mask (not shown).

Next, referring to FIG. 5C, the main surface insulating layer 12 is formed on the first wafer main surface 53. The main surface insulating layer 12 may be formed by a CVD (chemical vapor deposition) method and/or an oxidation treatment method (for example, a thermal oxidation treatment method).

Figure 5D:
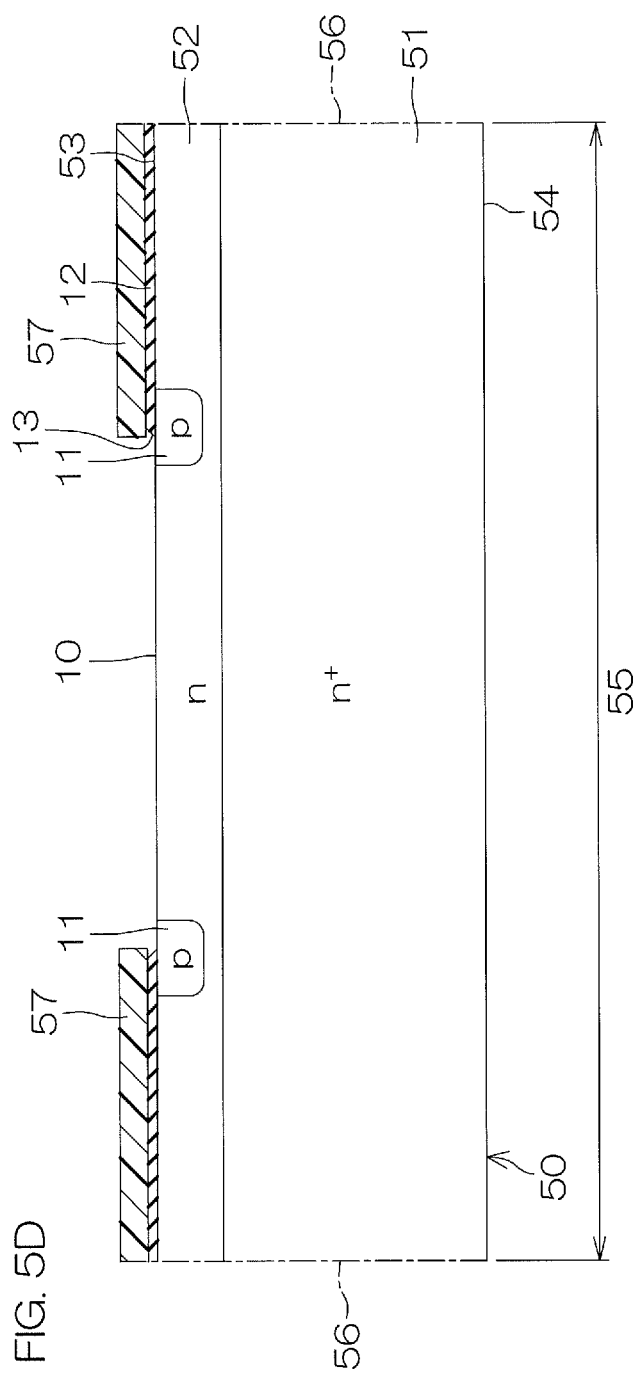
FIG. 5D is a sectional view of a step subsequent to that of FIG. 5C.

Next, referring to FIG. 5D, a resist mask 57 having a predetermined pattern is formed on the main surface insulating layer 12. The resist mask 57 exposes a region of the main surface insulating layer 12 in which the contact opening 13 is to be formed and covers other regions. Next, unnecessary portions of the main surface insulating layer 12 are removed by an etching method via the resist mask 57. The etching method may be a wet etching method and/or a dry etching method. The contact opening 13 is thereby formed in the main surface insulating layer 12.

Figure 5E:
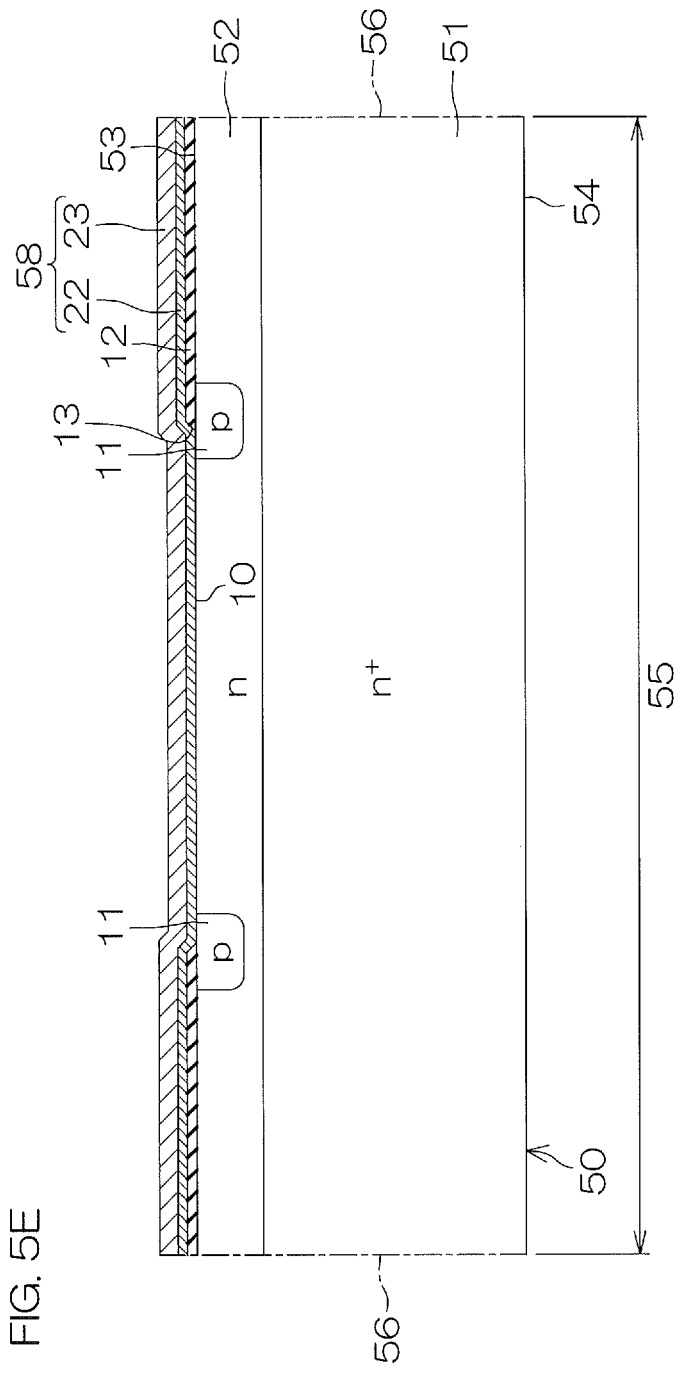
FIG. 5E is a sectional view of a step subsequent to that of FIG. 5D.

Next, referring to FIG. 5E, a base electrode layer 58 that is to be a base of the first main surface electrode 21 is formed on the main surface insulating layer 12. The base electrode layer 58 has a laminated structure that includes the barrier electrode 22 and the principal electrode 23 laminated in that order from the main surface insulating layer 12 side. The barrier electrode 22 and the principal electrode 23 may each be formed by a sputtering method and/or a vapor deposition method.

Next, referring to FIG. 5F, a resist mask 59 having a predetermined pattern is formed on the base electrode layer 58. The resist mask 59 exposes a region of the base electrode layer 58 in which the first main surface electrode 21 is to be formed and covers other regions. Next, unnecessary portions of the base electrode layer 58 are removed by an etching method via the resist mask 59. The etching method may be a wet etching method and/or a dry etching method. The first main surface electrode 21 is thereby formed on the main surface insulating layer 12.

Figure 5G:
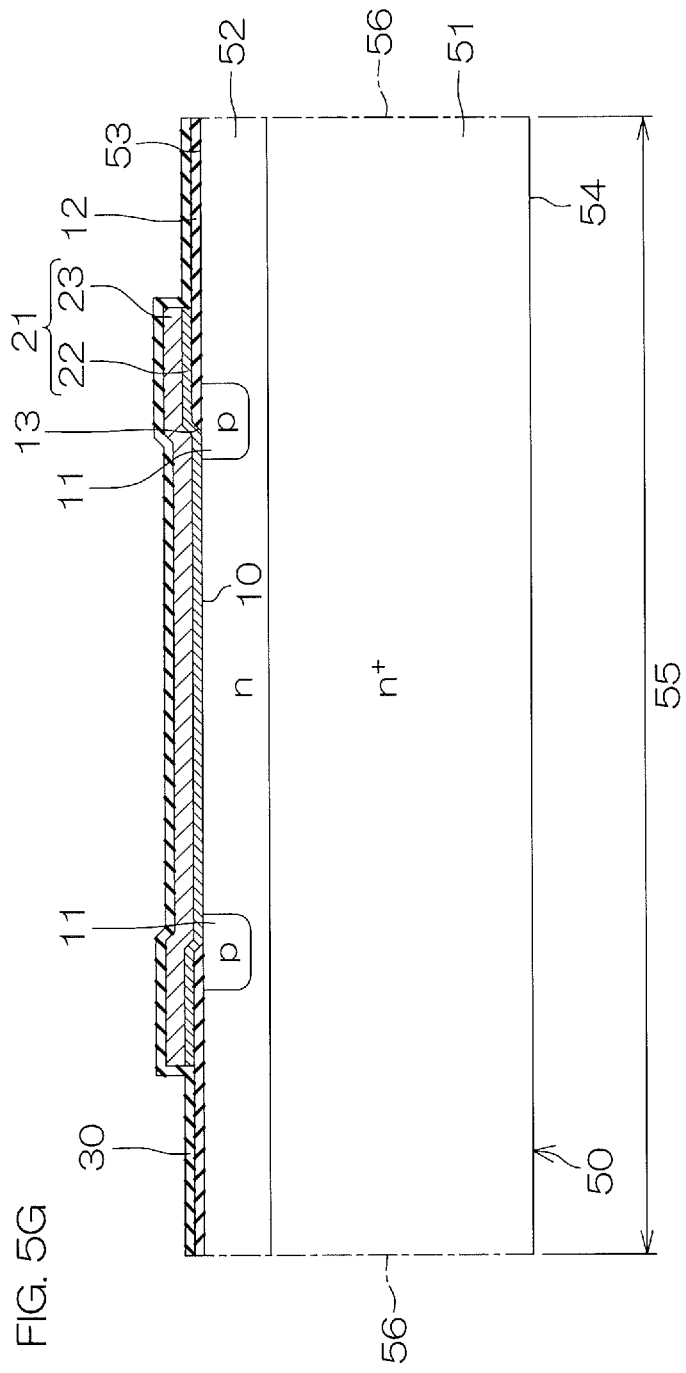
FIG. 5G is a sectional view of a step subsequent to that of FIG. 5F.

Next, referring to FIG. 5G, the inorganic insulating layer 30 is formed on the main surface insulating layer 12 such as to cover the first main surface electrode 21. In this embodiment, the inorganic insulating layer 30 has the single layer structure constituted of the silicon nitride layer. The inorganic insulating layer 30 may have a laminated structure that includes a silicon oxide layer and a silicon nitride layer laminated in that order from the SiC epitaxial wafer 50 side. The inorganic insulating layer 30 may be formed by a CVD method.

Figure 5H:
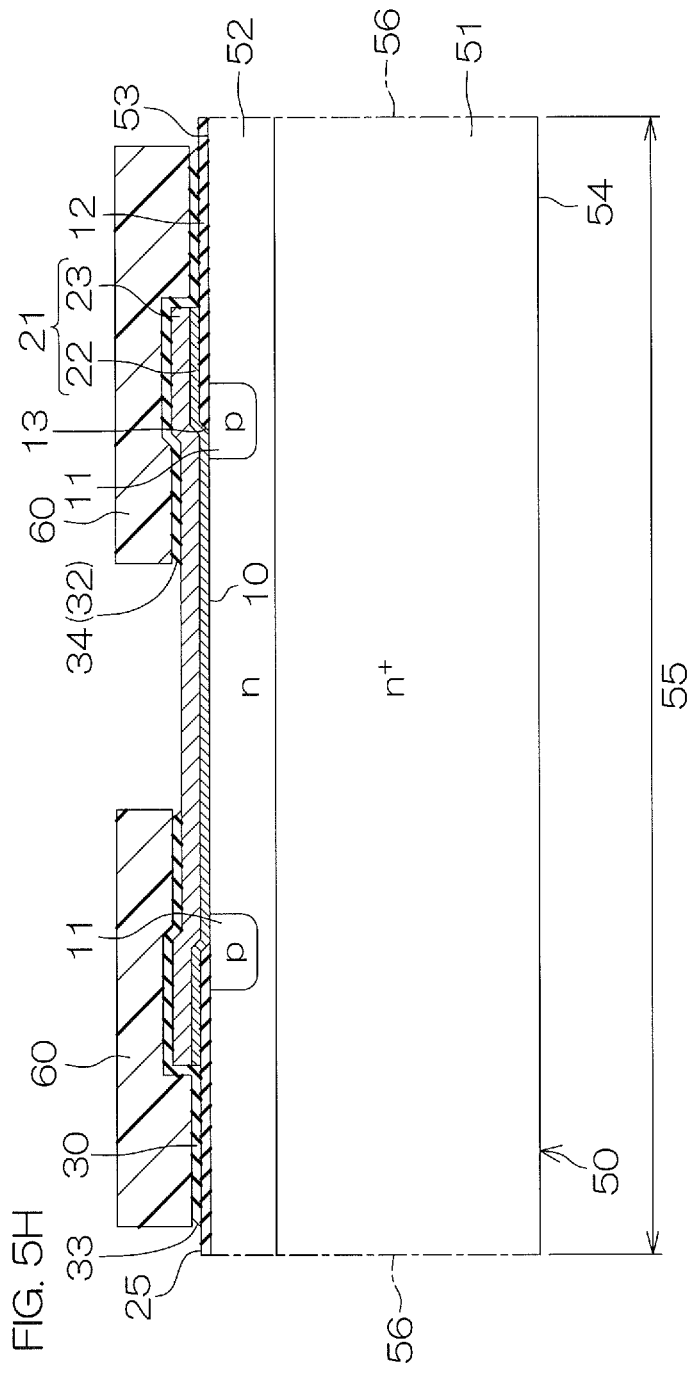
FIG. 5H is a sectional view of a step subsequent to that of FIG. 5G.

Next, referring to FIG. 5H, a resist mask 60 having a predetermined pattern is formed on the inorganic insulating layer 30. The resist mask 60 exposes regions of the inorganic insulating layer 30 in which the first opening 34 and the dicing streets 25 are to be formed and covers other regions. Next, unnecessary portions of the inorganic insulating layer 30 are removed by an etching method via the resist mask 60. The etching method may be a wet etching method and/or a dry etching method. The first opening 34 that exposes the first main surface electrode 21 and the dicing streets 25 that extend in a lattice along the scheduled cutting lines 56 are thereby formed in the inorganic insulating layer 30.

Figure 5I:
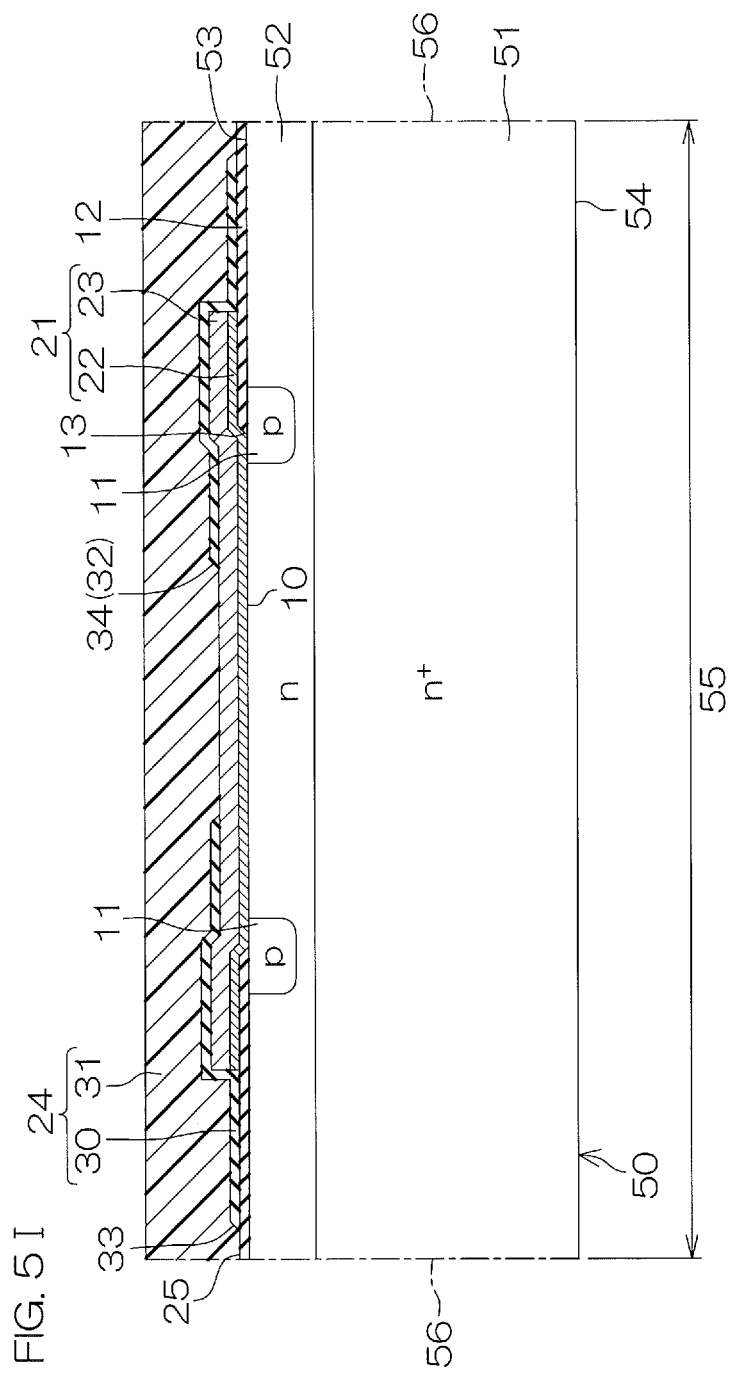
FIG. 5I is a sectional view of a step subsequent to that of FIG. 5H.

Next, referring to FIG. 5I, the organic insulating layer 31 is formed on the main surface insulating layer 12 such as to cover the first main surface electrode and the inorganic insulating layer 30. The organic insulating layer 31 is formed by coating a polyimide as an example of a photosensitive resin on the first wafer main surface 53 side.

Figure 5J:
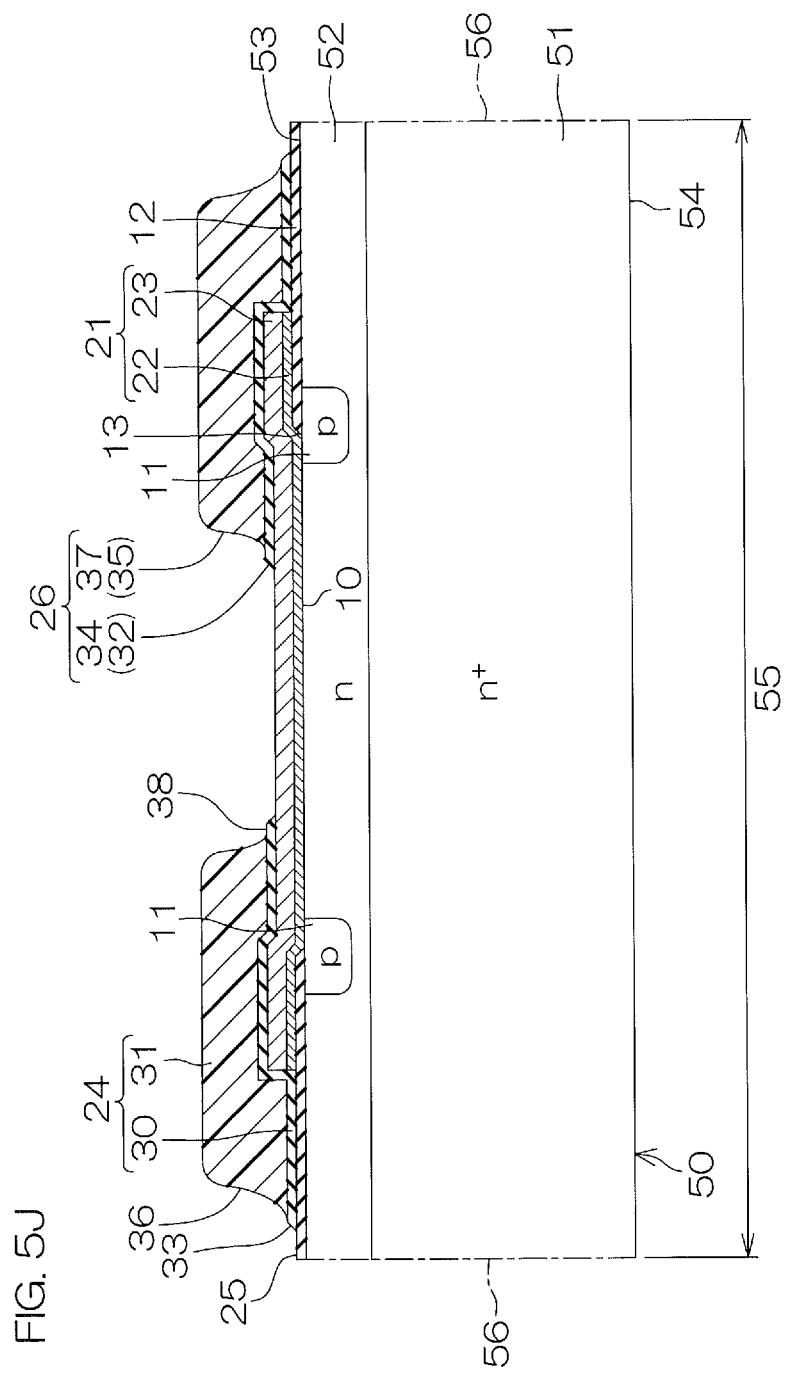
FIG. 5J is a sectional view of a step subsequent to that of FIG. 5I.

Next, referring to FIG. 5J, the organic insulating layer 31 is exposed and thereafter developed in a pattern corresponding to the second opening 37 and the dicing streets 25. The second opening 37 that exposes the first main surface electrode 21 and the dicing streets 25 that extend in a lattice along the scheduled cutting lines 56 are thereby formed in the organic insulating layer 31.

The second opening 37 of the organic insulating layer 31 is formed such as to surround the first opening 34 of the inorganic insulating layer 30 at an interval from the first opening 34. The organic insulating layer 31 that exposes the inner peripheral edge 38 of the inorganic insulating layer 30 in the region between the first opening 34 and the second opening 37 is thereby formed.

Figure 5K:
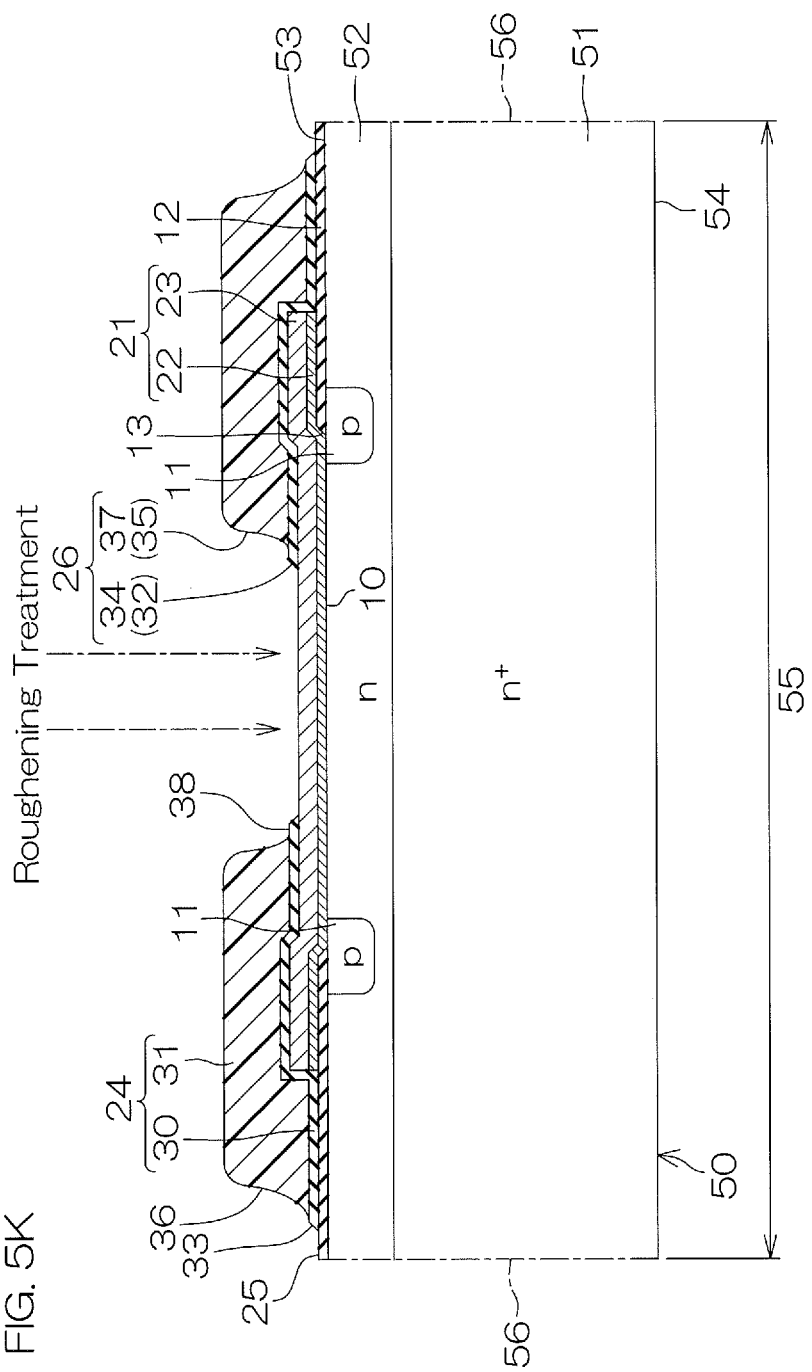
FIG. 5K is a sectional view of a step subsequent to that of FIG. 5J.

Next, referring to FIG. 5K, the rough surface region 39 is formed in a portion of the first main surface electrode 21 exposed from the first opening 34 and the second opening 37. The rough surface region 39 is formed by a zincate treatment method (zinc substitution treatment method) on the exposed portion of the first main surface electrode 21.

Figure 5L:
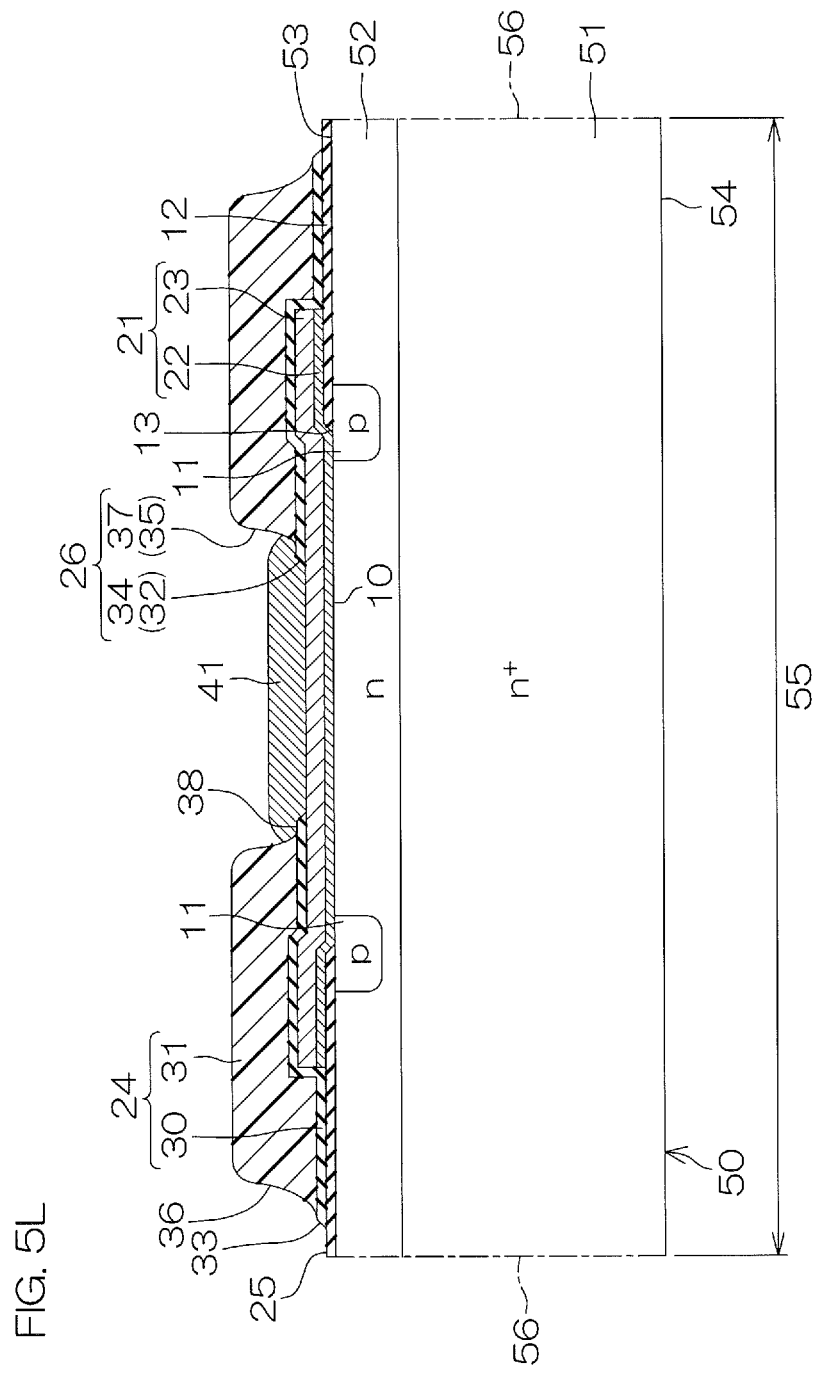
FIG. 5L is a sectional view of a step subsequent to that of FIG. 5K.

Next, referring to FIG. 5L, the Ni plating layer 41 is formed on the portion of the first main surface electrode 21 exposed from the first opening 34 and the second opening 37. The Ni plating layer 41 is formed by forming a film of Ni from the first main surface electrode 21 by an electroplating method or an electroless plating method (electroless plating method in this embodiment). The Ni plating layer 41 that covers the first main surface electrode 21 inside the first opening 34 and covers the inner peripheral edge 38 of the inorganic insulating layer inside the second opening 37 is thereby formed. The specific structure of the Ni plating layer 41 is as has been described above and description thereof shall thus be omitted.

Figure 5M:
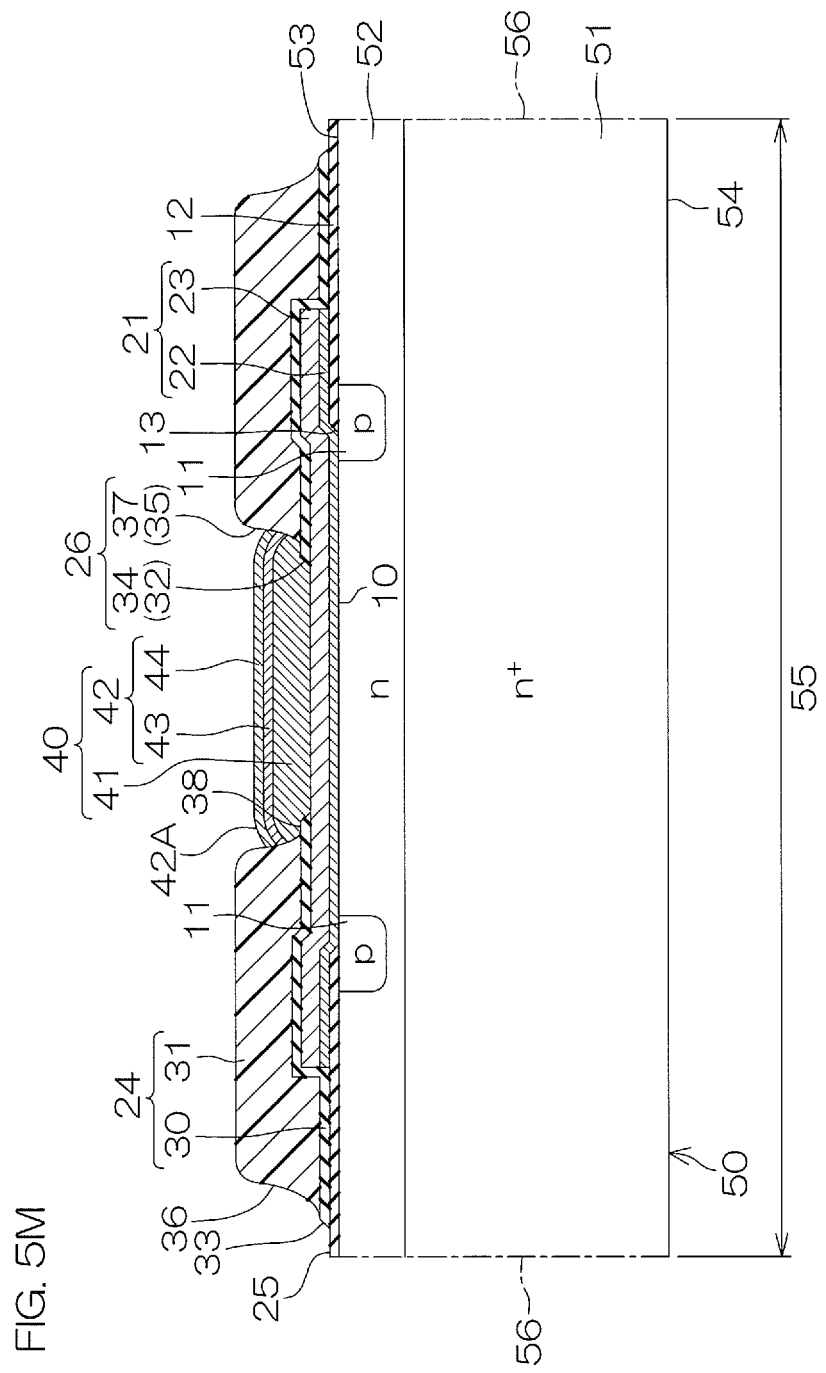
FIG. 5M is a sectional view of a step subsequent to that of FIG. 5L.

Next, referring to FIG. 5M, the outer surface plating layer 42 is formed on the outer surface of the Ni plating layer 41 inside the second opening 37. The outer surface plating layer 42 includes at least one among the Pd plating layer 43, the Au plating layer 44, and the Ag plating layer 45. The outer surface plating layer 42 is formed by forming films of certain materials among Pd, Au, and Ag from the first main surface electrode 21 by an electroplating method or an electroless plating method (electroless plating method in this embodiment).

Figure 5N:
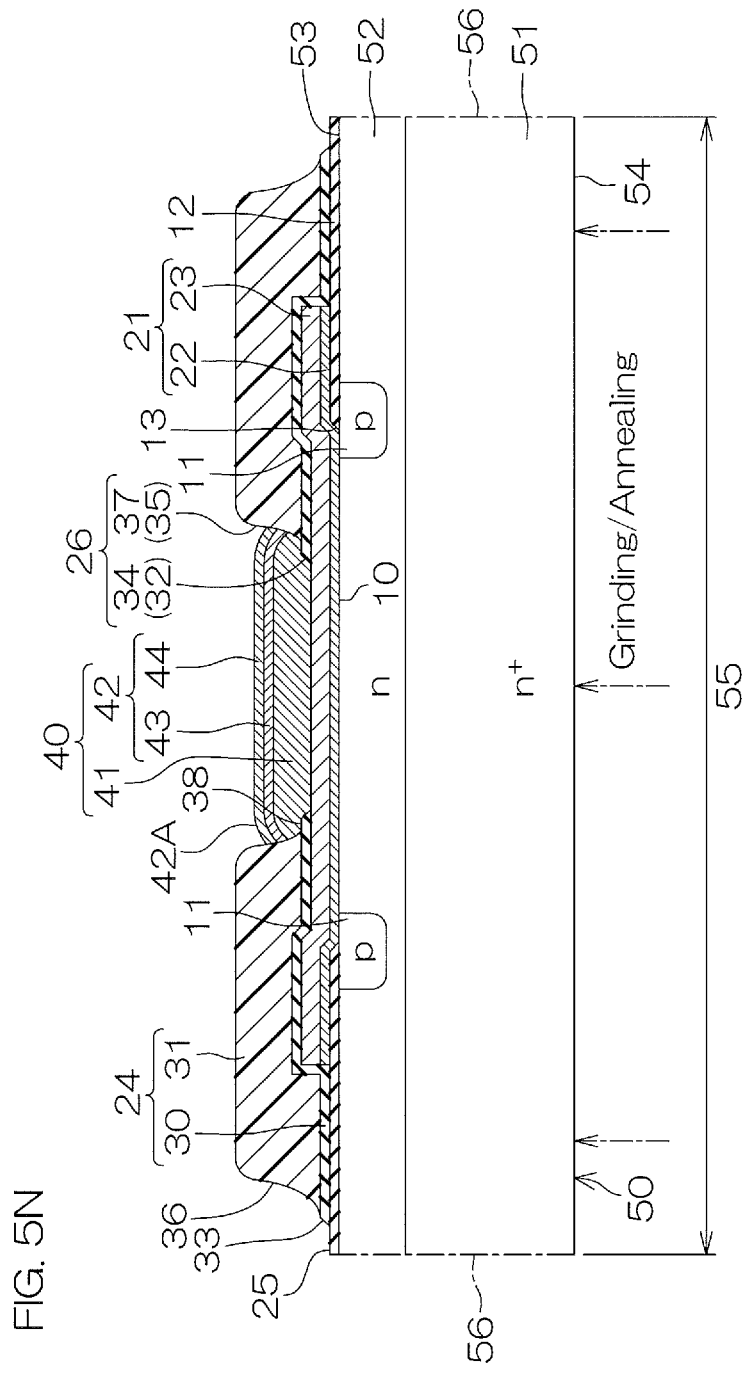
FIG. 5N is a sectional view of a step subsequent to that of FIG. 5M.
Figure 50:
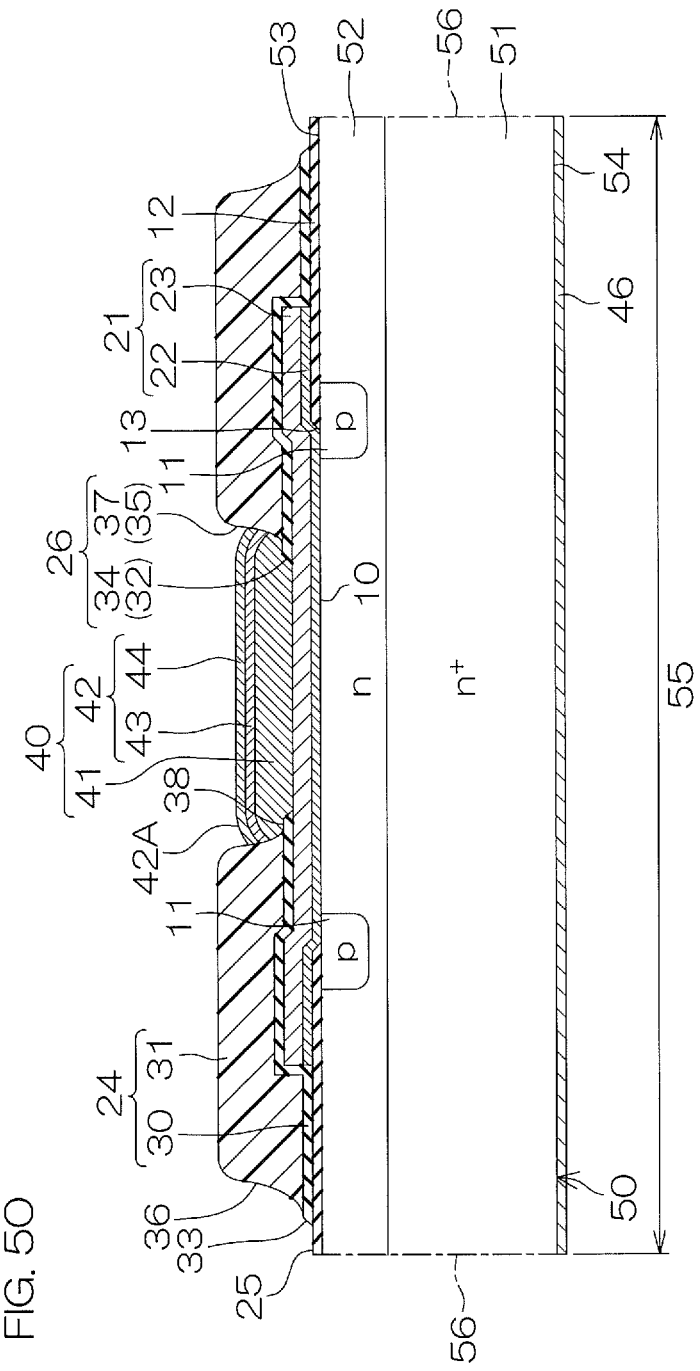

Next, referring to FIG. 5N, the SiC epitaxial wafer 50 is thinned to a desired thickness by grinding of the second wafer main surface 54. The second wafer main surface 54 may be ground by a CMP (chemical mechanical polishing) method. After the step of grinding the second wafer main surface 54, an annealing treatment may be performed with respect to the second wafer main surface 54. The annealing treatment may be performed by a laser irradiation method. The second wafer main surface 54 (second main surface 4) thereby becomes an ohmic surface.

Next, referring to FIG. 5O, the second main surface electrode 46 is formed on the second wafer main surface 54. The second main surface electrode 46 may be formed by a sputtering method, a vapor deposition method and/or a plating method. Thereafter, the SiC epitaxial wafer 50 is cut or cleaved along the dicing streets 25 to cut out the plurality of semiconductor devices 1. The semiconductor device 1 is manufactured through steps including the above.

As described above, the semiconductor device 1 includes the SiC chip 2, the first main surface electrode 21, the inorganic insulating layer 30, the organic insulating layer 31, and the Ni plating layer 41. The first main surface electrode 21 is formed on the SiC chip 2. The inorganic insulating layer 30 covers the first main surface electrode 21 and has the first opening 34 that exposes the first main surface electrode 21. The organic insulating layer 31 covers the inorganic insulating layer 30, has the second opening 37 that surrounds the first opening 34 at the interval from the first opening 34, and exposes the inner peripheral edge 38 of the inorganic insulating layer 30 in the region between the first opening 34 and the second opening 37. The Ni plating layer 41 is connected to the first main surface electrode 21 inside the first opening 34 and covers the inner peripheral edge 38 of the inorganic insulating layer 30 inside the second opening 37.

The inorganic insulating layer 30 has the property of being high in adhesion to Ni and on the other hand, the organic insulating layer 31 has the property of being low in adhesion to Ni in comparison to the inorganic insulating layer 30. Therefore, for example, if the inorganic insulating layer 30 is not present or the organic insulating layer 31 is formed flush with the inorganic insulating layer 30, the Ni plating layer 41 forms, with the organic insulating layer 31, a gap that extends toward the first main surface electrode 21. Consequently, connection of the Ni plating layer 41 to the first main surface electrode 21 becomes insufficient and reliability of the Ni plating layer 41 decreases.

Thus, with the semiconductor device 1, a structure is adopted in which the organic insulating layer that exposes the inner peripheral edge 38 of the inorganic insulating layer 30 having the property of being high in adhesion to Ni is formed and the Ni plating layer 41 covers the inner peripheral edge 38 of the inorganic insulating layer 30. In this case, the Ni plating layer 41 forms, with the inorganic insulating layer 30, the first connecting portion that extends in the thickness direction of the inorganic insulating layer 30 and a second connecting portion that extends in the width direction of the inorganic insulating layer 30.

A region of forming of the gap can thereby be situated away from the first main surface electrode 21 and, at the same time, the forming of the gap that extends toward the first main surface electrode 21 can be suppressed appropriately. Also, in comparison to a case in which the inner peripheral edge 38 of the inorganic insulating layer 30 is not present, the region of forming of the gap with the organic insulating layer 31 can be reduced. Reliability of the Ni plating layer 41 can thus be improved.

With the semiconductor device 1, the second portion 41B of the Ni plating layer 41 covers the region at the inorganic insulating layer 30 side with respect to the intermediate portion of the second inner wall 35 of the organic insulating layer 31. In other words, the second portion 41B of the Ni plating layer 41 covers the organic insulating layer 31 such that the hidden area of the second inner wall 35 (organic insulating layer 31) is less than the exposed area of the second inner wall 35 (organic insulating layer 31). According to such a Ni plating layer 41, the region of forming of the gap can be reduced appropriately.

The semiconductor device 1 further includes the outer surface plating layer 42 that covers the outer surface of the Ni plating layer 41. According to such a structure, the forming of the gap is suppressed between the organic insulating layer 31 and the Ni plating layer 41 and therefore, entry of a plating solution into the gap can be suppressed.ABnormal film forming of the outer surface plating layer 42 with the gap as a starting point can thereby be suppressed. Consequently, connection failure of the Ni plating layer 41 due to the abnormal film forming of the outer surface plating layer 42 can be suppressed and, at the same time, peeling (connection failure) of the outer surface plating layer 42 can be suppressed.

Specifically, the outer surface plating layer 42 may include at least one among the Pd plating layer 43, the Au plating layer 44, and the Ag plating layer 45. Connection failure of the Ni plating layer 41 due to abnormal film forming of the Pd plating layer 43, the Au plating layer 44, and the Ag plating layer 45 can thus be suppressed. At the same time, peeling (connection failure) of the Pd plating layer 43, the Au plating layer 44, and the Ag plating layer 45 can be suppressed.

Figure 6:
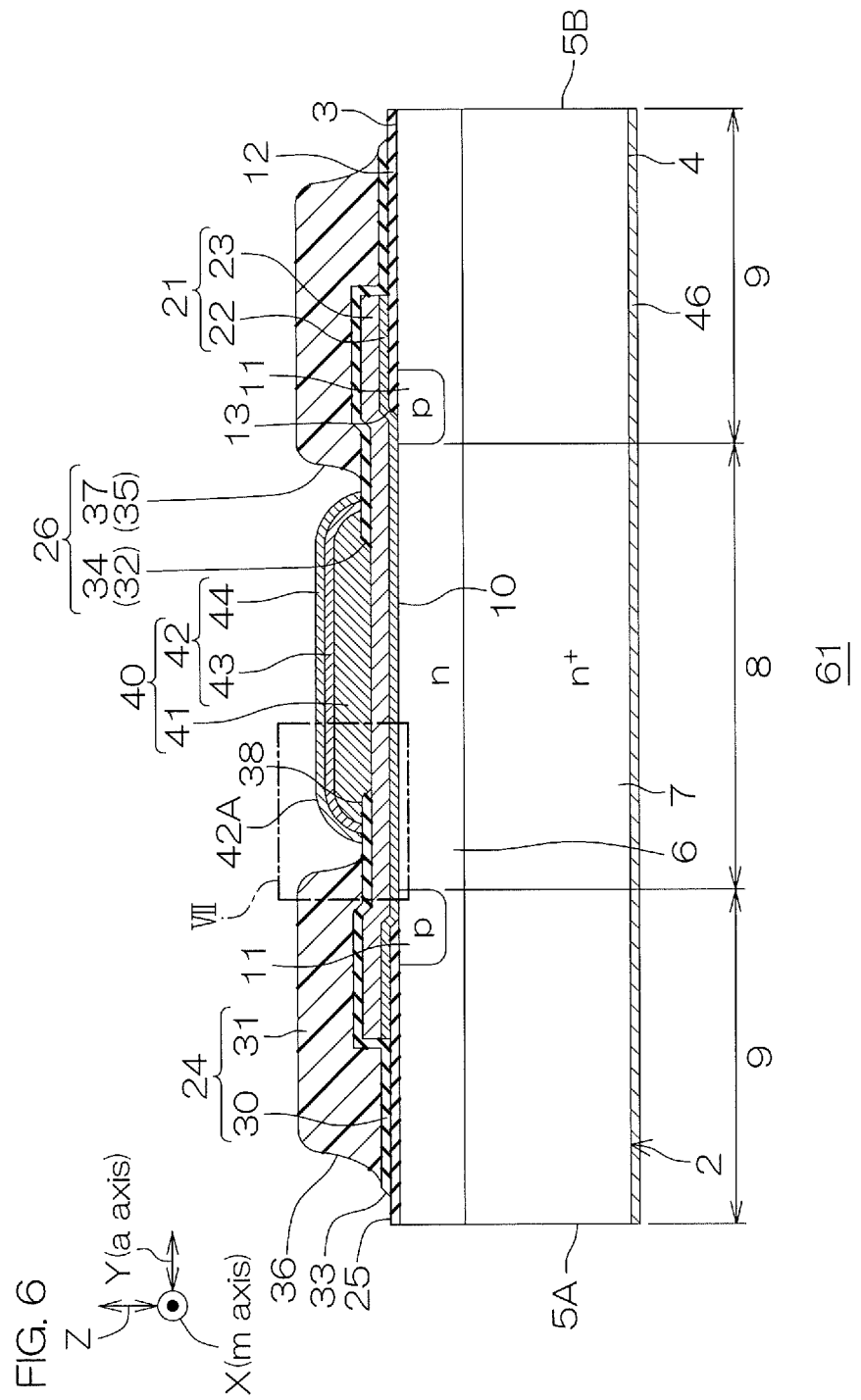
FIG. 6 is a diagram corresponding to FIG. 2 and is a sectional view showing a semiconductor device according to a second preferred embodiment of the present invention together with the outer surface plating layer according to a first configuration example.
Figure 7:
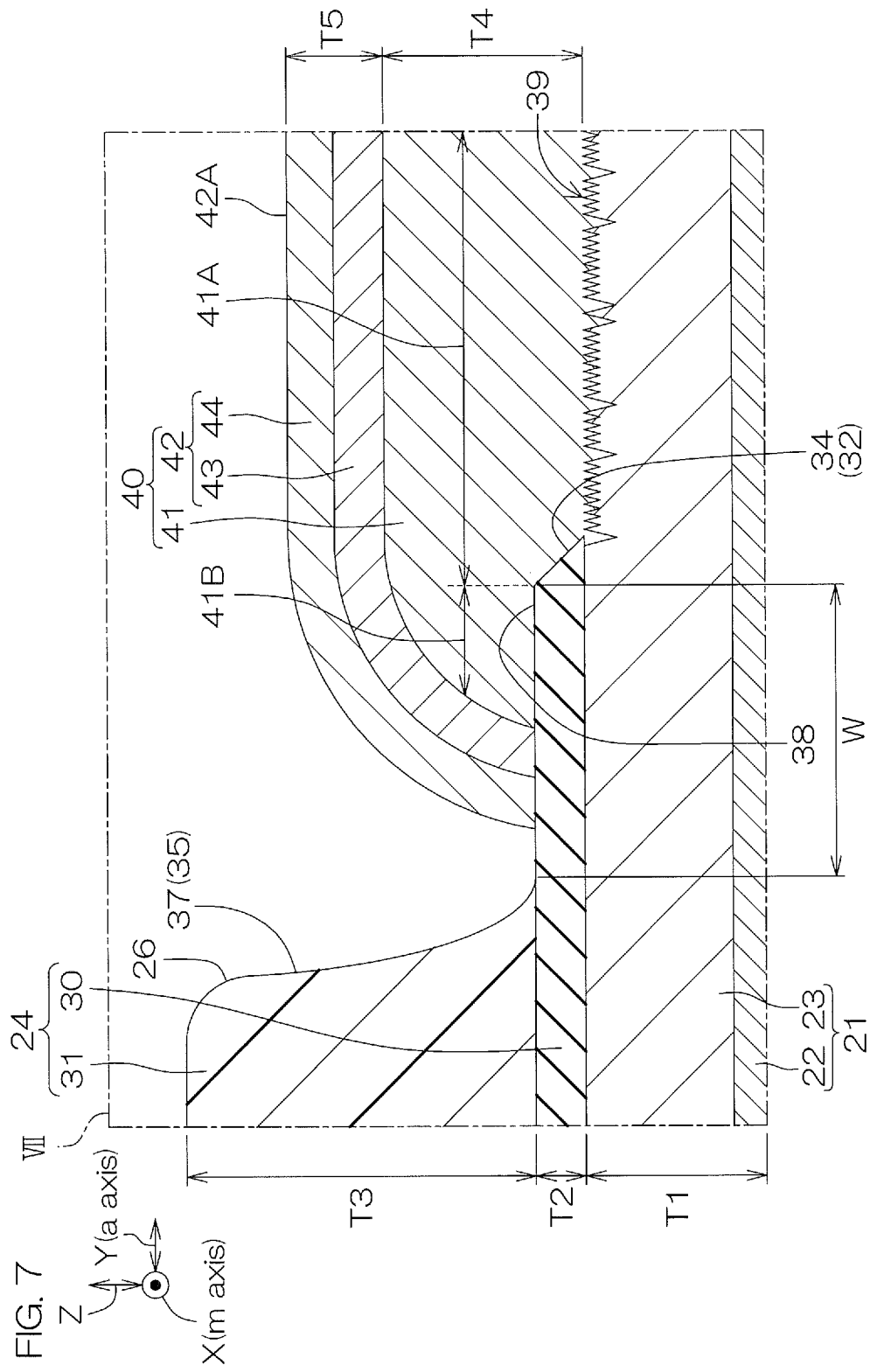
FIG. 7 is an enlarged view of a region VII shown in FIG. 6.

FIG. 6 is a diagram corresponding to FIG. 2 and is a sectional view showing a semiconductor device 61 according to a second preferred embodiment of the present invention together with the outer surface plating layer 42 according to a first configuration example. FIG. 7 is an enlarged view of a region VII shown in FIG. 6. In the following, structures corresponding to structures described for the semiconductor device 1 shall be provided with the same reference signs and description thereof shall be omitted.

Referring to FIG. 6 and FIG. 7, the organic insulating layer 31 exposes the inner peripheral edge 38 of the inorganic insulating layer 30 in the region between the first opening 34 and the second opening 37. Although the width W of the inner peripheral edge 38 of the inorganic insulating layer 30 is arbitrary, it preferably exceeds the thickness T2 of the inorganic insulating layer 30 (T2<W).

A ratio W/T2 of the width W of the inner peripheral edge 38 with respect to the thickness T2 of the inorganic insulating layer 30 may exceed 1 and be not more than 10. The ratio W/T2 may exceed 1 and be not more than 2 or be not less than 2 and not more than 4, not less than 4 and not more than 6, not less than 6 and not more than 8, or not less than 8 and not more than 10. The ratio W/T2 is preferably not less than 2 and not more than 5. The width W may exceed 0 μm and be not more than 10 μm. The width W may exceed 0 μm and be not more than 2 μm or be not less than 2 μm and not more than 4 μm, not less than 4 μm and not more than 6 μm, not less than 6 μm and not more than 8 μm, or not less than 8 μm and not more than 10 μm.

The Ni plating layer 41 is formed on the first main surface electrode 21 inside the pad opening 26. The Ni plating layer 41 covers the first main surface electrode 21 inside the first opening 34 and covers the inner peripheral edge 38 of the inorganic insulating layer 30 inside the second opening 37. The Ni plating layer 41 has the outer surface that is formed at an interval toward the first main surface electrode 21 side from the main surface of the organic insulating layer 31 (insulating layer 24). The Ni plating layer 41 covers the inner peripheral edge 38 of the inorganic insulating layer 30 at an interval from the organic insulating layer 31 inside the second opening 37.

Specifically, the Ni plating layer 41 includes the first portion 41A that covers the first main surface electrode 21 and the second portion 41B that covers the inner peripheral edge 38 of the inorganic insulating layer 30. The first portion 41A of the Ni plating layer 41 fills the rough surface region 39 and covers the first main surface electrode 21 inside the first opening 34. The first portion 41A covers the entire area of the first inner wall 32 of the inorganic insulating layer 30 inside the first opening 34 and protrudes from the opening end of the first opening 34 toward the opening end of the second opening 37. The first portion 41A has the first connecting portion that is connected to the first inner wall 32 of the inorganic insulating layer 30 and extends in the thickness direction of the inorganic insulating layer 30.

The second portion 41B of the Ni plating layer 41 is led out from the first portion 41A toward the organic insulating layer 31 side inside the second opening 37. The second portion 41B is formed in an arcuate shape that is directed toward the second inner wall 35 of the organic insulating layer 31 with the opening end of the first opening 34 as a starting point.

The second portion 41B covers the inner peripheral edge 38 of the inorganic insulating layer 30 inside the second opening 37. In this embodiment, the second portion 41B partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that a portion of the inner peripheral edge 38 of the inorganic insulating layer 30 is exposed.

The Ni plating layer 41 thereby exposes the portion of the inner peripheral edge 38 of the inorganic insulating layer 30 and an entire area of the second inner wall 35 of the organic insulating layer 31. The second portion 41B opposes the first main surface electrode 21 across the inner peripheral edge 38 of the inorganic insulating layer 30. The second portion 41B has the second connecting portion that is connected to the main surface of the inorganic insulating layer 30 and extends in the width direction of the inorganic insulating layer 30.

The Ni plating layer 41 has the thickness T4 that exceeds the thickness T2 of the inorganic insulating layer (T2<T4). The thickness T4 is less than the thickness T3 of the organic insulating layer 31 (T4<T3). The thickness T4 is less than the value resulting from adding the width W of the inner peripheral edge 38 to the thickness T2 of the inorganic insulating layer 30 (T2+W) (T4<T2+W). This is a condition by which the Ni plating layer 41 exposes the second inner wall 35 of the organic insulating layer 31. The thickness T4 is defined by the thickness of the Ni plating layer 41 based on the main surface of the first main surface electrode 21.

The ratio T4/T2 of the thickness T4 of the Ni plating layer 41 with respect to the thickness T2 of the inorganic insulating layer 30 may exceed 1 and be not more than 5. The ratio T4/T2 may exceed 1 and be not more than 2 or be not less than 2 and not more than 3, not less than 3 and not more than 4, or not less than 4 and not more than 5. The thickness T4 may be not less than 0.1 µm and not more than 10 µm. The thickness T4 may be not less than 0.1 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm.

The outer surface plating layer 42 covers the outer surface of the Ni plating layer 41 inside the second opening 37. The outer surface plating layer 42 has the thickness T5 that is less than the thickness T4 of the Ni plating layer 41 (T5<T4). In this embodiment, the outer surface plating layer 42 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37.

The outer surface plating layer 42 has the terminal surface 42A that is to be externally connected via a conductive bonding material (for example, solder). The terminal surface 42A is positioned at the Ni plating layer side with respect to the main surface of the organic insulating layer 31 (opening end of the second opening 37). The outer surface plating layer 42 thereby exposes the portion of the inner peripheral edge 38 of the inorganic insulating layer 30 and the entire area of the second inner wall 35 of the organic insulating layer 31 inside the second opening 37.

Specifically, the outer surface plating layer 42 has the laminated structure that includes the Pd plating layer 43 and the Au plating layer 44 laminated in that order from the Ni plating layer 41 side. The Pd plating layer 43 is formed as a film along the outer surface of the Ni plating layer 41. The Pd plating layer 43 covers the Ni plating layer 41 at an interval toward the inorganic insulating layer 30 side from the opening end of the second opening 37. The Pd plating layer 43 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed. The Pd plating layer 43 thereby exposes the portion of the inner peripheral edge 38 of the inorganic insulating layer 30 and the entire area of the second inner wall 35 of the organic insulating layer 31 inside the second opening 37.

The Pd plating layer 43 has a thickness less than the thickness T4 of the Ni plating layer 41. The thickness of the Pd plating layer 43 may be not less than 0.01 µm and not more than 1 µm. The thickness of the Pd plating layer 43 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

The Au plating layer 44 is formed as a film along the outer surface of the Pd plating layer 43. The Au plating layer 44 covers the Pd plating layer 43 at an interval toward the inorganic insulating layer 30 side from the opening end of the second opening 37. The Au plating layer 44 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed. The Au plating layer 44 thereby exposes the portion of the inner peripheral edge 38 of the inorganic insulating layer 30 and the entire area of the second inner wall 35 of the organic insulating layer 31 inside the second opening 37.

The Au plating layer 44 has a thickness less than the thickness T4 of the Ni plating layer 41. The thickness of the Au plating layer 44 may be not less than 0.01 µm and not more than 1 µm. The thickness of the Au plating layer 44 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

With this embodiment, an example where the outer surface plating layer 42 that exposes the entire area of the second inner wall 35 of the organic insulating layer 31 is formed was described. However, the outer surface plating layer 42 that covers a portion of the second inner wall 35 of the organic insulating layer 31 may be adopted instead. In this case, at least one among the Pd plating layer 43 and the Au plating layer 44 may cover a portion of the second inner wall 35 of the organic insulating layer 31. The outer surface plating layer 42 may take on any of the various configurations shown in FIG. 8A to FIG. 8D.

FIG. 8A is a diagram corresponding to FIG. 7 and is an enlarged view of the outer surface plating layer 42 according to a second configuration example. In the following, portions differing from the outer surface plating layer 42 according to the first configuration example shall be described.

Referring to FIG. 8A, in this embodiment, the outer surface plating layer 42 has a single layer structure constituted of the Au plating layer 44. The Au plating layer 44 is formed as a film along the outer surface of the Ni plating layer 41. The Au plating layer 44 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed.

The Au plating layer 44 covers the Ni plating layer 41 at an interval toward the inorganic insulating layer 30 side from the opening end of the second opening 37. The Au plating layer 44 thereby exposes the portion of the inner peripheral edge 38 of the inorganic insulating layer 30 and the entire area of the second inner wall 35 of the organic insulating layer 31 inside the second opening 37. The Au plating layer 44 may cover a portion of the second inner wall 35 of the organic insulating layer 31 instead.

Figure 8B:
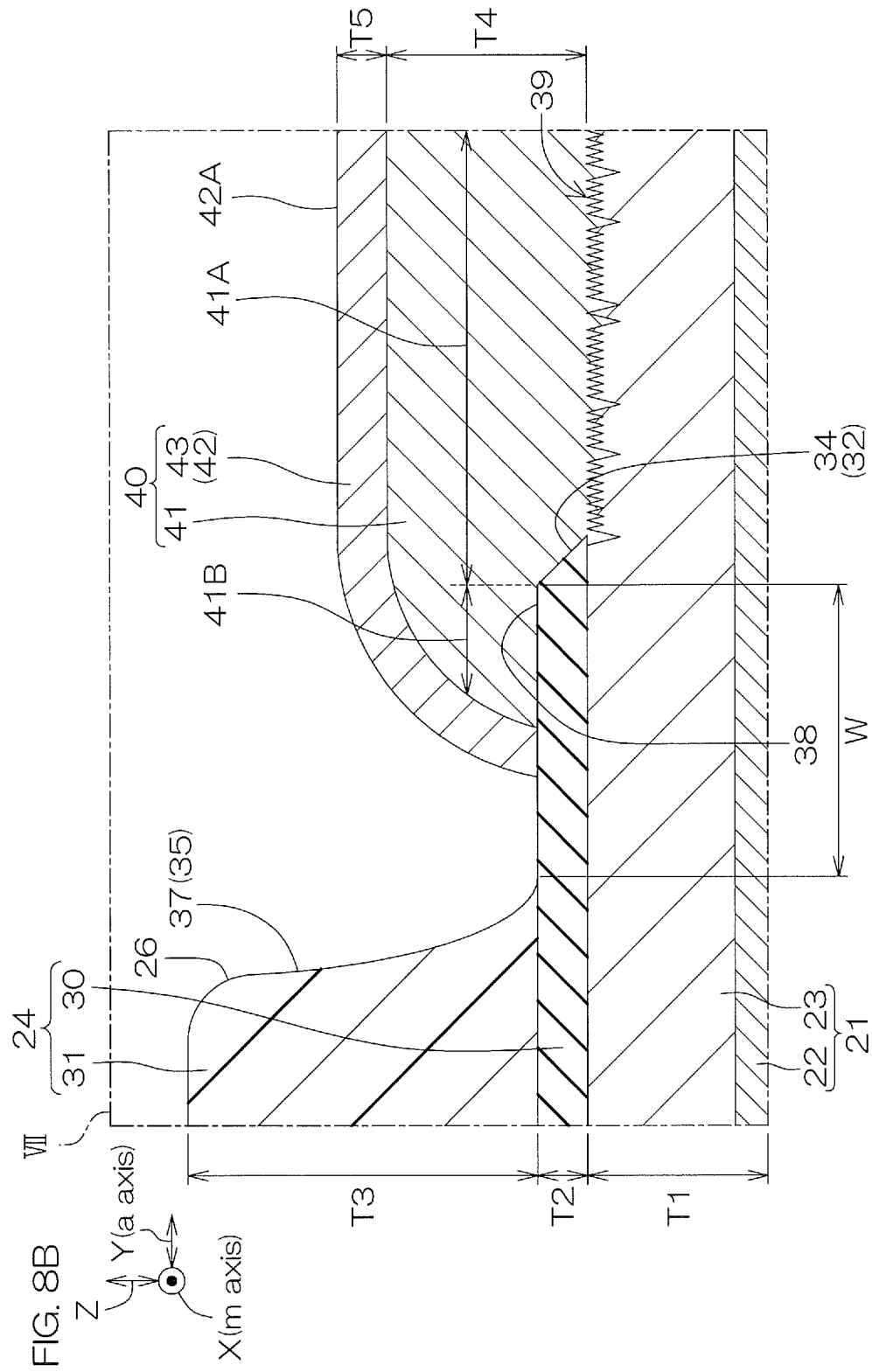
FIG. 8B is a diagram corresponding to FIG. 7 and is an enlarged view of the outer surface plating layer according to a third configuration example.

FIG. 8B is a diagram corresponding to FIG. 7 and is an enlarged view of the outer surface plating layer 42 according to a third configuration example. In the following, portions differing from the outer surface plating layer 42 according to the first configuration example shall be described.

Referring to FIG. 8B, in this embodiment, the outer surface plating layer 42 has a single layer structure constituted of the Pd plating layer 43. The Pd plating layer 43 is formed as a film along the outer surface of the Ni plating layer 41. The Pd plating layer 43 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed.

The Pd plating layer 43 covers the Ni plating layer 41 at an interval toward the inorganic insulating layer 30 side from the opening end of the second opening 37. The Pd plating layer 43 thereby exposes the portion of the inner peripheral edge 38 of the inorganic insulating layer 30 and the entire area of the second inner wall 35 of the organic insulating layer 31 inside the second opening 37. The Pd plating layer 43 may cover a portion of the second inner wall 35 of the organic insulating layer 31 instead.

FIG. 8C is a diagram corresponding to FIG. 7 and is an enlarged view of the outer surface plating layer 42 according to a fourth configuration example. In the following, portions differing from the outer surface plating layer 42 according to the first configuration example shall be described.

Referring to FIG. 8C, in this embodiment, the outer surface plating layer 42 has a single layer structure constituted of the Ag plating layer 45. The Ag plating layer 45 is formed as a film along the outer surface of the Ni plating layer 41. The Ag plating layer 45 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed.

The Ag plating layer 45 covers the Ni plating layer 41 at an interval toward the inorganic insulating layer 30 side from the opening end of the second opening 37. The Ag plating layer 45 thereby exposes the portion of the inner peripheral edge 38 of the inorganic insulating layer 30 and the entire area of the second inner wall 35 of the organic insulating layer 31 inside the second opening 37. The Ag plating layer 45 may cover a portion of the second inner wall 35 of the organic insulating layer 31 instead.

The Ag plating layer 45 has a thickness less than the thickness T4 of the Ni plating layer 41. The thickness of the Ag plating layer 45 may be not less than 0.01 µm and not more than 1 µm. The thickness of the Ag plating layer 45 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

FIG. 8D is a diagram corresponding to FIG. 7 and is an enlarged view of the outer surface plating layer 42 according to a fifth configuration example. In the following, portions differing from the outer surface plating layer 42 according to the first configuration example shall be described.

Referring to FIG. 8D, the outer surface plating layer 42 has the laminated structure that includes the Pd plating layer 43, the Au plating layer 44, and the Ag plating layer 45 laminated in that order from the Ni plating layer 41 side.

The Pd plating layer 43 is formed as a film along the outer surface of the Ni plating layer 41. The Pd plating layer 43 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed. The Pd plating layer 43 covers the Ni plating layer 41 at an interval toward the inorganic insulating layer 30 side from the opening end of the second opening 37. The Pd plating layer 43 thereby exposes the portion of the inner peripheral edge 38 of the inorganic insulating layer 30 and the entire area of the second inner wall 35 of the organic insulating layer 31 inside the second opening 37.

The Au plating layer 44 is formed as a film along the outer surface of the Pd plating layer 43. The Au plating layer 44 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed. The Au plating layer 44 covers the Pd plating layer 43 at an interval toward the inorganic insulating layer 30 side from the opening end of the second opening 37. The Au plating layer 44 thereby exposes the portion of the inner peripheral edge 38 of the inorganic insulating layer 30 and the entire area of the second inner wall 35 of the organic insulating layer 31 inside the second opening 37.

The Ag plating layer 45 is formed as a film along the outer surface of the Au plating layer 44. The Ag plating layer 45 partially covers the inner peripheral edge 38 of the inorganic insulating layer 30 at an interval toward the first inner wall 32 side of the inorganic insulating layer 30 from the second inner wall 35 of the organic insulating layer 31 inside the second opening 37 such that the portion of the inner peripheral edge 38 of the inorganic insulating layer 30 is exposed. The Ag plating layer 45 covers the Au plating layer 44 at an interval toward the inorganic insulating layer 30 side from the opening end of the second opening 37. The Ag plating layer 45 thereby exposes the portion of the inner peripheral edge 38 of the inorganic insulating layer 30 and the entire area of the second inner wall 35 of the organic insulating layer 31 inside the second opening 37. At least one among the Pd plating layer 43, the Au plating layer 44, and the Ag plating layer 45 may cover a portion of the second inner wall 35 of the organic insulating layer 31 instead.

The same effects as the effects described for the semiconductor device 1 can also be exhibited by the semiconductor device 61 described above. In particular, the Ni plating layer 41 pertaining to the semiconductor device 61 covers the inner peripheral edge 38 of the inorganic insulating layer 30 at an interval from the organic insulating layer 31 inside the second opening 37. Forming of an undesirable gap between the organic insulating layer 31 and the Ni plating layer 41 can thereby be prevented. The reliability of the Ni plating layer 41 can thus be improved reliably.

Further, the semiconductor device 61 includes the outer surface plating layer 42 that covers the outer surface of the Ni plating layer 41. According to such a structure, a gap is not formed between the organic insulating layer 31 and the Ni plating layer 41 and therefore, the outer surface plating layer 42 can be formed appropriately along the outer surface of the Ni plating layer 41. Connection failure of the Ni plating layer 41 due to abnormal film forming of the outer surface plating layer 42 can thus be suppressed appropriately and, at the same time, peeling (connection failure) of the outer surface plating layer 42 can be suppressed appropriately.

Specifically, the outer surface plating layer 42 may include at least one among the Pd plating layer 43, the Au plating layer 44, and the Ag plating layer 45. Connection failure of the Ni plating layer 41 due to abnormal film forming of the Pd plating layer 43, the Au plating layer 44, and the Ag plating layer 45 can thus be suppressed. At the same time, peeling (connection failure) of the Pd plating layer 43, the Au plating layer 44, and the Ag plating layer 45 can be suppressed.

Figure 9:
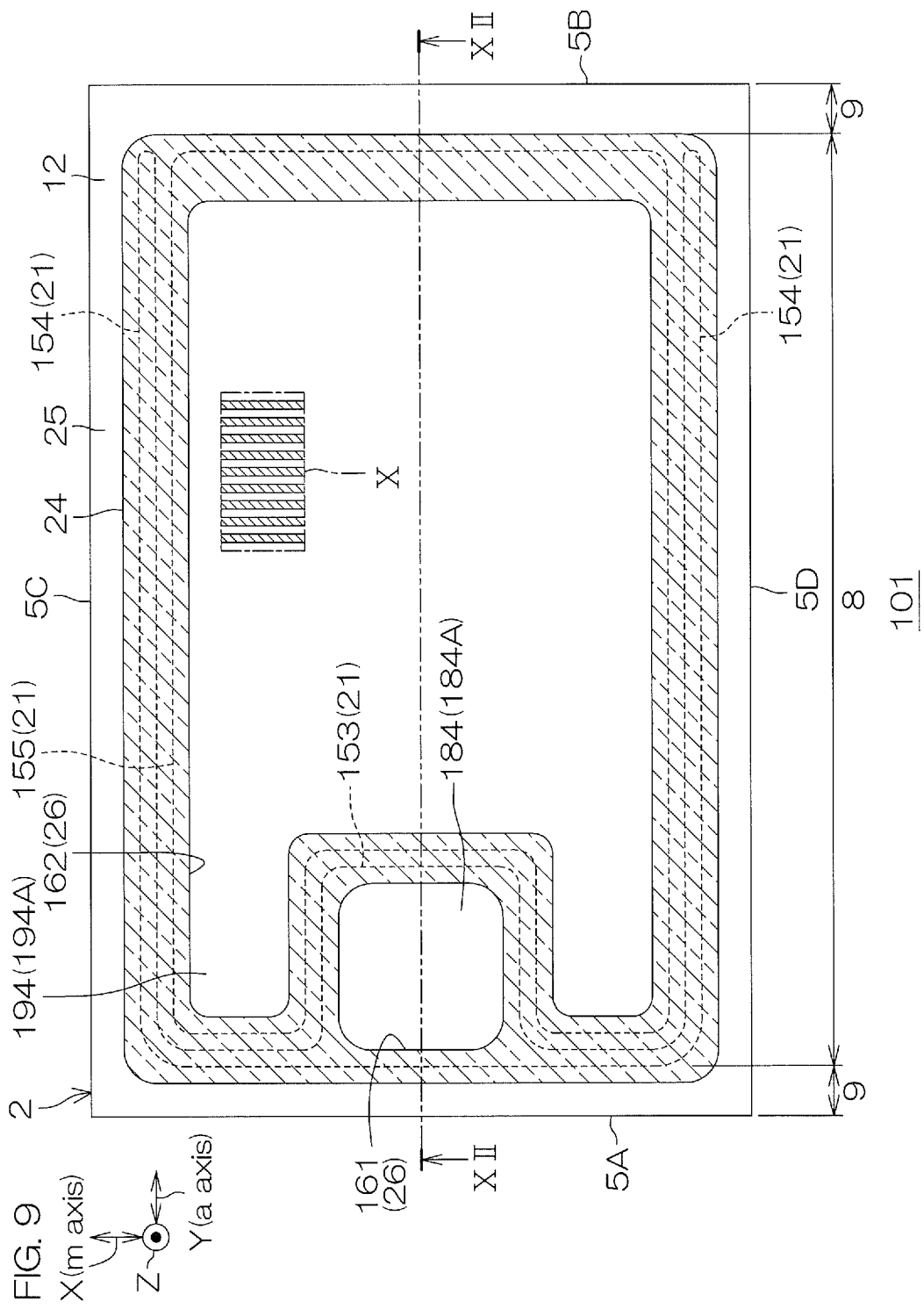
FIG. 9 is a plan view of a semiconductor device according to a third preferred embodiment of the present invention.
Figure 10:
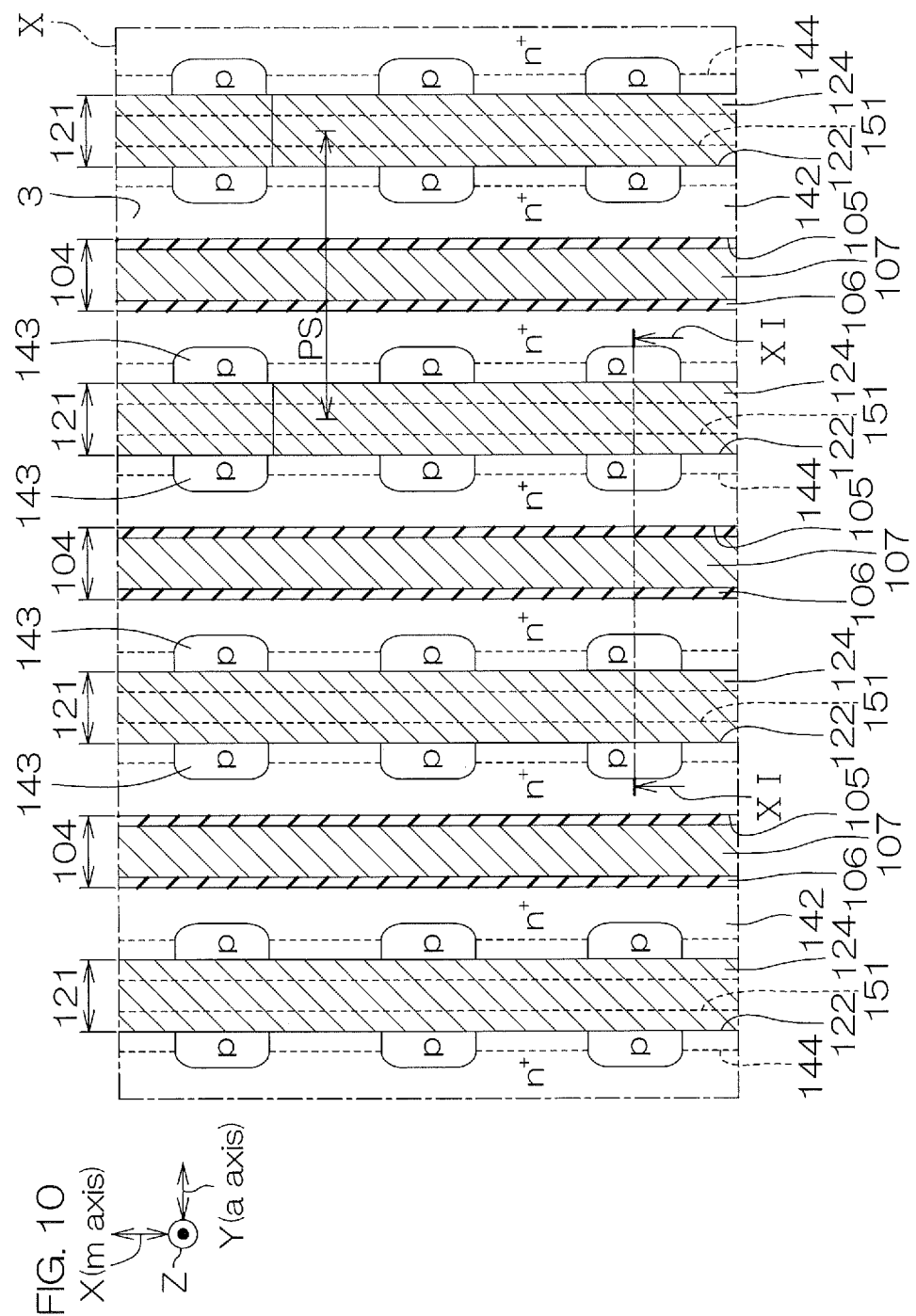
FIG. 10 is an enlarged view of a region X shown in FIG. 9.
Figure 11:
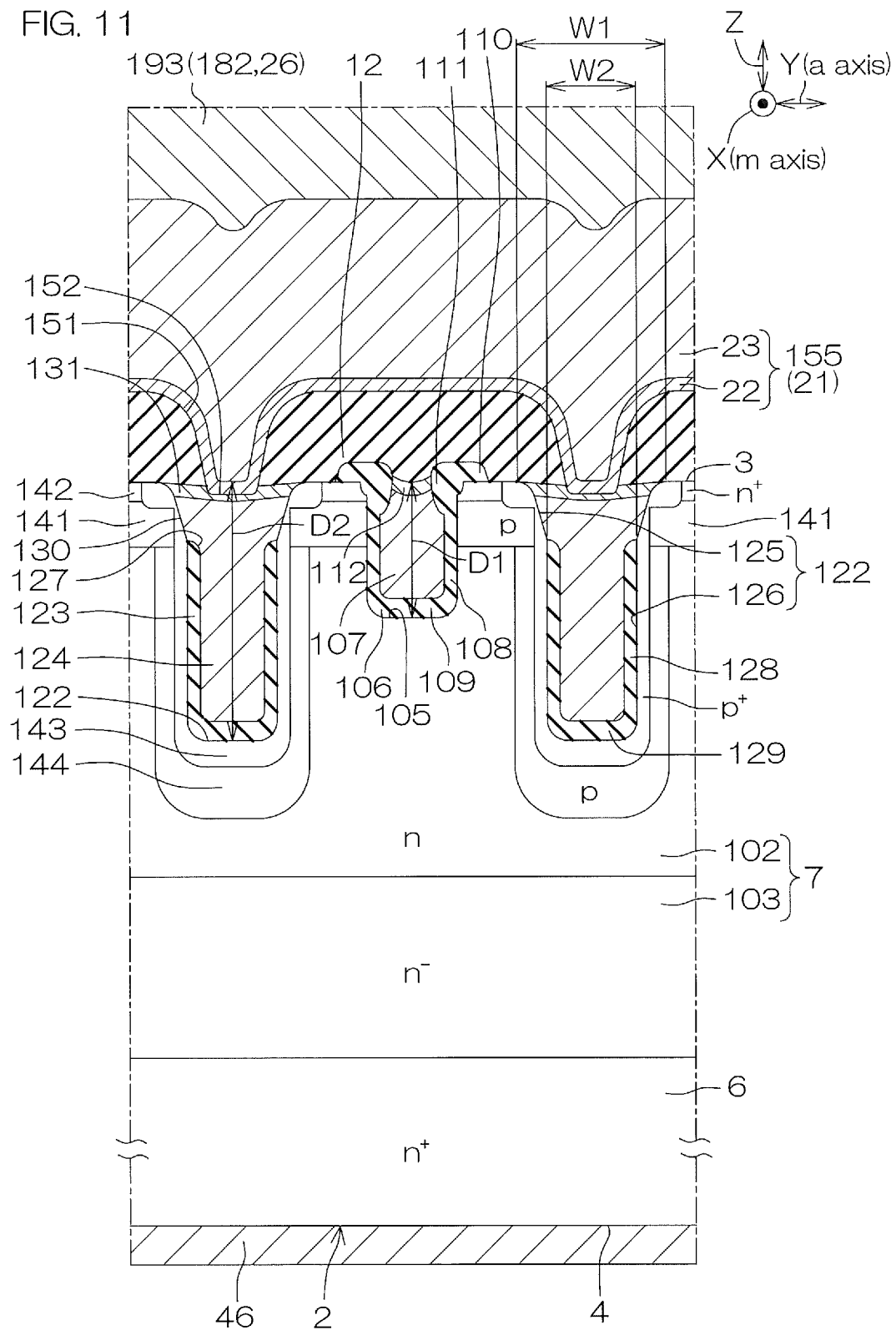
FIG. 11 is a sectional view taken along line XI-XI shown in FIG. 10.
Figure 12:
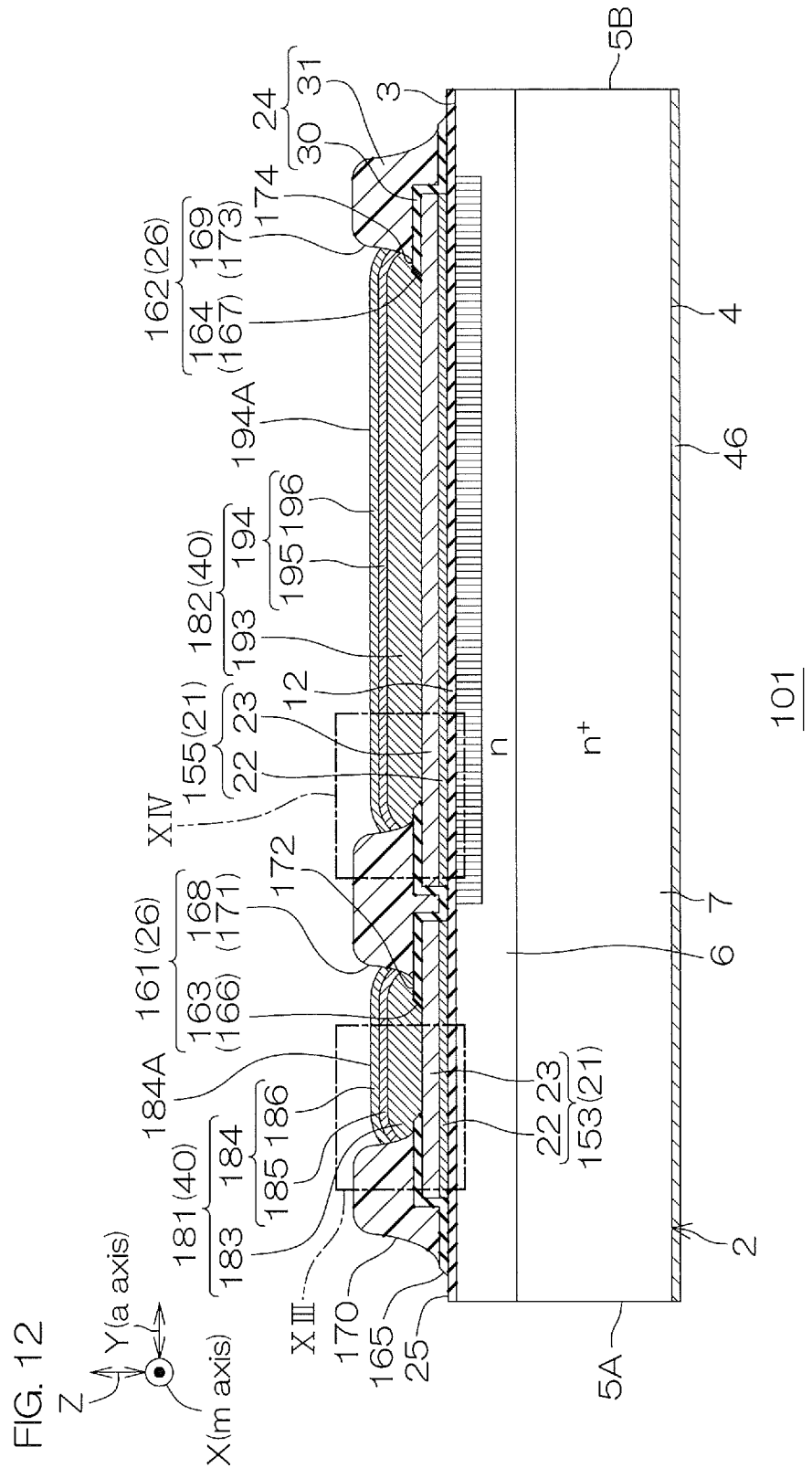
FIG. 12 is a sectional view taken along line XII-XII shown in FIG. 9.
Figure 13:
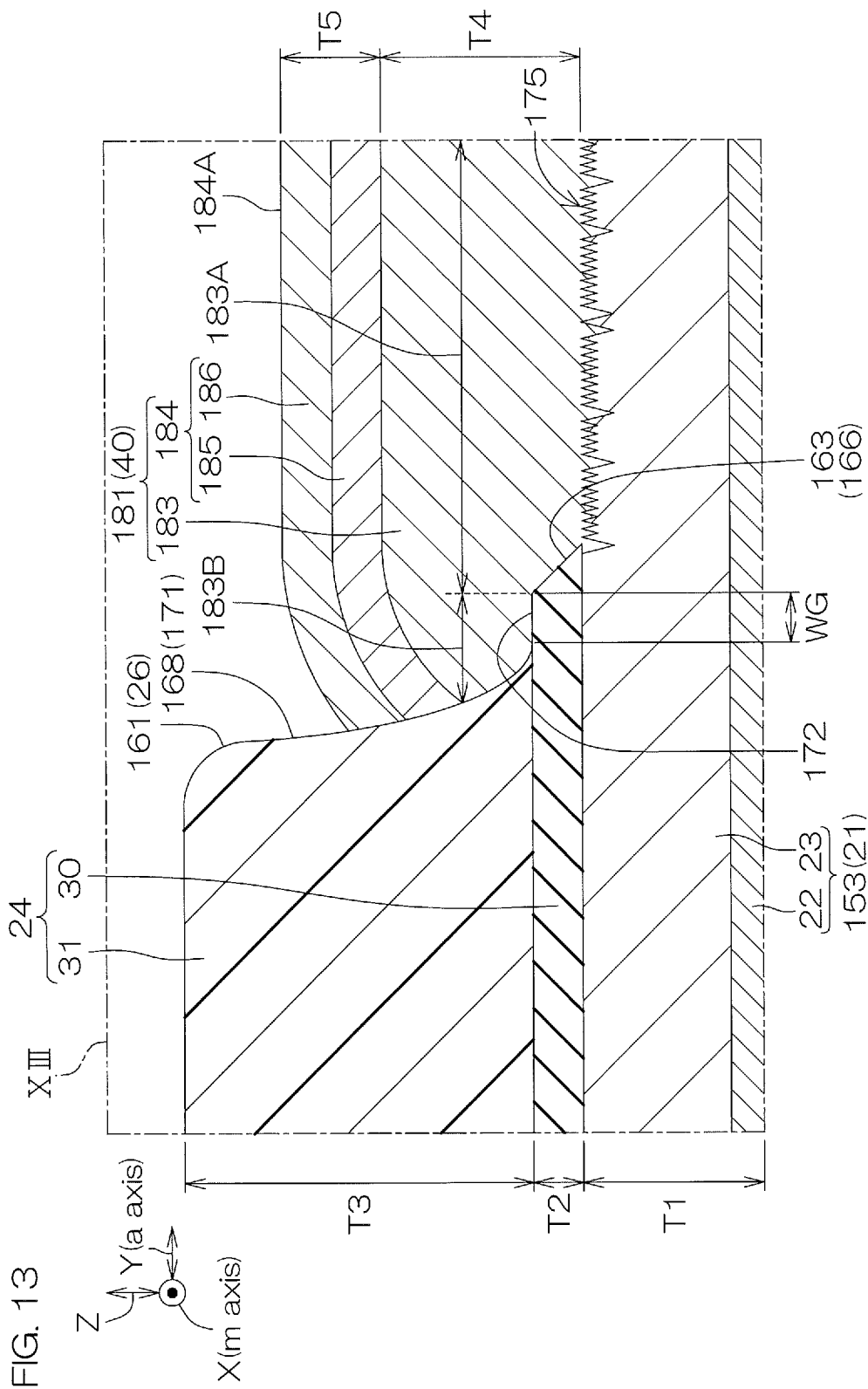
FIG. 13 is an enlarged view of a region XIII shown in FIG. 12.
Figure 14:
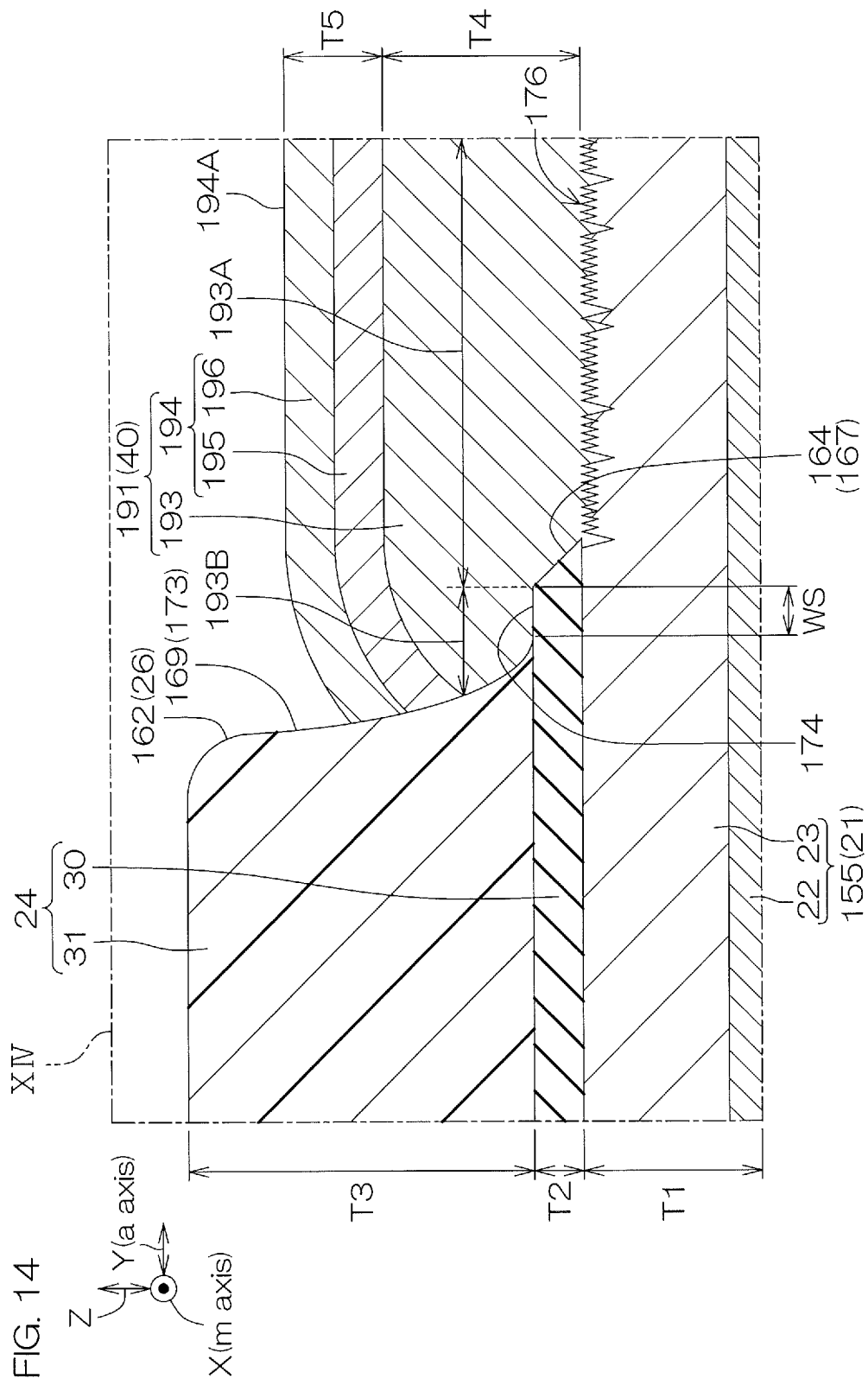
FIG. 14 is an enlarged view of a region XIV shown in FIG. 12.

FIG. 9 is a plan view of a semiconductor device 101 according to a third preferred embodiment of the present invention. FIG. 10 is an enlarged view of a region X shown in FIG. 9. FIG. 11 is a sectional view taken along line XI-XI shown in FIG. 10. FIG. 12 is a sectional view taken along line XII-XII shown in FIG. 9. FIG. 13 is an enlarged view of a region XIII shown in FIG. 12. FIG. 14 is an enlarged view of a region XIV shown in FIG. 12. In the following, structures corresponding to structures described for the semiconductor device 1 shall be provided with the same reference signs and description thereof shall be omitted.

Referring to FIG. 9 to FIG. 14, the semiconductor device 101 is an SiC semiconductor device in which a MISFET (metal insulator semiconductor field effect transistor) is formed as an example of a functional device in place of an SBD in the active region 8.

The semiconductor device 101 includes the SiC chip 2, the main surface insulating layer 12, the first main surface electrodes 21, the insulating layer 24, the pad electrodes 40, and the second main surface electrode 46. In FIG. 9, the insulating layer 24 is shown with hatching. The first main surface 3 and the second main surface 4 of the SiC chip 2 are formed in quadrilateral shapes (rectangular shapes in this embodiment) in plan view.

The first side surface 5A and the second side surface 5B extend along the first direction X and oppose each other in the second direction Y intersecting the first direction X. The first side surface 5A and the second side surface 5B form short sides of the SiC chip 2. The third side surface 5C and the fourth side surface 5D extend along the second direction Y and oppose each other in the first direction X. The third side surface 5C and the fourth side surface 5D form long sides of the SiC chip 2.

A length of the first side surface 5A (second side surface 5B) may be not less than 0.1 mm and not more than 8 mm. The length of the first side surface 5A (second side surface 5B) is preferably not less than 0.1 mm and not more than 2.5 mm. A length of the third side surface 5C (fourth side surface 5D) may be not less than 0.2 mm and not more than 16 mm. The length of the third side surface 5C (fourth side surface 5D) is preferably not less than 0.5 mm and not more than 5 mm.

As in the first preferred embodiment, the SiC chip 2 has the laminated structure that includes the SiC substrate 6 and the SiC epitaxial layer 7. The SiC substrate 6 is formed as a drain region of the MISFET. The SiC epitaxial layer 7 is formed as a drift region of the MISFET.

In this embodiment, the SiC epitaxial layer 7 has an n-type impurity concentration that differs along the normal direction Z. Specifically, the SiC epitaxial layer includes a high concentration region 102 with a comparatively high n-type impurity concentration and a low concentration region 103 that is lower in the n-type impurity concentration than the high concentration region 102.

The high concentration region 102 is formed in a region at the first main surface 3 side. The low concentration region 103 is formed in a region at the second main surface 4 side with respect to the high concentration region 102. A thickness of the high concentration region 102 is less than a thickness of the low concentration region 103. The thickness of the high concentration region 102 is less than one-half the total thickness of the SiC epitaxial layer 7.

The n-type impurity concentration of the high concentration region 102 may be not less than $1.0 \times 10^{16}$ cm$^{-3}$ and not more than $1.0 \times 10^{18}$ cm$^{-3}$. The n-type impurity concentration of the low concentration region 103 may be not less than $1.0 \times 10^{15}$ cm$^{-3}$ and not more than $1.0 \times 10^{16}$ cm$^{-3}$. Obviously, the n-type impurity concentration of the SiC epitaxial layer 7 may be in a range of not less than $1.0 \times 10^{15}$ cm$^{-3}$ and not more than $1.0 \times 10^{18}$ cm$^{-3}$ and have a concentration gradient with which the n-type impurity concentration decreases gradually from the SiC substrate 6 toward the first main surface 3.

In plan view, the active region 8 is formed in a central portion of the SiC chip 2 at intervals inward from the side surfaces 5A to 5D. In plan view, the active region is formed in a rectangular shape having four sides parallel to the side surfaces 5A to 5D. On the other hand, the outer region 9 is formed in a rectangular annular shape surrounding the active region 8 in plan view.

The semiconductor device 101 includes a plurality of trench gate structures 104 formed in the first main surface 3 in the active region 8. The plurality of trench gate structures 104 are respectively formed as bands extending along the first direction X and are formed at intervals in the second direction Y. The plurality of trench gate structures 104 are formed in stripes extending along the first direction X in plan view.

In this embodiment, the plurality of trench gate structures 104 extend as bands from a peripheral edge portion at one side (the third side surface 5C side) to a peripheral edge portion at another side (the fourth side surface 5D side) of the active region 8. The plurality of trench gate structures 104 traverse an intermediate portion of the active region 8 between the peripheral edge portion at one side and the peripheral edge portion at the other side.

A length of each trench gate structure 104 may be not less than 1 mm and not more than 10 mm. The length of each trench gate structure 104 may be not less than 1 mm and not more than 2 mm, not less than 2 mm and not more than 4 mm, not less than 4 mm and not more than 6 mm, not less than 6 mm and not more than 8 mm, or not less than 8 mm and not more than 10 mm. The length of each trench gate structure 104 is preferably not less than 2 mm and not more than 6 mm. A total extension per unit area of a single trench gate structure 104 may be not less than 0.5 µm/µm² and not more than 0.75 µm/µm².

Each trench gate structure 104 includes a gate trench 105, a gate insulating layer 106, and a gate electrode 107. In FIG. 10, the gate insulating layers 106 and the gate electrodes 107 are shown with hatching.

Each gate trench 105 is formed in the SiC epitaxial layer 7. The gate trench 105 includes side walls and a bottom wall. The side walls that form long sides of the gate trench 105 are formed by a-planes of the SiC monocrystal. The side walls that form short sides of the gate trench 105 are formed by m-planes of the SiC monocrystal.

The side walls of the gate trench 105 may extend along the normal direction Z. Angles that the side walls of the gate trench 105 form with respect to the first main surface 3 inside the SiC chip 2 may be not less than 90° and not more than 95° (for example, not less than 91° and not more than 93°). The side walls of the gate trench 105 may be formed substantially perpendicular to the first main surface 3. The gate trench 105 may be formed in a tapered shape with which an opening width narrows toward the bottom wall from the first main surface 3.

The bottom wall of the gate trench 105 is positioned in the high concentration region 102. The bottom wall of the gate trench 105 is arranged along a c-plane of the SiC monocrystal. The bottom wall of the gate trench 105 has an off angle inclined in the a-axis direction with respect to the c-plane of the SiC monocrystal. The bottom wall of the gate trench 105 may be formed parallel to the first main surface 3. The bottom wall of the gate trench 105 may be formed in a shape curved toward the second main surface 4.

The gate trench 105 has a first depth D1. The first depth D1 may be not less than 0.5 µm and not more than 3 µm. The first depth D1 may be not less than 0.5 µm and not more than 1 µm, not less than 1 µm and not more than 1.5 µm, not less than 1.5 µm and not more than 2 µm, not less than 2 µm and not more than 2.5 µm, or not less than 2.5 µm and not more than 3 µm.

A width along the second direction Y of the gate trench 105 may be not less than 0.1 µm and not more than 2 µm. The width of the gate trench 105 may be not less than 0.1 µm and not more than 0.5 µm, not less than 0.5 µm and not more than 1 µm, not less than 1 µm and not more than 1.5 µm, or not less than 1.5 µm and not more than 2 µm.

An opening edge portion of the gate trench 105 includes an inclined portion that is inclined downwardly from the first main surface 3 toward an inner side of the gate trench 105. The opening edge portion of the gate trench 105 is a portion connecting the first main surface 3 and the side walls of the gate trench 105. The inclined portion of the gate trench 105 is formed in a curved shape that is depressed toward the SiC chip 2. The inclined portion of the gate trench 105 may be formed in a shape curved toward the gate trench 105. The inclined portion of the gate trench 105 relaxes concentration of electric field with respect to the opening edge portion of the gate trench 105.

The gate insulating layer 106 includes at least one type of material among silicon oxide, silicon nitride, aluminum oxide, zirconium oxide, and tantalum oxide. The gate insulating layer 106 may have a laminated structure in which a silicon oxide layer and a silicon nitride layer are laminated in any order. The gate insulating layer 106 may have a single layer structure constituted of a silicon oxide layer or a silicon nitride layer. In this embodiment, the gate insulating layer 106 has a single layer structure constituted of a silicon oxide layer.

The gate insulating layer 106 is formed as a film along the inner walls of each gate trench 105 and demarcates a recess space inside the gate trench 105. The gate insulating layer 106 includes a first region 108, a second region 109, and a third region 110. The first region 108 is formed along the side walls of the gate trench 105. The second region 109 is formed along the bottom wall of the gate trench 105. The third region 110 partially covers the first main surface 3 via the opening edge portion of the gate trench 105.

A thickness of the first region 108 may be not less than 0.01 µm and not more than 0.2 µm. A thickness of the second region 109 may be not less than 0.05 µm and not more than 0.5 µm. The thickness of the second region 109 may exceed the thickness of the first region 108. A thickness of the third region 110 may be not less than 0.05 µm and not more than 0.5 µm. The thickness of the third region 110 may exceed the thickness of the first region 108.

The gate insulating layer 106 includes a bulging portion 111 bulging toward an interior of the gate trench 105 at the opening edge portion. The bulging portion 111 is formed at a connecting portion of the first region 108 and the third region 110 of the gate insulating layer 106. The bulging portion 111 is formed in a shape curved toward the inner side of the gate trench 105. The bulging portion 111 narrows an opening of the gate trench 105 at the opening edge portion. A gate insulating layer 106 not having the bulging portion 111 may be formed instead. A gate insulating layer 106 having a uniform thickness may be formed instead.

Each gate electrode 107 is embedded in the gate trench 105 across the gate insulating layer 106. Specifically, the gate electrode 107 is embedded in the recess space demarcated by the gate insulating layer 106 inside the gate trench 105. The gate electrode 107 has an electrode surface that is exposed from the opening of the gate trench 105. The electrode surface of the gate electrode 107 is formed in a curved shape that is depressed toward the bottom wall of the gate trench 105. The electrode surface of the gate electrode 107 is narrowed by the bulging portion 111 of the gate insulating layer 106.

The gate electrode 107 is constituted of a conductive material other than a metal material. The gate electrode 107 is preferably constituted of a conductive polysilicon. In this embodiment, the gate electrode 107 includes a p-type polysilicon doped with a p-type impurity.

A p-type impurity concentration of the gate electrode 107 may be not less than $1.0 \times 10^{18}$ cm$^{-3}$ and not more than $1.0 \times 10^{22}$ cm$^{-3}$. The p-type impurity of the gate electrode 107 may include at least one among boron, aluminum, indium, and gallium. A sheet resistance of the gate electrode 107 may be not less than 10Ω/□ and not more than 500Ω/□ (approximately 200Ω/□ in this embodiment). A thickness of the gate electrode 107 may be not less than 0.5 µm and not more than 3 µm.

The semiconductor device 101 includes a first low resistance layer 112 that covers the gate electrodes 107. The first low resistance layer 112 covers the gate electrodes 107 inside the gate trenches 105. The first low resistance layer 112 forms a portion of each trench gate structure 104.

The first low resistance layer 112 includes a conductive material having a sheet resistance less than the sheet resistance of the gate electrodes 107. The sheet resistance of the first low resistance layer 112 may be not less than 0.01Ω/□ and not more than 10Ω/□. A thickness of the first low resistance layer 112 may be not less than 0.01 µm and not more than 3 µm. The thickness of the first low resistance layer 112 is preferably less than the thickness of the gate electrodes 107.

Specifically, the first low resistance layer 112 includes a polycide layer. The polycide layer is formed by siliciding surface layer portion of the gate electrode 107 by a metal material. That is, the electrode surfaces of the gate electrodes 107 are formed by the first low resistance layer 112. Specifically, the polycide layer is constituted of a p-type polycide layer that includes the p-type impurity doped in the gate electrodes 107. The polycide layer preferably has a specific resistance of not less than 10 μΩ·cm and not more than 110 μΩ·cm.

A sheet resistance inside the gate trenches 105 embedded with the gate electrodes 107 and the first low resistance layer 112 is less than the sheet resistance of the gate electrodes 107 alone. The sheet resistance inside the gate trenches 105 is preferably not more than a sheet resistance of an n-type polysilicon doped with an n-type impurity. The sheet resistance inside the gate trenches 105 is approximated by the sheet resistance of the first low resistance layer 112. The sheet resistance inside the gate trenches 105 may be not less than 0.01Ω/☐ and not more than 10Ω/☐. The sheet resistance inside the gate trenches 105 is preferably less than 10 Ω/☐.

The first low resistance layer 112 may include at least one among TiSi, TiSi$_2$, NiSi, CoSi, CoSi$_2$, MoSi$_2$, and WSi$_2$. Among these types of materials, NiSi, CoSi$_2$, and TiSi$_2$ are especially suitable as the polycide layer that forms the first low resistance layer 112 due to being comparatively low in specific resistance value and temperature dependence. The first low resistance layer 112 is most preferably constituted of CoSi$_2$ that has a property of being low in diffusion to other regions.

The first low resistance layer 112 includes contact portion in contact with the gate insulating layer 106. Specifically, the contact portion of the first low resistance layer 112 contacts the third region 110 (bulging portions 111) of the gate insulating layer 106. A current path between the first low resistance layer 112 and the SiC epitaxial layer 7 can thereby be suppressed. In particular, a design where the contact portion of the first low resistance layer 112 is connected to the comparatively thick corner portion of the gate insulating layer 106 is effective for reducing a risk of forming a current path.

By embedding a p-type polysilicon, which has a work function differing from an n-type polysilicon, in the gate trenches 105, a gate threshold voltage Vth can be increased by approximately 1 V. However, a p-type polysilicon has a sheet resistance of several tens of times (approximately 20 times) higher than a sheet resistance of an n-type polysilicon. Therefore, if a p-type polysilicon is adopted as a material of the gate electrodes 107, energy loss increases in accompaniment with increase in parasitic resistance inside the gate trenches 105 (referred to hereinafter simply as "gate resistance").

Thus, with the semiconductor device 101, the first low resistance layer 112 (p-type polycide) is formed on the gate electrodes 107 (p-type polysilicon). By the first low resistance layer 112, the sheet resistance inside the gate trenches 105 can be reduced while allowing increase in the gate threshold voltage Vth.

For example, with the structure having the first low resistance layer 112, the sheet resistance can be decreased to not more than 1/100th in comparison to a structure not having the first low resistance layer 112. Also, with the structure having the first low resistance layer 112, the sheet resistance can be decreased to not more than 1/5th in comparison to the gate electrodes 107 that contain the n-type polysilicon.

The gate resistance can thereby be reduced and therefore, a current can be diffused efficiently along the trench gate structures 104. That is, the first low resistance layer 112 is formed as a current diffusion layer that diffuses the current inside the gate trenches 105. In particular, although time is required for transmission of current in a case where the gate trenches 105 have a length of the millimeter order (a length not less than 1 mm), switching delay can be suppressed appropriately by the first low resistance layer 112.

Also, with the structure having the first low resistance layer 112, the p-type impurity concentration inside the SiC epitaxial layer 7 does not have to be increased to increase the gate threshold voltage Vth. The gate threshold voltage Vth can thus be increased appropriately while suppressing increase in channel resistance.

The semiconductor device 101 includes a plurality of trench source structures 121 respectively formed in regions between adjacent ones of the plurality of trench gate structures 104. The plurality of trench source structures 121 are formed at intervals in the second direction Y in a mode of sandwiching a single trench gate structure 104.

The plurality of trench source structures 121 are each formed as a band extending along the first direction X. The plurality of trench source structures 121 are formed as stripes extending along the first direction X in plan view.

A pitch PS between central portions of trench source structures 121 that are adjacent in the second direction Y may be not less than 1 μm and not more than 5 μm. The pitch PS may be not less than 1 μm and not more than 2 μm, not less than 2 μm and not more than 3 μm, not less than 3 μm and not more than 4 μm, or not less than 4 μm and not more than 5 μm. The pitch PS is preferably not less than 1.5 μm and not more than 3 μm.

Each trench source structure 121 includes a source trench 122, a source insulating layer 123, and a source electrode 124. In FIG. 10, the source electrodes 124 are shown with hatching.

Each source trench 122 is formed in the SiC epitaxial layer 7. The source trench 122 includes side walls and a bottom wall. The side walls that form long sides of the source trench 122 are formed by a-planes of the SiC monocrystal. The side walls that form short sides of the source trench 122 are formed by m-planes of the SiC monocrystal.

The bottom walls of the source trenches 122 are positioned in the high concentration region 102. The bottom walls of the source trenches 122 are positioned in regions at the second main surface 4 side with respect to the bottom walls of the gate trenches 105. In regard to the normal direction Z, the bottom walls of the source trenches 122 are positioned in regions between the bottom walls of the gate trenches 105 and the low concentration region 103.

The bottom walls of the source trenches 122 are arranged along a c-plane of the SiC monocrystal. The bottom walls of the source trenches 122 have an off angle inclined in the a-axis direction with respect to the c-plane of the SiC monocrystal. The bottom walls of the source trenches 122 may be formed parallel to the first main surface 3. The bottom walls of the source trenches 122 may each be formed in a shape curved toward the second main surface 4.

The source trenches 122 have a second depth D2 that exceeds the first depth D1 of the gate trenches 105. Under a condition that the source trenches 122 are positioned inside the high concentration region 102, a ratio DS/DG of the second depth D2 with respect to the first depth D1 may be not less than 1.5. The ratio DS/DG is preferably not less than 2.

The second depth D2 may be not less than 0.5 µm and not more than 10 µm. The second depth D2 may be not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. Source trenches 122 that have the second depth D2 that is substantially equal to the first depth D1 may be formed.

Each source trench 122 includes a first trench portion 125 and a second trench portion 126. The first trench portion 125 is formed at an opening side of the source trench 122. The first trench portion 125 has a first width W1 in regard to the second direction Y. The first trench portion 125 may be formed in a tapered shape with which the first width W1 narrows toward the bottom wall side from the first main surface 3.

The first trench portions 125 are preferably formed in regions at the first main surface 3 side with respect to the bottom walls of the gate trenches 105. That is, a depth of the first trench portions 125 is preferably less than the first depth D1 of the gate trenches 105. The first trench portions 125 that traverse the bottom walls of the gate trenches 105 may be formed. That is, the depth of the first trench portions 125 may exceed the first depth D1 of the gate trenches 105.

The depth of the first trench portions 125 may be not less than 0.1 µm and not more than 2 µm. The depth of the first trench portions 125 may be not less than 0.1 µm and not more than 0.5 µm, not less than 0.5 µm and not more than 1 µm, not less than 1 µm and not more than 1.5 µm, or not less than 1.5 µm and not more than 2 µm.

The first width W1 of the first trench portions 125 may be not less than the width of the gate trenches 105 or may be less than the width of the gate trenches 105. The first width W1 preferably exceeds the width of the gate trenches 105. The first width W1 may be not less than 0.1 µm and not more than 2 µm. The first width W1 may be not less than 0.1 µm and not more than 0.5 µm, not less than 0.5 µm and not more than 1 µm, not less than 1 µm and not more than 1.5 µm, or not less than 1.5 µm and not more than 2 µm.

The second trench portions 126 are formed at the bottom wall sides of the source trenches 122. In regard to the normal direction Z, the second trench portions 126 are formed in regions between the first trench portions 125 and a bottom portion of the SiC epitaxial layer 7 and traverse the bottom walls of the gate trenches 105. In regard to the normal direction Z, a depth of the second trench portions 126 based on the first trench portions 125 preferably exceeds the first depth D1 of the gate trenches 105.

In regard to the second direction Y, the second trench portions 126 have a second width W2 that is less than the first width W1. Under a condition of being less than the first width W1, the second width W2 may be not less than the width of the gate trenches 105 or may be less than the width of the gate trenches 105.

The second width W2 may be not less than 0.1 µm and less than 2 µm. The second width W2 may be not less than 0.1 µm and less than 2 µm. The second width W2 may be not less than 0.1 µm and not more than 0.5 µm, not less than 0.5 µm and not more than 1 µm, not less than 1 µm and not more than 1.5 µm, or not less than 1.5 µm and less than 2 µm. Obviously, second trench portions 126 having the second width W2 that is substantially equal to the first width W1 may be formed.

An overall opening width of the source trenches 122 is preferably formed to be approximately equal to the opening width of the gate trenches 105. That the opening width of the source trenches 122 is approximately equal to the opening width of the gate trenches 105 signifies that the opening width of the source trenches 122 falls within a range of ±20% of the opening width of the gate trenches 105.

Side walls of each second trench portion 126 may extend along the normal direction Z. Angles that the side walls of the second trench portion 126 form with respect to the first main surface 3 inside the SiC chip 2 may be not less than 90° and be not more than 95° (for example, not less than 91° and not more than 93°). The side walls of the second trench portion 126 may be formed substantially perpendicular to the first main surface 3. The second trench portion 126 may be formed in a tapered shape with which the second width W2 narrows toward the bottom wall side from the first trench portion 125.

Each source insulating layer 123 includes at least one among silicon oxide, silicon nitride, aluminum oxide, zirconium oxide, and tantalum oxide. The source insulating layer 123 may have a laminated structure in which a silicon oxide layer and a silicon nitride layer are laminated in any order. The source insulating layer 123 may have a single layer structure constituted of a silicon oxide layer or a silicon nitride layer. In this embodiment, the source insulating layer 123 has a single layer structure constituted of a silicon oxide layer.

The source insulating layer 123 is formed as a film along the inner walls of the source trench 122 and demarcates a recess space inside the source trench 122. Specifically, the source insulating layer 123 is formed as a film along the inner walls of the source trench 122 such as to expose the first trench portion 125 and cover the second trench portion 126.

The source insulating layer 123 thereby demarcates the recess space inside the second trench portion 126. The source insulating layer 123 has a side wall window portion 127 that exposes the first trench portion 125.

The source insulating layer 123 includes a first region 128 and a second region 129. The first region 128 is formed along the side walls of the source trench 122. The second region 129 is formed along the bottom wall of the source trench 122. A thickness of the first region 128 is less than a thickness of the second region 129. The thickness of the first region 128 may be not less than 0.01 µm and not more than 0.2 µm. The thickness of the second region 129 may be not less than 0.05 µm and not more than 0.5 µm.

The thickness of the first regions 128 may be substantially equal to the thickness of the first regions 128 of the gate insulating layers 106. The thickness of the second regions 129 may be substantially equal to the thickness of the second regions 129 of the gate insulating layers 106. Source insulating layers 123 each having a uniform thickness may be formed instead.

Each source electrode 124 is embedded in the source trench 122 across the source insulating layer 123. Specifically, the source electrode 124 is embedded in the first trench portion 125 and the second trench portion 126 across the source insulating layer 123.

The source electrode 124 is embedded in the recess space demarcated by the second trench portion 126 at the bottom wall side of the source trench 122. The source electrode 124 has a side wall contact portion 130 that contacts the side walls of the first trench portion 125 that are exposed from the side wall window portion 127 at the opening side of the source trench 122.

The source electrode 124 has an electrode surface that is exposed from an opening of the source trench 122. The electrode surface of the source electrode 124 is formed in a curved shape that is depressed toward the bottom wall of the source trench 122. The electrode surface of the source electrode 124 may be formed parallel to the first main surface 3 instead.

In regard to the normal direction Z, a thickness of the source electrode 124 may be not less than 0.5 µm and not more than 10 µm. The thickness of the source electrode 124 may be not less than 0.5 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm.

The source electrode 124 is constituted of a conductive material other than a metal material. The source electrode 124 is preferably constituted of a conductive polysilicon. In this embodiment, the source electrode 124 includes a p-type polysilicon doped with a p-type impurity.

A p-type impurity concentration of the source electrode 124 may be not less than $1.0 \times 10^{18}$ cm$^{-3}$ and not more than $1.0 \times 10^{22}$ cm$^{-3}$. The p-type impurity concentration of the source electrode 124 is preferably equal to the p-type impurity concentration of the gate electrode 107. The p-type impurity of the source electrode 124 may include at least one among boron, aluminum, indium, and gallium.

The semiconductor device 101 includes a second low resistance layer 131 that covers the source electrodes 124. The second low resistance layer 131 covers the source electrodes 124 inside the source trenches 122. The second low resistance layer 131 forms a portion of each trench source structure 121. The second low resistance layer 131 has the same structure as the first low resistance layer 112. Description of the first low resistance layer 112 applies to the description of the second low resistance layer 131.

The semiconductor device 101 includes a body region 141 of the p-type formed in a surface layer portion of the first main surface 3 in the active region 8. The body region 141 defines the active region 8. A p-type impurity concentration of the body region 141 is less than the p-type impurity concentrations of the gate electrodes 107 and the source electrodes 124. A peak value of the p-type impurity concentration of the body region 141 may be not less than $1.0 \times 10^{17}$ cm$^{-3}$ and not more than $1.0 \times 10^{19}$ cm$^{-3}$.

In the surface layer portion of the first main surface 3, the body region 141 covers the side walls of the gate trenches 105 and the side walls of the source trenches 122. The body region 141 is formed in a region at the first main surface 3 side with respect to the bottom walls of the gate trenches 105. The body region 141 opposes the gate electrodes 107 across the gate insulating layer 106.

The body region 141 is formed in a region at the first trench portion 125 side with respect to the second trench portions 126. The body region 141 covers the first trench portions 125. The body region 141 is connected to the side wall contact portions 130 of the source electrodes 124 that are exposed from the first trench portions 125. The body region 141 is thereby source-grounded inside the SiC chip 2. The body region 141 may cover a portion of each second trench portion 126. In this case, the body region 141 may oppose each source electrode 124 across a portion of the source insulating layer 123.

The semiconductor device 101 includes a source region 142 of the n$^+$-type formed in a surface layer portion of the body region 141. The source region 142 is formed along the gate trenches 105. A peak value of an n-type impurity concentration of the source region 142 exceeds a peak value of the n-type impurity concentration of the high concentration region 102. The peak value of the n-type impurity concentration of the source region 142 may be not less than $1.0 \times 10^{18}$ cm$^{-3}$ and not more than $1.0 \times 10^{21}$ cm$^{-3}$.

The source region 142 covers the side walls of the gate trenches 105 and the side walls of the source trenches 122 in the surface layer portion of the body region 141. The source region 142 opposes the gate electrodes 107 across the gate insulating layers 106. The source region 142 preferably opposes the first low resistance layer 112 across the gate insulating layers 106.

Further, the source region 142 is formed in a region at the first trench portion 125 side with respect to the second trench portions 126. The source region 142 covers the first trench portions 125. The source region 142 is connected to the side wall contact portions 130 of the source electrodes 124 that are exposed from the first trench portions 125. The source region 142 is thereby source-grounded inside the SiC chip 2.

In this embodiment, the source region 142 has hidden portions hidden by the third regions 110 of the gate insulating layers 106 in the first main surface 3 and exposed portions exposed from the third regions 110. An entire area of the source region 142 may be covered by the third regions 110.

A portion of the source region 142 that is oriented along the side wall of the gate trench 105 define a channel of the MISFET with the high concentration region 102 inside the body region 141. ON/OFF of the channels is controlled by the gate electrodes 107.

The semiconductor device 101 includes a plurality of contact regions 143 of the p$^+$ type formed in the surface layer portion of the first main surface 3 in the active region 8. A peak value of a p-type impurity concentration of each contact region 143 exceeds the p-type impurity concentration of the body region 141. The peak value of the p-type impurity concentration of each contact region 143 may be not less than $1.0 \times 10^{18}$ cm$^{-3}$ and not more than $1.0 \times 10^{21}$ cm$^{-3}$.

The plurality of contact regions 143 are each formed in regions along the plurality of source trenches 122. Specifically, a plurality of contact regions 143 are each formed in a multiple-to-one relationship with respect to a corresponding single source trench 122. The plurality of contact regions 143 are formed at intervals along the corresponding source trench 122. The plurality of contact regions 143 are each formed at intervals from the gate trenches 105.

Each contact region 143 covers the corresponding first trench portion 125. Each contact region 143 is interposed, in the corresponding first trench portion 125, between the side wall contact portion 130 of the source electrode 124 and the source region 142. Each contact region 143 is further interposed, in the corresponding first trench portion 125, between the side wall contact portion 130 of the source electrode 124 and the body region 141.

Each contact region 143 is thereby electrically connected to the source electrode 124, the body region 141, and the source region 142. Each contact region 143 is source-grounded inside the SiC chip 2.

A portion of each contact region 143 that cover the first trench portion 125 is led out toward the gate trench 105. The portion of each contact region 143 that covers the first trench portion 125 is formed in a region at the first main surface 3 side with respect to a bottom portion of the body region 141. The portion of each contact region 143 that covers the first trench portion 125 may extend to an intermediate region between the gate trenches 105 and the source trench 122.

Each contact region 143 further covers the corresponding second trench portion 126. Each contact region 143 opposes the source electrode 124 across the source insulating layer 123 in the corresponding second trench portion 126.

Each contact region 143 further covers the bottom wall of the corresponding source trench 122. Each contact region 143 opposes the source electrode 124 across the bottom wall of the corresponding source trench 122. A bottom portion of each contact region 143 may be formed parallel to the bottom wall of the corresponding source trench 122.

The semiconductor device 101 includes a plurality of deep well regions 144 of the p-type that are formed in the surface layer portion of the first main surface 3 in the active region 8. A peak value of a p-type impurity concentration of each deep well region 144 is less than the peak value of the p-type impurity concentration of the contact regions 143.

The peak value of the p-type impurity concentration of each deep well region 144 may be not less than the peak value of the p-type impurity concentration of the body region 141 or may be less than the peak value of the p-type impurity concentration of the body region 141. The peak value of the p-type impurity concentration of each deep well region 144 may be not less than $1.0 \times 10^{17}$ cm$^{-3}$ and not more than $1.0 \times 10^{19}$ cm$^{-3}$.

The plurality of deep well regions 144 are formed in plurality in a relationship of one-to-one correspondence with respect to the plurality of source trenches 122. Each deep well region 144 is formed as a band extending along the corresponding source trench 122 in plan view. Each deep well region 144 is formed in the high concentration region 102. Each deep well region 144 is formed in a region at the second main surface 4 side with respect to the body region 141. Each deep well region 144 is continuous to the body region 141.

Each deep well region 144 includes a portion covering the corresponding second trench portion 126. Each deep well region 144 includes a portion covering the corresponding second trench portion 126 across the contact regions 143. Each deep well region 144 further includes a portion covering the bottom wall of the corresponding source trench 122. Each deep well region 144 includes a portion covering the bottom wall of the corresponding source trench 122 across the contact regions 143.

Each deep well region 144 has a bottom portion positioned at the second main surface 4 side with respect to the bottom walls of the gate trenches 105. The bottom portion of each deep well region 144 may be formed parallel to the bottom wall of each source trench 122. The plurality of deep well regions 144 are preferably formed to be of constant depth.

Each deep well region 144 forms a pn-junction portion with the high concentration region 102. From the pn-junction portions, depletion layers spread toward the gate trenches 105. The depletion layers may overlap with the bottom walls of the gate trenches 105.

With the semiconductor device 101 that includes just a pn-junction diode, due to the structure of not including trenches, a problem of concentration of electric field inside the SiC chip 2 does not occur frequently. The respective deep well regions 144 make the trench gate type MISFET approach the structure of a pn-junction diode. The electric field inside the SiC chip 2 can thereby be relaxed in the trench gate type MISFET.

With the deep well regions 144 having the bottom portions at the second main surface 4 side with respect to the bottom walls of the gate trenches 105, concentration of electric field with respect to the gate trenches 105 can be relaxed appropriately by the depletion layers. Narrowing a pitch PS between the plurality of source trenches 122 (deep well regions 144) is effective in terms of relaxing the concentration of electric field and improving a withstand voltage.

The plurality of deep well regions 144 are preferably formed to be of constant depth. The withstand voltage (for example, an electrostatic breakdown strength) of the SiC chip 2 can thereby be suppressed from being restricted by the respective deep well regions 144 and therefore, improvement of the withstand voltage can be achieved appropriately.

By using the source trenches 122, the deep well regions 144 can be formed appropriately in comparatively deep regions of the SiC chip 2. Also, the deep well regions 144 can be formed along the source trenches 122 and therefore occurrence of variation in the depth of the plurality of deep well regions 144 can be suppressed appropriately.

In this embodiment, portions of the high concentration region 102 are interposed between the plurality of deep well regions 144. A JFET (junction field effect transistor) resistance can thereby be reduced in the regions between the plurality of deep well regions 144.

In this embodiment, the bottom portions of the respective deep well regions 144 are positioned in the high concentration region 102. Current paths can thereby be formed in lateral directions parallel to the first main surface 3 in regions of the high concentration region 102 directly below the respective deep well regions 144. Consequently, current spreading resistance can be reduced. The low concentration region 103 increases the withstand voltage of the SiC chip 2 in such a structure.

The main surface insulating layer 12 covers an entire area of the first main surface 3. The main surface insulating layer 12 covers the source region 142 and the contact regions 143 in the active region 8. Specifically, the main surface insulating layer 12 covers the entire area of the source region 142 and entire areas of the contact regions 143 in a sectional view taken along the second direction Y in the active region 8. The main surface insulating layer 12 covers the entire area of the source region 142 and entire areas of the contact regions 143 in plan view.

More specifically, the main surface insulating layer 12 traverses the first trench portions 125 and covers the source electrodes 124 in the active region 8. The main surface insulating layer 12 covers the side wall contact portions 130 of the source electrodes 124 on the first main surface 3.

The main surface insulating layer 12 has a plurality of contact openings 151 that respectively expose the plurality of source electrodes 124 in the active region 8. The plurality of contact openings 151 are formed in a relationship of one-to-one correspondence with respect to the plurality of source electrodes 124. Each contact opening 151 may be formed as a band extending along the trench source structure 121. Each contact opening 151 is formed inside a region surrounded by the side walls of the source trench 122 (first trench portion 125) in plan view.

Each contact opening 151 exposes the source electrode 124 at intervals toward the inside of the source trench 122 from the side walls of the source trench 122 (first trench portion 125). The contact opening 151 exposes just the source electrode 124. An opening edge portion of the contact opening 151 is formed in a shape curving into the contact opening 151.

A recess 152 that is depressed toward the bottom wall of the source trench 122 is formed on the electrode surface of the source electrode 124. The recess 152 may be formed as a band that extends along the trench source structure 121.

The recess 152 is formed inside a region surrounded by the side walls of the source trench 122 (first trench portion 125) in plan view.

The recess 152 is formed at intervals toward the inside of the source trench 122 from the side walls of the source trench 122 (first trench portion 125). The recess 152 exposes the second low resistance layer 131. The recess 152 may penetrate through the second low resistance layer 131. The contact opening 151 is in communication with the recess 152 of the source electrode 124.

The peripheral edge of the main surface insulating layer 12 is exposed from the side surfaces 5A to 5D. In this embodiment, the peripheral edge of the main surface insulating layer 12 is continuous to the side surfaces 5A to 5D. The peripheral edge of the main surface insulating layer 12 may be formed at intervals inward from the side surfaces 5A to 5D. In this case, the main surface insulating layer 12 exposes a portion of the first main surface 3 positioned in the outer region 9.

The thickness of the main surface insulating layer 12 may be not less than 0.1 µm and not more than 10 µm. The thickness of the main surface insulating layer 12 may be not less than 0.1 µm and not more than 1 µm, not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. The thickness of the main surface insulating layer 12 is preferably not less than 0.5 µm and not more than 5 µm.

The first main surface electrodes 21 are formed on the main surface insulating layer 12. The thickness T1 of the first main surface electrodes 21 may be not less than 1 µm and not more than 100 µm. The thickness T1 may be not less than 1 µm and not more than 10 µm, not less than 10 µm and not more than 20 µm, not less than 20 µm and not more than 40 µm, not less than 40 µm and not more than 60 µm, not less than 60 µm and not more than 80 µm, or not less than 80 µm and not more than 100 µm. The thickness T1 is preferably not less than 20 µm and not more than 60 µm.

The first main surface electrodes 21 include a gate main surface electrode 153, a gate wiring electrode 154, and a source main surface electrode 155. A gate voltage is applied to the gate main surface electrode 153 (gate wiring electrode 154). The gate voltage may be not less than 10 V and not more than 50 V (for example, approximately 30 V). A source voltage is applied to the source main surface electrode 155. The source voltage may be a reference voltage (for example, a GND voltage).

The gate main surface electrode 153 is formed in the active region 8. The gate main surface electrode 153 is formed in a region at the first side surface 5A side in plan view. Specifically, the gate main surface electrode 153 is formed in a central portion of the first side surface 5A in plan view. The gate main surface electrode 153 may be formed at a corner portion connecting any two of the side surfaces 5A to 5D in plan view. The gate main surface electrode 153 may be formed in a quadrilateral shape in plan view.

The gate wiring electrode 154 is led out from the gate main surface electrode 153 and extends as a band along a peripheral edge of the active region 8. In this embodiment, the gate wiring electrode 154 is formed along the first side surface 5A, the third side surface 5C, and the fourth side surface 5D such as to demarcate an inner side of the active region 8 from three directions. The gate wiring electrode 154 is electrically connected via the main surface insulating layer 12 to the gate electrodes 107. An electric signal from the gate main surface electrode 153 is transmitted to the gate electrodes 107 via the gate wiring electrode 154.

The source main surface electrode 155 is formed in the active region 8 at intervals from the gate main surface electrode 153 and the gate wiring electrode 154. The source main surface electrode 155 covers a region demarcated by the gate main surface electrode 153 and the gate wiring electrode 154 and is formed in a C shape in plan view.

The source main surface electrode 155 is electrically connected to the source electrodes 124 via the contact openings 151. That is, in this embodiment, the source main surface electrode 155 that is constituted of a metal material is electrically connected to the source electrodes 124 that are constituted of the conductive polysilicon.

Each of the first main surface electrodes 21 (the gate main surface electrode 153, the gate wiring electrode 154, and the source main surface electrode 155) has the laminated structure that includes the barrier electrode 22 and the principal electrode 23 laminated in that order from the SiC chip 2 side.

In this embodiment, the barrier electrode 22 includes at least one among a Ti layer and a TiN layer. The barrier electrode 22 preferably has a laminated structure that includes a Ti layer and a TiN layer that are laminated in that order from the SiC chip 2 side. The barrier electrode 22 may have a single layer structure constituted of a Ti layer or a TiN layer.

The thickness of the barrier electrode 22 may be not less than 0.01 µm and not more than 1 µm. The thickness of the barrier electrode 22 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

The principal electrode 23 is formed as a film on the barrier electrode 22. The principal electrode 23 covers the entire area of the main surface of the barrier electrode 22. The principal electrode 23 has a resistance value less than a resistance value of the barrier electrode 22. The principal electrode 23 is constituted of an Al-based metal layer. Specifically, the principal electrode 23 includes at least one among a pure Al layer, an AlSi alloy layer, an AlCu alloy layer, and an AlSiCu alloy layer.

The principal electrode 23 may have a laminated structure in which two or more among a pure Al layer, an AlSi alloy layer, an AlCu alloy layer, and an AlSiCu alloy layer are laminated in any order. The principal electrode 23 may have a single layer structure constituted of a pure Al layer, an AlSi alloy layer, an AlCu alloy layer, or an AlSiCu alloy layer. The principal electrode 23 preferably has a single layer structure constituted of an AlSi alloy layer, an AlCu alloy layer, or an AlSiCu alloy layer.

The thickness of the principal electrode 23 exceeds the thickness of the barrier electrode 22. The thickness of the principal electrode 23 may be not less than 10 µm and not more than 100 µm. The thickness of the principal electrode 23 may be not less than 10 µm and not more than 20 µm, not less than 20 µm and not more than 40 µm, not less than 40 µm and not more than 60 µm, not less than 60 µm and not more than 80 µm, or not less than 80 µm and not more than 100 µm. The thickness of the principal electrode 23 is preferably not less than 20 µm and not more than 60 µm. Since the thickness of the barrier electrode 22 is extremely small in comparison to the thickness of the principal electrode 23, the thickness T1 of each first main surface electrode 21 is approximated by the thickness of the principal electrode 23.

The insulating layer 24 covers the first main surface electrode 21 on the first main surface 3. In FIG. 9, the insulating layer 24 is shown with hatching. Specifically, the insulating layer 24 is formed on the main surface insulating layer 12. The peripheral edge of the insulating layer 24 is formed at intervals inward from the side surfaces 5A to 5D. The insulating layer 24 thereby exposes the peripheral edge portion of the main surface insulating layer 12.

The peripheral edge of the insulating layer 24 demarcates a dicing street 25 with the side surfaces 5A to 5D. By the dicing street 25, it is made unnecessary to physically cut the insulating layer 24 when cutting out the semiconductor device 101 from a wafer. The semiconductor device 101 can thereby be cut out smoothly from the wafer and, at the same time, peeling and degradation of the insulating layer 24 can be suppressed. Consequently, protection objects, such as the SiC chip 2, the first main surface electrodes 21, etc., can be protected appropriately by the insulating layer 24.

The width of the dicing street 25 may be not less than 1 μm and not more than 25 μm. The width of the dicing street 25 is a width in a direction orthogonal to a direction in which the dicing street 25 extends. The width of the dicing street 25 may be not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

The insulating layer 24 has pad openings 26 that expose the first main surface electrodes 21. In this embodiment, the pad openings 26 include a gate pad opening 161 that exposes the gate main surface electrode 153 and a source pad opening 162 that exposes the source main surface electrode 155. The gate pad opening 161 may be formed in a polygonal shape having four sides that are parallel to the side surfaces 5A to 5D in plan view. The source pad opening 162 may be formed in a polygonal shape having four sides that are parallel to the side surfaces 5A to 5D in plan view. A planar shape of the gate pad opening 161 and a planar shape of the source pad opening 162 are arbitrary.

Specifically, the insulating layer 24 has the laminated structure that includes the inorganic insulating layer 30 and the organic insulating layer 31 laminated in that order from the SiC chip 2 side. The inorganic insulating layer 30 is formed as a film along the main surface insulating layer 12, the gate main surface electrode 153, and the source main surface electrode 155. The inorganic insulating layer 30 includes a first gate inner wall 163, a first source inner wall 164, and a first outer wall 165. In the following, the first gate inner wall 163, the first source inner wall 164, and the first outer wall 165 may be referred to collectively as first wall surfaces.

The first gate inner wall 163 demarcates a first gate opening 166 that exposes a portion of the gate main surface electrode 153. The first gate opening 166 forms a portion of the gate pad opening 161. The first gate opening 166 has a planar shape similar to a planar shape of the gate main surface electrode 153 and exposes an inner portion of the gate main surface electrode 153. The planar shape of the first gate opening 166 is arbitrary. The first gate opening 166 may be demarcated in a polygonal shape having four sides parallel to the side surfaces 5A to 5D in plan view.

The first source inner wall 164 demarcates a first source opening 167 that exposes a portion of the source main surface electrode 155. The first source opening 167 forms a portion of the source pad opening 162. The first source opening 167 has a planar shape similar to a planar shape of the source main surface electrode 155 and exposes an inner portion of the source main surface electrode 155. The planar shape of the first source opening 167 is arbitrary. The first source opening 167 may be demarcated in a polygonal shape having four sides parallel to the side surfaces 5A to 5D in plan view.

The first outer wall 165 of the inorganic insulating layer 30 is formed at intervals inward from the side surfaces 5A to 5D and demarcates a portion of the dicing street 25 with the side surfaces 5A to 5D. The inorganic insulating layer 30 thereby exposes the peripheral edge portion of the main surface insulating layer 12. The first outer wall 165 may be formed in a quadrilateral shape having four sides parallel to the side surfaces 5A to 5D in plan view.

Angles that the first wall surfaces of the inorganic insulating layer 30 form inside the inorganic insulating layer 30 with the main surfaces of the corresponding first main surface electrodes 21 may be not less than 30° and not more than 90°. The angles that the first wall surfaces form inside the inorganic insulating layer 30 with the main surfaces of the corresponding first main surface electrodes 21 are preferably not less than 45° and less than 90°. The angle of each first wall surface is defined by an angle that a straight line joining a lower end portion and an upper end portion of the first wall surface forms with the main surface of the corresponding first main surface electrode 21.

The inorganic insulating layer 30 has the property of being high in adhesion to Ni. The inorganic insulating layer 30 includes at least one among a silicon oxide layer and a silicon nitride layer. The inorganic insulating layer 30 may have a laminated structure that includes a silicon oxide layer and a silicon nitride layer laminated in that order from the SiC chip 2 side. The inorganic insulating layer 30 may have a single layer structure constituted of a silicon oxide layer or a silicon nitride layer. The inorganic insulating layer 30 preferably includes an insulating material differing from the main surface insulating layer 12. In this embodiment, the inorganic insulating layer 30 has a single layer structure constituted of a silicon nitride layer.

The thickness T2 of the inorganic insulating layer 30 is preferably less than the thickness T1 of the first main surface electrode 21 (T2<T1). The thickness T2 may be not less than 0.1 μm and not more than 10 μm. The thickness T2 may be not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness T2 is preferably not less than 1 μm and not more than 5 μm. The thickness T2 is especially preferably not less than 1 μm and not more than 2 μm.

The organic insulating layer 31 is formed as a film on the inorganic insulating layer 30. The organic insulating layer 31 includes a second gate inner wall 168, a second source inner wall 169, and a second outer wall 170. In the following, the second gate inner wall 168, the second source inner wall 169, and the second outer wall 170 may be referred to collectively as second wall surfaces.

Referring to FIG. 13, in this embodiment, the second gate inner wall 168 is formed in a curved shape that is depressed toward the inorganic insulating layer 30 side. The second gate inner wall 168 demarcates a second gate opening 171 that exposes a portion of the gate main surface electrode 153. The second gate opening 171 has a planar shape similar to the planar shape of the gate main surface electrode 153 and exposes the inner portion of the gate main surface electrode 153. The planar shape of the second gate opening 171 is arbitrary. The second gate opening 171 may be demarcated in a polygonal shape having four sides parallel to the side surfaces 5A to 5D in plan view.

The second gate opening 171 is in communication with the first gate opening 166 of the inorganic insulating layer 30 and forms the gate pad opening 161 with the first gate opening 166. The second gate opening 171 surrounds the first gate opening 166 at an interval from the first gate opening 166 and exposes a portion of the inorganic insulating layer 30. Specifically, the organic insulating layer 31 exposes a portion of the main surface of the inorganic insulating layer 30 as gate inner peripheral edge 172 in a region between the first gate opening 166 and the second gate opening 171.

A width WG of the gate inner peripheral edge 172 may exceed 0 μm and be not more than 10 μm. The width WG may exceed 0 μm and be not more than 1 μm or be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The width WG is preferably not less than 1 μm and not more than 5 μm. Although the width WG is arbitrary, it is preferably not more than the thickness T2 of the inorganic insulating layer 30 (WG≤T2). The width WG is especially preferably not less than 1 μm and not more than 2 μm.

Referring to FIG. 14, in this embodiment, the second source inner wall 169 is formed in a curved shape that is depressed toward the inorganic insulating layer 30 side. The second source inner wall 169 demarcates a second source opening 173 that exposes a portion of the source main surface electrode 155. The second source opening 173 has a planar shape similar to the planar shape of the source main surface electrode 155 and exposes the inner portion of the source main surface electrode 155. The planar shape of the second source opening 173 is arbitrary. The second source opening 173 may be demarcated in a polygonal shape having four sides parallel to the side surfaces 5A to 5D in plan view.

The second source opening 173 is in communication with the first source opening 167 of the inorganic insulating layer 30 and forms the source pad opening 162 with the first source opening 167. The second source opening 173 surrounds the first source opening 167 at an interval from the first source opening 167 and exposes a portion of the inorganic insulating layer 30. Specifically, the organic insulating layer 31 exposes a portion of the main surface of the inorganic insulating layer 30 as source inner peripheral edge 174 in a region between the first source opening 167 and the second source opening 173.

A width WS of the source inner peripheral edge 174 may exceed 0 μm and be not more than 10 μm. The width WS may exceed 0 μm and be not more than 1 μm or be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The width WS is preferably not less than 1 μm and not more than 5 μm. Although the width WS is arbitrary, it is preferably not more than the thickness T2 of the inorganic insulating layer 30 (WS≤T2). The width WS is especially preferably not less than 1 μm and not more than 2 μm.

In this embodiment, the second outer wall 170 of the organic insulating layer 31 is formed in a curved shape that is depressed toward the inorganic insulating layer 30 side. The second outer wall 170 is formed on the inorganic insulating layer 30 at intervals inward from the side surfaces 5A to 5D and demarcates a portion of the dicing street 25 with the side surfaces 5A to 5D. The organic insulating layer 31 thereby exposes the peripheral edge portion of the main surface insulating layer 12. The second outer wall 170 may be formed in a quadrilateral shape having four sides parallel to the side surfaces 5A to 5D in plan view.

The second outer wall 170 of the organic insulating layer 31 may traverse the first outer wall 165 of the inorganic insulating layer 30 and be formed on the main surface insulating layer 12. In this case, the dicing street 25 is demarcated by the second outer wall 170 of the organic insulating layer 31.

Angles that the second wall surfaces of the organic insulating layer 31 form inside the organic insulating layer 31 with the main surface of the inorganic insulating layer 30 may be not less than 30° and not more than 90°. The angles that the second wall surfaces form inside the organic insulating layer 31 with the main surfaces of the inorganic insulating layer 30 are preferably not less than 45° and less than 90°. The angle of each second wall surface is defined by an angle that a straight line joining a lower end portion and an upper end portion of the second wall surface forms with the main surface of the inorganic insulating layer 30.

The organic insulating layer 31 has a property of being low in adhesion to Ni in comparison to the inorganic insulating layer 30. The organic insulating layer 31 includes a photosensitive resin of a negative type or a positive type. The organic insulating layer 31 may include at least one among a polyimide, a polyamide, and a polybenzoxazole. In this embodiment, the organic insulating layer 31 includes a polyimide.

The organic insulating layer 31 preferably has the thickness T3 that exceeds the thickness T2 of the inorganic insulating layer 30 (T2<T3). The ratio T3/T2 of the thickness T3 of the organic insulating layer 31 with respect to the thickness T2 of the inorganic insulating layer 30 may exceed 1 and be not more than 10. The ratio T3/T2 may exceed 1 and be not more than 2 or be not less than 2 and not more than 4, not less than 4 and not more than 6, not less than 6 and not more than 8, or not less than 8 and not more than 10. The ratio T3/T2 is preferably not less than 2 and not more than 6.

The thickness T3 may be not less than 1 μm and not more than 50 μm. The thickness T3 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm. The thickness T3 is preferably not less than 5 μm and not more than 30 μm.

In this embodiment, the rough surface regions 39 of the first main surface electrodes 21 include a gate rough surface region 175 and a source rough surface region 176. The gate rough surface region 175 is formed on an exposed surface of the gate main surface electrode 153 that is exposed from the gate pad opening 161 (first gate opening 166 of the inorganic insulating layer 30). The gate rough surface region 175 includes a depression formed in a region directly below the first gate inner wall 163. Thereby, the first gate inner wall 163 includes a portion that overhangs above the gate rough surface region 175.

The source rough surface region 176 is formed on an exposed surface of the source main surface electrode 155 that is exposed from the source pad opening 162 (first source opening 167 of the inorganic insulating layer 30). The source rough surface region 176 includes a depression formed in a region directly below the first source inner wall 164. Thereby, the first source inner wall 164 includes a portion that overhangs above the source rough surface region 176.

In this embodiment, the pad electrodes 40 include a gate pad electrode 181 and a source pad electrode 182. The gate pad electrode 181 includes a first Ni plating layer 183 that is formed on the gate main surface electrode 153 inside the gate pad opening 161. The first Ni plating layer 183 corresponds to the Ni plating layer 41 according to the first preferred embodiment.

The first Ni plating layer 183 covers the gate main surface electrode 153 inside the first gate opening 166 and covers the gate inner peripheral edge 172 of the inorganic insulating layer 30 inside the second gate opening 171. The first Ni plating layer 183 has an outer surface that is formed at an interval toward the gate main surface electrode 153 side from the main surface of the organic insulating layer 31 (insulating layer 24). The first Ni plating layer 183 covers the organic insulating layer 31 inside the second gate opening 171.

Referring to FIG. 13, specifically, the first Ni plating layer 183 includes a first portion 183A that covers the gate main surface electrode 153 and a second portion 183B that covers the gate inner peripheral edge 172 of the inorganic insulating layer 30.

The first portion 183A of the first Ni plating layer 183 fills the gate rough surface region 175 and covers the gate main surface electrode 153 inside the first gate opening 166. The first portion 183A covers an entire area of the first gate inner wall 163 of the inorganic insulating layer 30 and protrudes from an opening end of the first gate opening 166 toward an opening end of the second gate opening 171. The first portion 183A has a first connecting portion that is connected to the first gate inner wall 163 of the inorganic insulating layer 30 and extends in a thickness direction of the inorganic insulating layer 30.

The second portion 183B of the first Ni plating layer 183 is led out from the first portion 183A toward the organic insulating layer 31 side inside the second gate opening 171. The second portion 183B is formed in an arcuate shape that is directed toward the organic insulating layer 31 with the opening end of the first gate opening 166 as a starting point.

The second portion 183B covers the gate inner peripheral edge 172 of the inorganic insulating layer 30 inside the second gate opening 171. The second portion 183B thereby opposes the gate main surface electrode 153 across the gate inner peripheral edge 172 of the inorganic insulating layer 30. The second portion 183B has a second connecting portion that is connected to the main surface of the inorganic insulating layer 30 and extends in a width direction of the inorganic insulating layer 30.

In this embodiment, the second portion 183B further covers the second gate inner wall 168 of the organic insulating layer 31 inside the second gate opening 171. The second portion 183B covers a region at the inorganic insulating layer 30 side with respect to an intermediate portion of the second gate inner wall 168 of the organic insulating layer 31. In other words, the second portion 183B covers the organic insulating layer 31 such that an exposed area of the second gate inner wall 168 (organic insulating layer 31) exceeds a hidden area of the second gate inner wall 168 (organic insulating layer 31). The first Ni plating layer 183 is thus formed such that the first portion 183A and the second portion 183B are engaged with the opening end of the first gate opening 166 from two different directions.

The first Ni plating layer 183 has a thickness T4 that exceeds the thickness T2 of the inorganic insulating layer 30 (T2<T4). The thickness T4 is less than the thickness T3 of the organic insulating layer 31 (T3<T4). The thickness T4 exceeds a value resulting from adding the width WG of the gate inner peripheral edge 172 to the thickness T2 of the inorganic insulating layer 30 (T2+WG) (T2+WG<T4). This is a condition by which the first Ni plating layer 183 contacts the second gate inner wall 168 of the organic insulating layer 31. The thickness T4 is defined by a thickness of the first Ni plating layer 183 based on the main surface of the gate main surface electrode 153.

A ratio T4/T2 of the thickness T4 of the first Ni plating layer 183 with respect to the thickness T2 of the inorganic insulating layer 30 may exceed 1 and be not more than 5. The ratio T4/T2 may exceed 1 and be not more than 2 or be not less than 2 and not more than 3, not less than 3 and not more than 4, or not less than 4 and not more than 5.

The thickness T4 may be not less than 0.1 µm and not more than 15 µm. The thickness T4 may be not less than 0.1 µm and not more than 1 µm, not less than 1 µm and not more than 3 µm, not less than 3 µm and not more than 6 µm, not less than 6 µm and not more than 9 µm, not less than 9 µm and not more than 12 µm, or not less than 12 µm and not more than 15 µm. The thickness T4 is preferably not less than 2 µm and not more than 8 µm.

The gate pad electrode 181 includes a first outer surface plating layer 184 that is constituted of a metal material differing from the first Ni plating layer 183 and covers the outer surface of the first Ni plating layer 183 inside the second gate opening 171. The first outer surface plating layer 184 corresponds to the outer surface plating layer 42 according to the first preferred embodiment.

The first outer surface plating layer 184 has a thickness T5 that is less than the thickness T4 of the first Ni plating layer 183 (T5<T4). The first outer surface plating layer 184 covers the second gate inner wall 168 of the organic insulating layer 31 inside the second gate opening 171.

The first outer surface plating layer 184 has a gate terminal surface 185A that is to be externally connected via a conductive bonding material (for example, solder). The gate terminal surface 185A is positioned at the first Ni plating layer 183 side with respect to the main surface of the organic insulating layer 31 (opening end of the second gate opening 171). The first outer surface plating layer 184 thereby exposes a portion of the second gate inner wall 168 of the organic insulating layer 31.

Specifically, the first outer surface plating layer 184 has a laminated structure that includes a first Pd plating layer 185 and a first Au plating layer 186 laminated in that order from the first Ni plating layer 183 side. The first Pd plating layer 185 and the first Au plating layer 186 correspond respectively to the Pd plating layer 43 and the Au plating layer 44 according to the first preferred embodiment.

The first Pd plating layer 185 is formed as a film along the outer surface of the first Ni plating layer 183. The first Pd plating layer 185 covers the first Ni plating layer 183 at an interval toward the inorganic insulating layer 30 side from the opening end of the second gate opening 171. The first Pd plating layer 185 covers the second gate inner wall 168 of the organic insulating layer 31 inside the second gate opening 171.

The first Pd plating layer 185 has a thickness less than the thickness T4 of the first Ni plating layer 183. The thickness of the first Pd plating layer 185 may be not less than 0.01 µm and not more than 1 µm. The thickness of the first Pd plating layer 185 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

The first Au plating layer 186 is formed as a film along an outer surface of the first Pd plating layer 185. The first Au plating layer 186 covers the first Pd plating layer 185 at an interval toward the inorganic insulating layer 30 side from the opening end of the second gate opening 171. The first Au plating layer 186 covers the second gate inner wall 168 of the organic insulating layer 31 inside the second gate opening 171.

The first Au plating layer 186 has a thickness less than the thickness T4 of the first Ni plating layer 183. The thickness of the first Au plating layer 186 may be not less than 0.01 μm and not more than 1 μm. The thickness of the first Au plating layer 186 may be not less than 0.01 μm and not more than 0.1 μm, not less than 0.1 μm and not more than 0.2 μm, not less than 0.2 μm and not more than 0.4 μm, not less than 0.4 μm and not more than 0.6 μm, not less than 0.6 μm and not more than 0.8 μm, or not less than 0.8 μm and not more than 1 μm.

With this embodiment, an example where the first outer surface plating layer 184 has the laminated structure that includes the first Pd plating layer 185 and the first Au plating layer 186 was described. However, the first outer surface plating layer 184 having the same configuration as any one of the outer surface plating layers 42 according to the second to fourth configuration examples shown in FIG. 4A to FIG. 4D described above may be adopted instead.

The source pad electrode 182 includes a second Ni plating layer 193 that is formed on the source main surface electrode 155 inside the source pad opening 162. The second Ni plating layer 193 corresponds to the Ni plating layer 41 according to the first preferred embodiment.

The second Ni plating layer 193 covers the source main surface electrode 155 inside the first source opening 167 and covers the source inner peripheral edge 174 of the inorganic insulating layer 30 inside the second source opening 173. The second Ni plating layer 193 has an outer surface that is formed at an interval toward the source main surface electrode 155 side from the main surface of the organic insulating layer 31 (insulating layer 24). The second Ni plating layer 193 covers the organic insulating layer 31 inside the second source opening 173.

Referring to FIG. 14, specifically, the second Ni plating layer 193 includes a first portion 193A that covers the source main surface electrode 155 and a second portion 193B that covers the source inner peripheral edge 174 of the inorganic insulating layer 30.

The first portion 193A of the second Ni plating layer 193 fills the source rough surface region 176 and covers the source main surface electrode 155 inside the first source opening 167. The first portion 193A covers an entire area of the first source inner wall 164 of the inorganic insulating layer 30 and protrudes from an opening end of the first source opening 167 toward an opening end of the second source opening 173. The first portion 193A has a first connecting portion that is connected to the first source inner wall 164 of the inorganic insulating layer 30 and extends in a thickness direction of the inorganic insulating layer 30.

The second portion 193B of the second Ni plating layer 193 is led out from the first portion 193A toward the organic insulating layer 31 side inside the second source opening 173. The second portion 193B is formed in an arcuate shape that is directed toward the organic insulating layer 31 with the opening end of the first source opening 167 as a starting point.

The second portion 193B covers the source inner peripheral edge 174 of the inorganic insulating layer 30 inside the second source opening 173. The second portion 193B thereby opposes the source main surface electrode 155 across the source inner peripheral edge 174 of the inorganic insulating layer 30. The second portion 193B has a second connecting portion that is connected to the main surface of the inorganic insulating layer 30 and extends in a width direction of the inorganic insulating layer 30.

In this embodiment, the second portion 193B further covers the second source inner wall 169 of the organic insulating layer 31 inside the second source opening 173. The second portion 193B covers a region at the inorganic insulating layer 30 side with respect to an intermediate portion of the second source inner wall 169 of the organic insulating layer 31. In other words, the second portion 193B covers the organic insulating layer 31 such that an exposed area of the second source inner wall 169 (organic insulating layer 31) exceeds a hidden area of the second source inner wall 169 (organic insulating layer 31). The second Ni plating layer 193 is thus formed such that the first portion 193A and the second portion 193B are engaged with the opening end of the first source opening 167 from two different directions.

The second Ni plating layer 193 has a thickness T4 that exceeds the thickness T2 of the inorganic insulating layer 30 (T2<T4). The thickness T4 is less than the thickness T3 of the organic insulating layer 31 (T3<T4). The thickness T4 exceeds a value resulting from adding the width WS of the source inner peripheral edge 174 to the thickness T2 of the inorganic insulating layer 30 (T2+WS) (T2+WS<T4). This is a condition by which the second Ni plating layer 193 contacts the second source inner wall 169 of the organic insulating layer 31. The thickness T4 is defined by a thickness of the second Ni plating layer 193 based on the main surface of the source main surface electrode 155.

A ratio T4/T2 of the thickness T4 of the second Ni plating layer 193 with respect to the thickness T2 of the inorganic insulating layer 30 may exceed 1 and be not more than 5. The ratio T4/T2 may exceed 1 and be not more than 2 or be not less than 2 and not more than 3, not less than 3 and not more than 4, or not less than 4 and not more than 5.

The thickness T4 may be not less than 0.1 μm and not more than 15 μm. The thickness T4 may be not less than 0.1 μm and not more than 1 μm, not less than 1 μm and not more than 3 μm, not less than 3 μm and not more than 6 μm, not less than 6 μm and not more than 9 μm, not less than 9 μm and not more than 12 μm, or not less than 12 μm and not more than 15 μm. The thickness T4 is preferably not less than 2 μm and not more than 8 μm.

The source pad electrode 182 includes a second outer surface plating layer 194 that is constituted of a metal material differing from the second Ni plating layer 193 and covers the outer surface of the second Ni plating layer 193 inside the second source opening 173. The second outer surface plating layer 194 corresponds to the outer surface plating layer 42 according to the first preferred embodiment.

The second outer surface plating layer 194 has a thickness T5 that is less than the thickness T4 of the second Ni plating layer 193 (T5<T4). The second outer surface plating layer 194 covers the second source inner wall 169 of the organic insulating layer 31 inside the second source opening 173.

The second outer surface plating layer 194 has a source terminal surface 194A that is to be externally connected via a conductive bonding material (for example, solder). The source terminal surface 194A is positioned at the second Ni plating layer 193 side with respect to the main surface of the organic insulating layer 31 (opening end of the second source opening 173). The second outer surface plating layer 194 thereby exposes a portion of the second source inner wall 169 of the organic insulating layer 31.

Specifically, the second outer surface plating layer 194 has a laminated structure that includes a second Pd plating layer 195 and a second Au plating layer 196 laminated in that order from the second Ni plating layer 193 side. The second Pd plating layer 195 and the second Au plating layer 196 correspond respectively to the Pd plating layer 43 and the Au plating layer 44 according to the first preferred embodiment.

The second Pd plating layer 195 is formed as a film along the outer surface of the second Ni plating layer 193. The second Pd plating layer 195 covers the second Ni plating layer 193 at an interval toward the inorganic insulating layer 30 side from the opening end of the second source opening 173. The second Pd plating layer 195 covers the second source inner wall 169 of the organic insulating layer 31 inside the second source opening 173.

The second Pd plating layer 195 has a thickness less than the thickness T4 of the second Ni plating layer 193. The thickness of the second Pd plating layer 195 may be not less than 0.01 µm and not more than 1 µm. The thickness of the second Pd plating layer 195 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

The second Au plating layer 196 is formed as a film along an outer surface of the second Pd plating layer 195. The second Au plating layer 196 covers the second Pd plating layer 195 at an interval toward the inorganic insulating layer 30 side from the opening end of the second source opening 173. The second Au plating layer 196 covers the second source inner wall 169 of the organic insulating layer 31 inside the second source opening 173.

The second Au plating layer 196 has a thickness less than the thickness T4 of the second Ni plating layer 193. The thickness of the second Au plating layer 196 may be not less than 0.01 µm and not more than 1 µm. The thickness of the second Au plating layer 196 may be not less than 0.01 µm and not more than 0.1 µm, not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

With this embodiment, an example where the second outer surface plating layer 194 has the laminated structure that includes the second Pd plating layer 195 and the second Au plating layer 196 was described. However, the second outer surface plating layer 194 having the same configuration as any one of the outer surface plating layers 42 according to the second to fourth configuration examples shown in FIG. 4A to FIG. 4D described above may be adopted instead.

The second main surface electrode 46 covers the entire area of the second main surface 4. The second main surface electrode 46 forms an ohmic contact with the second main surface 4. The second main surface electrode 46 is formed as a drain electrode.

The second main surface electrode 46 includes at least one among a Ti layer, an Ni layer, a Pd layer, an Au layer, and an Ag layer. The second main surface electrode 46 may have a laminated structure in which at least two among a Ti layer, an Ni layer, a Pd layer, an Au layer, and an Ag layer are laminated in any order. The second main surface electrode 46 may have a single layer structure constituted of a Ti layer, an Ni layer, a Pd layer, an Au layer, and an Ag layer. The second main surface electrode 46 preferably includes a Ti layer as an ohmic electrode. In this embodiment, the second main surface electrode 46 has a laminated structure that includes a Ti layer, an Ni layer, a Pd layer, an Au layer, and an Ag layer laminated in that order from the second main surface 4 side.

The same effects as the effects described for the semiconductor device 1 can also be exhibited by the above-described semiconductor device 101 that includes the MISFET in place of an SBD.

Figure 15:
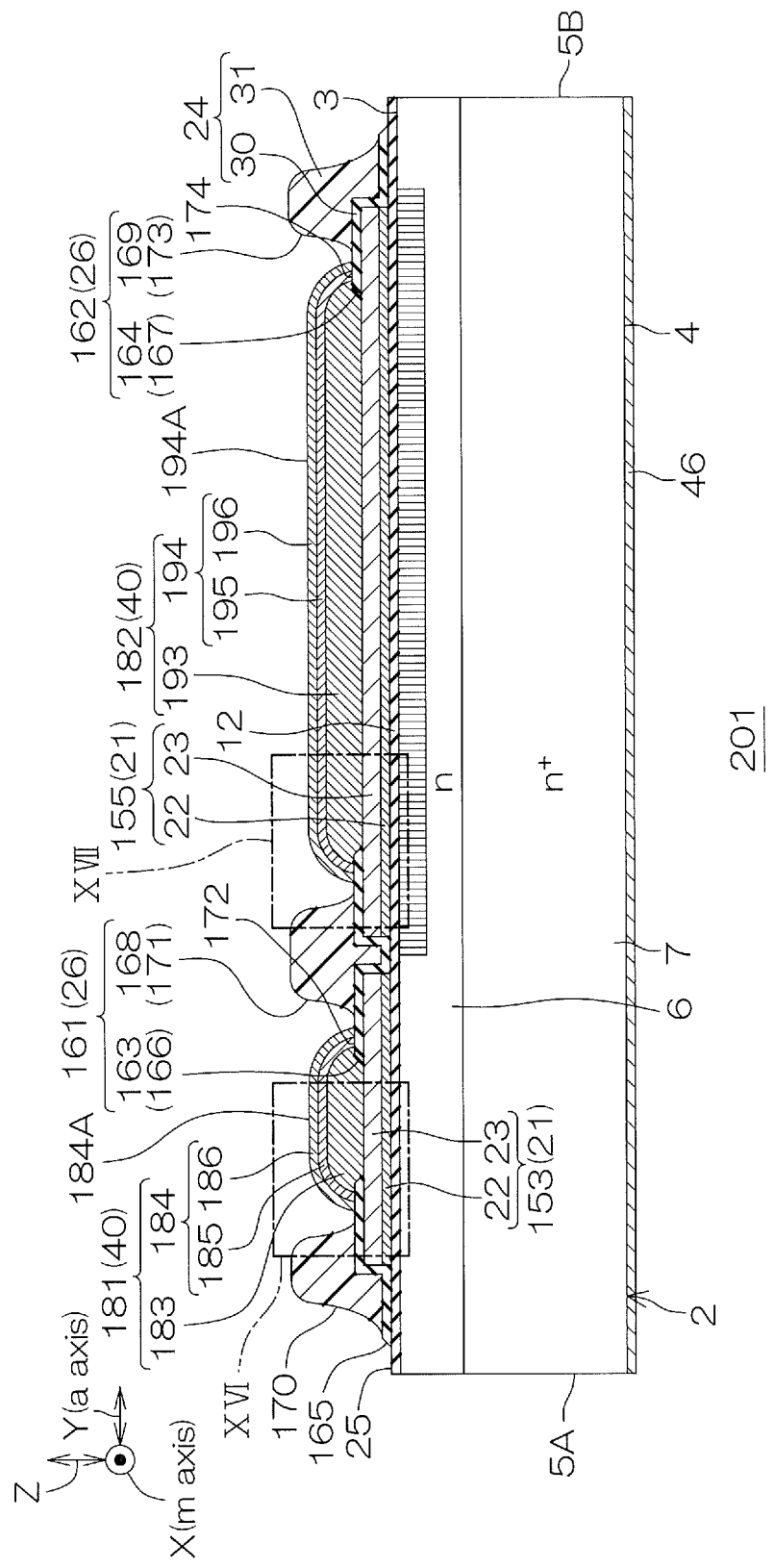
FIG. 15 is a diagram corresponding to FIG. 12 and is a sectional view of a semiconductor device according to a fourth preferred embodiment of the present invention.
Figure 16:
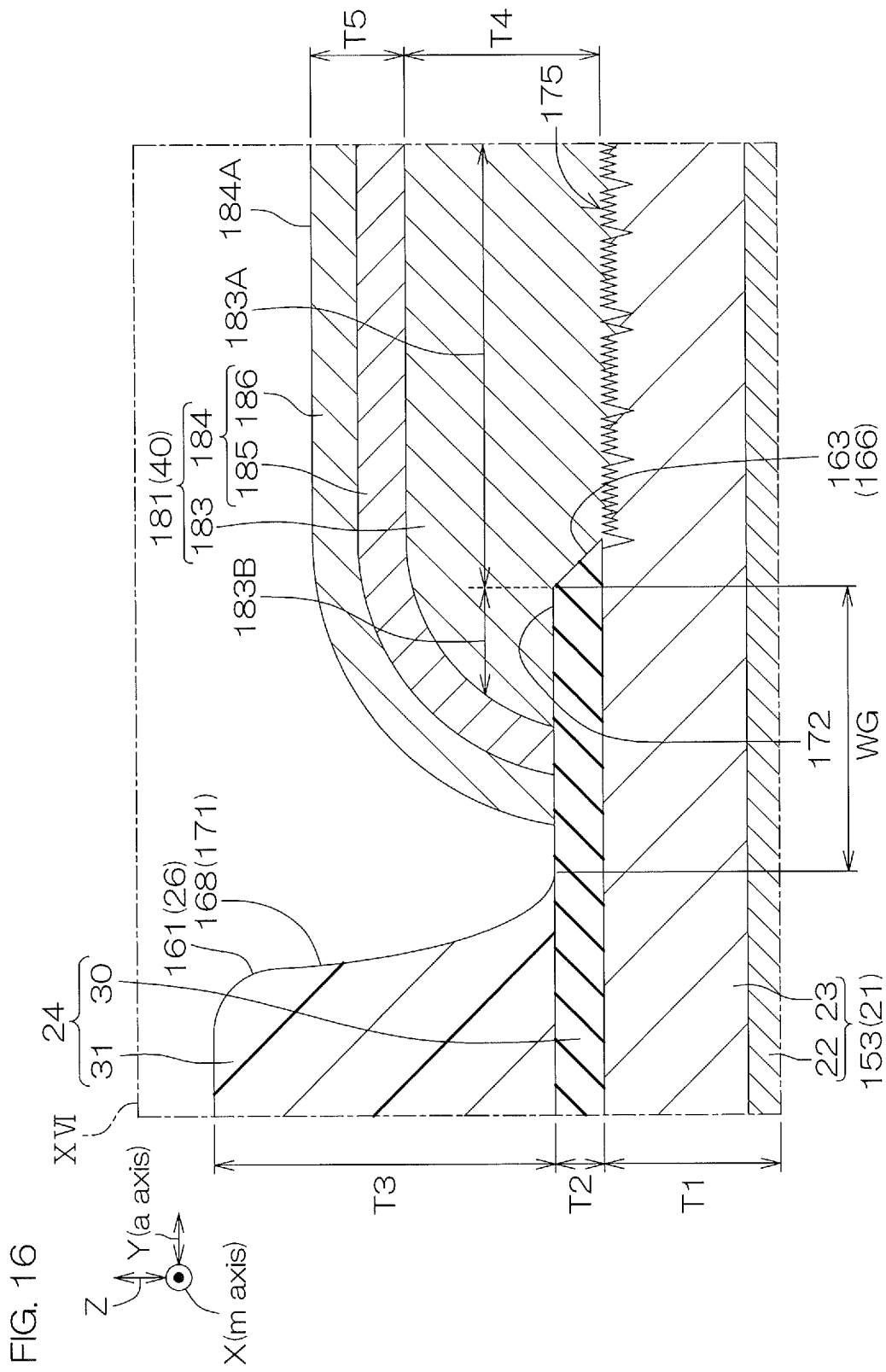
FIG. 16 is an enlarged view of a region XVI shown in FIG. 15.
Figure 17:
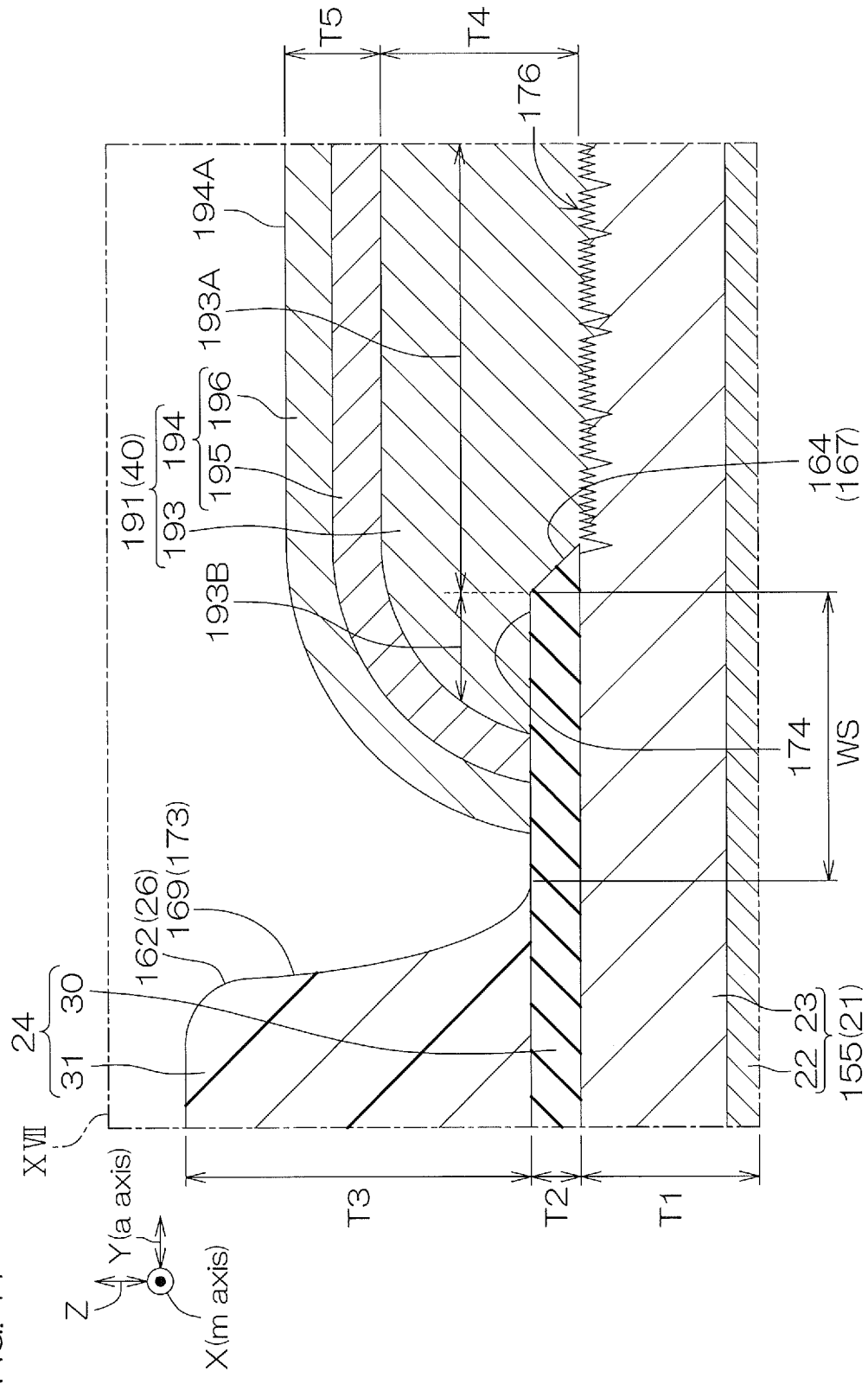
FIG. 17 is an enlarged view of a region XVII shown in FIG. 15.

FIG. 15 is a diagram corresponding to FIG. 12 and is a sectional view of a semiconductor device 201 according to a fourth preferred embodiment of the present invention. FIG. 16 is an enlarged view of a region XVI shown in FIG. 15. FIG. 17 is an enlarged view of a region XVII shown in FIG. 15. In the following, structures corresponding to structures described for the semiconductor device 101 (see FIG. 9 to FIG. 14) shall be provided with the same reference signs and description thereof shall be omitted.

Referring to FIG. 15 to FIG. 17, the organic insulating layer 31 exposes the gate inner peripheral edge 172 of the inorganic insulating layer 30 in the region between the first gate opening 166 and the second gate opening 171. The width WG of the gate inner peripheral edge 172 preferably exceeds the thickness T2 of the inorganic insulating layer 30 (T2<WG).

A ratio WG/T2 of the width WG of the gate inner peripheral edge 172 with respect to the thickness T2 of the inorganic insulating layer 30 may exceed 1 and be not more than 10. The ratio WG/T2 may exceed 1 and be not more than 2 or be not less than 2 and not more than 4, not less than 4 and not more than 6, not less than 6 and not more than 8, or not less than 8 and not more than 10. The ratio WG/T2 is preferably not less than 2 and not more than 5. The width WG may exceed 0 µm and be not more than 10 µm. The width WG may exceed 0 µm and be not more than 2 µm or be not less than 2 µm and not more than 4 µm, not less than 4 µm and not more than 6 µm, not less than 6 µm and not more than 8 µm, or not less than 8 µm and not more than 10 µm.

The first Ni plating layer 183 is formed on the gate main surface electrode 153 inside the gate pad opening 161. The first Ni plating layer 183 covers the gate main surface electrode 153 inside the first gate opening 166 and covers the gate inner peripheral edge 172 of the inorganic insulating layer 30 inside the second gate opening 171. The first Ni plating layer 183 has the outer surface that is formed at an interval toward the gate main surface electrode 153 side from the main surface of the organic insulating layer 31 (insulating layer 24). The first Ni plating layer 183 covers the gate inner peripheral edge 172 of the inorganic insulating layer 30 at an interval from the organic insulating layer 31 inside the second gate opening 171.

Referring to FIG. 16, specifically, the first Ni plating layer 183 includes the first portion 183A that covers the gate main surface electrode 153 and the second portion 183B that covers the gate inner peripheral edge 172 of the inorganic insulating layer 30.

The first portion 183A of the first Ni plating layer 183 fills the gate rough surface region 175 and covers the gate main surface electrode 153 inside the first gate opening 166. The first portion 183A covers the entire area of the first gate inner wall 163 of the inorganic insulating layer 30 inside the first gate opening 166 and protrudes from the opening end of the first gate opening 166 toward the opening end of the second gate opening 171. The first portion 183A has the first connecting portion that is connected to the first gate inner wall 163 of the inorganic insulating layer 30 and extends in the thickness direction of the inorganic insulating layer 30.

The second portion 183B of the first Ni plating layer 183 is led out from the first portion 183A toward the organic insulating layer 31 side inside the second gate opening 171. The second portion 183B is formed in an arcuate shape that is directed toward the second gate inner wall 168 of the organic insulating layer 31 with the opening end of the first gate opening 166 as a starting point.

The second portion 183B covers the gate inner peripheral edge 172 of the inorganic insulating layer 30 inside the second gate opening 171. In this embodiment, the second portion 183B partially covers the gate inner peripheral edge 172 of the inorganic insulating layer 30 at an interval toward the first gate inner wall 163 side of the inorganic insulating layer 30 from the second gate inner wall 168 of the organic insulating layer 31 inside the second gate opening 171 such that the portion of the inner peripheral edge 38 of the inorganic insulating layer 30 is exposed.

The first Ni plating layer 183 thereby exposes a portion of the gate inner peripheral edge 172 of the inorganic insulating layer 30 and an entire area of the second gate inner wall 168 of the organic insulating layer 31. The second portion 183B opposes the gate main surface electrode 153 across the gate inner peripheral edge 172 of the inorganic insulating layer 30. The second portion 183B has the second connecting portion that is connected to the main surface of the inorganic insulating layer 30 and extends in the width direction of the inorganic insulating layer 30.

The first Ni plating layer 183 has the thickness T4 that exceeds the thickness T2 of the inorganic insulating layer 30 (T2<T4). The thickness T4 is less than the value resulting from adding the width WG of the gate inner peripheral edge 172 to the thickness T2 of the inorganic insulating layer 30 (T2+WG) (T4<T2+WG). This is a condition by which the first Ni plating layer 183 exposes the second gate inner wall 168 of the organic insulating layer 31. The thickness T4 is defined by the thickness of the first Ni plating layer 183 based on the main surface of the gate main surface electrode 153.

The ratio T4/T2 of the thickness T4 of the first Ni plating layer 183 with respect to the thickness T2 of the inorganic insulating layer 30 may exceed 1 and be not more than 5. The ratio T4/T2 may exceed 1 and be not more than 2 or be not less than 2 and not more than 3, not less than 3 and not more than 4, or not less than 4 and not more than 5. The thickness T4 may be not less than 0.1 μm and not more than 10 μm. The thickness T4 may be not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

The first outer surface plating layer 184 covers the outer surface of the first Ni plating layer 183 inside the second gate opening 171. The first outer surface plating layer 184 has the thickness T5 that is less than the thickness T4 of the first Ni plating layer 183 (T5<T4). In this embodiment, the first outer surface plating layer 184 partially covers the gate inner peripheral edge 172 of the inorganic insulating layer 30 at an interval toward the first gate inner wall 163 side of the inorganic insulating layer 30 from the second gate inner wall 168 of the organic insulating layer 31 inside the second gate opening 171 such that the portion of the inner peripheral edge 38 of the inorganic insulating layer 30 is exposed.

The first outer surface plating layer 184 has the gate terminal surface 184A that is to be externally connected via a conductive bonding material (for example, solder). The gate terminal surface 184A is positioned at the first Ni plating layer 183 side with respect to the main surface of the organic insulating layer 31 (opening end of the second gate opening 171). The first outer surface plating layer 184 thereby exposes the portion of the gate inner peripheral edge 172 of the inorganic insulating layer 30 and the entire area of the second gate inner wall 168 of the organic insulating layer 31 inside the second gate opening 171.

Specifically, the first outer surface plating layer 184 has the laminated structure that includes the first Pd plating layer 185 and a Pd plating layer 186 laminated in that order from the first Ni plating layer 183 side. The first Pd plating layer 185 is formed as a film along the outer surface of the first Ni plating layer 183. The first Pd plating layer 185 covers the first Ni plating layer 183 at an interval toward the inorganic insulating layer 30 side from the opening end of the second gate opening 171.

The first Pd plating layer 185 partially covers the gate inner peripheral edge 172 of the inorganic insulating layer 30 at an interval toward the first gate inner wall 163 side of the inorganic insulating layer 30 from the second gate inner wall 168 of the organic insulating layer 31 inside the second gate opening 171 such that the portion of the inner peripheral edge 38 of the inorganic insulating layer 30 is exposed. The first Pd plating layer 185 thereby exposes the portion of the gate inner peripheral edge 172 of the inorganic insulating layer 30 and the entire area of the second gate inner wall 168 of the organic insulating layer 31 inside the second gate opening 171.

The first Pd plating layer 185 has a thickness less than the thickness T4 of the first Ni plating layer 183. The thickness of the first Pd plating layer 185 may be not less than 0.01 μm and not more than 1 μm. The thickness of the first Pd plating layer 185 may be not less than 0.01 μm and not more than 0.1 μm, not less than 0.1 μm and not more than 0.2 μm, not less than 0.2 μm and not more than 0.4 μm, not less than 0.4 μm and not more than 0.6 μm, not less than 0.6 μm and not more than 0.8 μm, or not less than 0.8 μm and not more than 1 μm.

The Pd plating layer 186 is formed as a film along the outer surface of the first Pd plating layer 185. The Pd plating layer 186 covers the first Pd plating layer 185 at an interval toward the inorganic insulating layer 30 side from the opening end of the second gate opening 171.

The Pd plating layer 186 partially covers the gate inner peripheral edge 172 of the inorganic insulating layer 30 at an interval toward the first gate inner wall 163 side of the inorganic insulating layer 30 from the second gate inner wall 168 of the organic insulating layer 31 inside the second gate opening 171 such that the portion of the inner peripheral edge 38 of the inorganic insulating layer 30 are exposed. The Pd plating layer 186 thereby exposes the portion of the gate inner peripheral edge 172 of the inorganic insulating layer 30 and the entire area of the second gate inner wall 168 of the organic insulating layer 31 inside the second gate opening 171.

The Pd plating layer 186 has a thickness less than the thickness T4 of the first Ni plating layer 183. The thickness of the Pd plating layer 186 may be not less than 0.01 μm and not more than 1 μm. The thickness of the Pd plating layer 186 may be not less than 0.01 μm and not more than 0.1 μm, not less than 0.1 μm and not more than 0.2 μm, not less than 0.2 μm and not more than 0.4 μm, not less than 0.4 μm and not more than 0.6 μm, not less than 0.6 μm and not more than 0.8 μm, or not less than 0.8 μm and not more than 1 μm.

With this embodiment, an example where the first outer surface plating layer 184 has the laminated structure that includes the first Pd plating layer 185 and the Pd plating layer 186 was described. However, the first outer surface plating layer 184 having the same configuration as any one of the outer surface plating layers 42 according to the second to fourth configuration examples shown in FIG. 8A to FIG. 8D described above may be adopted instead.

The organic insulating layer 31 exposes the source inner peripheral edge 174 of the inorganic insulating layer 30 in the region between the first source opening 167 and the second source opening 173. The width WS of the source inner peripheral edge 174 exceeds the thickness T2 of the inorganic insulating layer 30 (T2<WS).

A ratio WS/T2 of the width WS of the gate inner peripheral edge 172 with respect to the thickness T2 of the inorganic insulating layer 30 may exceed 1 and be not more than 10. The ratio WS/T2 may exceed 1 and be not more than 2 or be not less than 2 and not more than 4, not less than 4 and not more than 6, not less than 6 and not more than 8, or not less than 8 and not more than 10. The ratio WS/T2 is preferably not less than 2 and not more than 5. The width WS may exceed 0 μm and be not more than 10 μm. The width WS may exceed 0 μm and be not more than 2 μm or be not less than 2 μm and not more than 4 μm, not less than 4 μm and not more than 6 μm, not less than 6 μm and not more than 8 μm, or not less than 8 μm and not more than 10 μm.

The second Ni plating layer 193 is formed on the source main surface electrode 155 inside the source pad opening 162. The second Ni plating layer 193 covers the source main surface electrode 155 inside the second source opening 173 and covers the source inner peripheral edge 174 of the inorganic insulating layer 30 inside the second source opening 173. The second Ni plating layer 193 has the outer surface that is formed at an interval toward the source main surface electrode 155 side from the main surface of the organic insulating layer 31 (insulating layer 24). The second Ni plating layer 193 covers the source inner peripheral edge 174 of the inorganic insulating layer 30 at an interval from the organic insulating layer 31 inside the second source opening 173.

Referring to FIG. 17, specifically, the second Ni plating layer 193 includes the first portion 193A that covers the source main surface electrode 155 and the second portion 193B that covers the source inner peripheral edge 174 of the inorganic insulating layer 30.

The first portion 193A of the second Ni plating layer 193 fills the source rough surface region 176 and covers the source main surface electrode 155 inside the first source opening 167. The first portion 193A covers the entire area of the first source inner wall 164 of the inorganic insulating layer 30 inside the first source opening 167 and protrudes from the opening end of the first source opening 167 toward the opening end of the second source opening 173. The first portion 193A has the first connecting portion that is connected to the first source inner wall 164 of the inorganic insulating layer 30 and extends in the thickness direction of the inorganic insulating layer 30.

The second portion 193B of the second Ni plating layer 193 is led out from the first portion 193A toward the organic insulating layer 31 side inside the second source opening 173. The second portion 193B is formed in an arcuate shape that is directed toward the second source inner wall 169 of the organic insulating layer 31 with the opening end of the first source opening 167 as a starting point.

The second portion 193B covers the source inner peripheral edge 174 of the inorganic insulating layer 30 inside the second source opening 173. In this embodiment, the second portion 193B partially covers the source inner peripheral edge 174 of the inorganic insulating layer 30 at an interval toward the first source inner wall 164 side of the inorganic insulating layer 30 from the second source inner wall 169 of the organic insulating layer 31 inside the second source opening 173 such that the portion of the inner peripheral edge 38 of the inorganic insulating layer 30 is exposed.

The second Ni plating layer 193 thereby exposes a portion of the source inner peripheral edge 174 of the inorganic insulating layer 30 and an entire area of the second source inner wall 169 of the organic insulating layer 31. The second portion 193B opposes the source main surface electrode 155 across the source inner peripheral edge 174 of the inorganic insulating layer 30. The second portion 193B has the second connecting portion that is connected to the main surface of the inorganic insulating layer 30 and extends in the width direction of the inorganic insulating layer 30.

The second Ni plating layer 193 has the thickness T4 that exceeds the thickness T2 of the inorganic insulating layer 30 (T2<T4). The thickness T4 is less than the thickness T3 of the organic insulating layer 31 (T3<T4). The thickness T4 is less than the value resulting from adding the width WS of the source inner peripheral edge 174 to the thickness T2 of the inorganic insulating layer 30 (T2+WS) (T4<T2+WS). This is a condition by which the second Ni plating layer 193 exposes the second source inner wall 169 of the organic insulating layer 31. The thickness T4 is defined by the thickness of the second Ni plating layer 193 based on the main surface of the source main surface electrode 155.

The ratio T4/T2 of the thickness T4 of the second Ni plating layer 193 with respect to the thickness T2 of the inorganic insulating layer 30 may exceed 1 and be not more than 5. The ratio T4/T2 may exceed 1 and be not more than 2 or be not less than 2 and not more than 3, not less than 3 and not more than 4, or not less than 4 and not more than 5. The thickness T4 may be not less than 0.1 μm and not more than 10 μm. The thickness T4 may be not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

The second outer surface plating layer 194 covers the outer surface of the second Ni plating layer 193 inside the second source opening 173. The second outer surface plating layer 194 has the thickness T5 that is less than the thickness T4 of the second Ni plating layer 193 (T5<T4). In this embodiment, the second outer surface plating layer 194 partially covers the source inner peripheral edge 174 of the inorganic insulating layer 30 at an interval toward the first source inner wall 164 side of the inorganic insulating layer 30 from the second source inner wall 169 of the organic insulating layer 31 inside the second source opening 173 such that the portion of the inner peripheral edge 38 of the inorganic insulating layer 30 is exposed.

The second outer surface plating layer 194 has the source terminal surface 194A that is to be externally connected via a conductive bonding material (for example, solder). The source terminal surface 194A is positioned at the second Ni plating layer 193 side with respect to the main surface of the organic insulating layer 31 (opening end of the second source opening 173). The second outer surface plating layer 194 thereby exposes the portion of the source inner peripheral edge 174 of the inorganic insulating layer 30 and the entire area of the second source inner wall 169 of the organic insulating layer 31 inside the second source opening 173.

Specifically, the second outer surface plating layer 194 has the laminated structure that includes the second Pd plating layer 195 and the second Au plating layer 196 laminated in that order from the second Ni plating layer 193 side. The second Pd plating layer 195 is formed as a film along the outer surface of the second Ni plating layer 193. The second Pd plating layer 195 covers the second Ni plating layer 193 at an interval toward the inorganic insulating layer 30 side from the opening end of the second source opening 173.

The second Pd plating layer 195 partially covers the source inner peripheral edge 174 of the inorganic insulating layer 30 at an interval toward the first source inner wall 164 side of the inorganic insulating layer 30 from the second source inner wall 169 of the organic insulating layer 31 inside the second source opening 173 such that the portion of the inner peripheral edge 38 of the inorganic insulating layer 30 is exposed. The second Pd plating layer 195 thereby exposes the portion of the source inner peripheral edge 174 of the inorganic insulating layer 30 and the entire area of the second source inner wall 169 of the organic insulating layer 31 inside the second source opening 173.

The second Pd plating layer 195 has a thickness less than the thickness T4 of the second Ni plating layer 193. The thickness of the second Pd plating layer 195 may be not less than 0.01 μm and not more than 1 μm. The thickness of the second Pd plating layer 195 may be not less than 0.01 μm and not more than 0.1 μm, not less than 0.1 μm and not more than 0.2 μm, not less than 0.2 μm and not more than 0.4 μm, not less than 0.4 μm and not more than 0.6 μm, not less than 0.6 μm and not more than 0.8 μm, or not less than 0.8 μm and not more than 1 μm.

The second Au plating layer 196 is formed as a film along the outer surface of the second Pd plating layer 195. The second Au plating layer 196 covers the second Pd plating layer 195 at an interval toward the inorganic insulating layer 30 side from the opening end of the second source opening 173.

The second Au plating layer 196 partially covers the source inner peripheral edge 174 of the inorganic insulating layer 30 at an interval toward the first source inner wall 164 side of the inorganic insulating layer 30 from the second source inner wall 169 of the organic insulating layer 31 inside the second source opening 173 such that the portion of the inner peripheral edge 38 of the inorganic insulating layer 30 is exposed. The second Au plating layer 196 thereby exposes the portion of the source inner peripheral edge 174 of the inorganic insulating layer 30 and the entire area of the second source inner wall 169 of the organic insulating layer 31 inside the second source opening 173.

The second Au plating layer 196 has a thickness less than the thickness T4 of the second Ni plating layer 193. The thickness of the second Au plating layer 196 may be not less than 0.01 μm and not more than 1 μm. The thickness of the second Au plating layer 196 may be not less than 0.01 μm and not more than 0.1 μm, not less than 0.1 μm and not more than 0.2 μm, not less than 0.2 μm and not more than 0.4 μm, not less than 0.4 μm and not more than 0.6 μm, not less than 0.6 μm and not more than 0.8 μm, or not less than 0.8 μm and not more than 1 μm.

With this embodiment, an example where the second outer surface plating layer 194 has the laminated structure that includes the second Pd plating layer 195 and the second Au plating layer 196 was described. However, the second outer surface plating layer 194 having the same configuration as any one of the outer surface plating layers 42 according to the second to fourth configuration examples shown in FIG. 8A to FIG. 8D described above may be adopted instead.

The same effects as the effects described for the semiconductor device 101 can also be exhibited by the semiconductor device 201 described above. The same effects as the effects described for the semiconductor device 61 can be exhibited by the semiconductor device 201.

Figure 18:
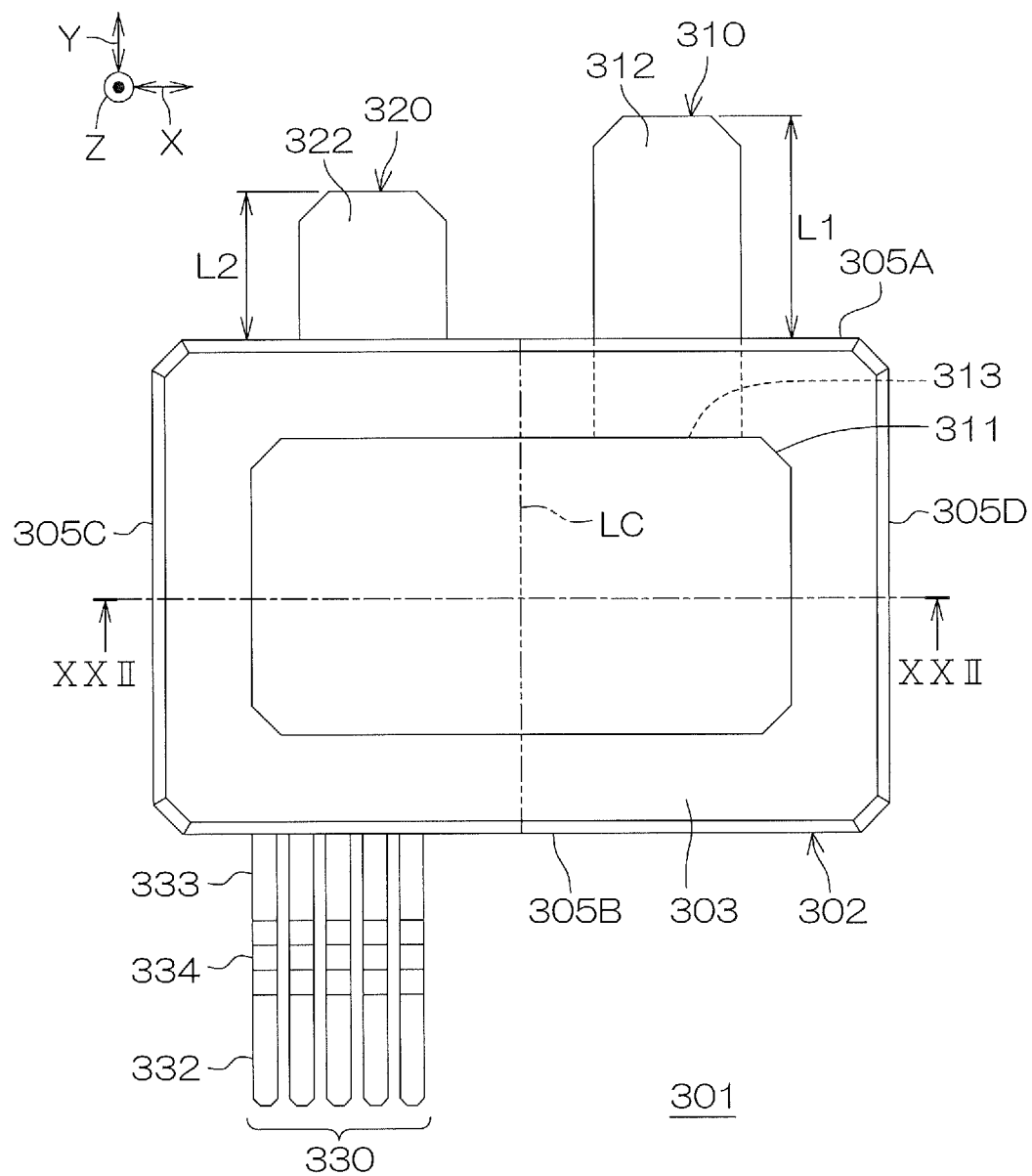
FIG. 18 is a plan view as viewed from one side of a semiconductor package in which a semiconductor device according to any of the first to fourth preferred embodiments is incorporated.
Figure 19:
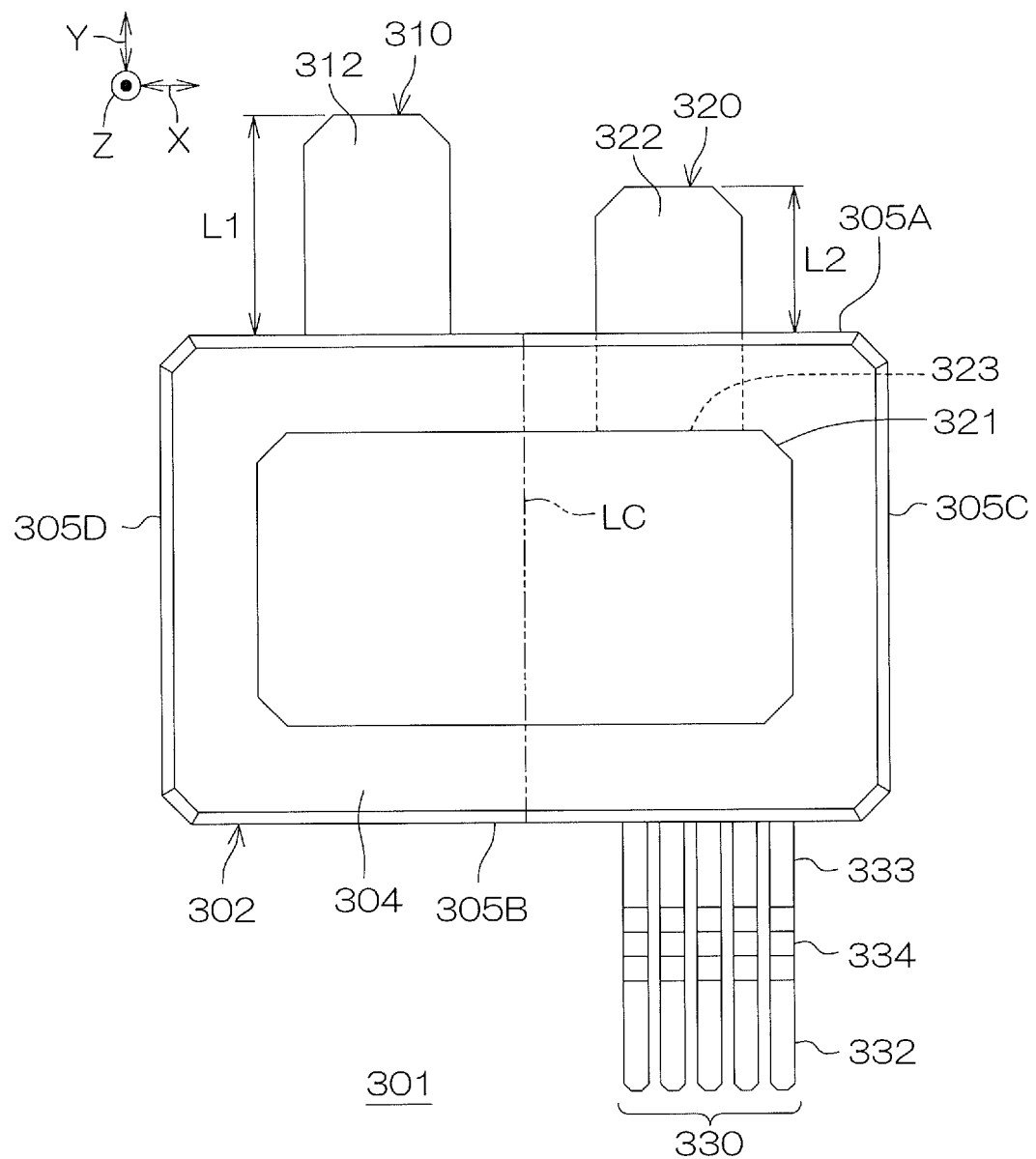
FIG. 19 is a plan view as viewed from another side of the semiconductor package shown in FIG. 18.
Figure 20:
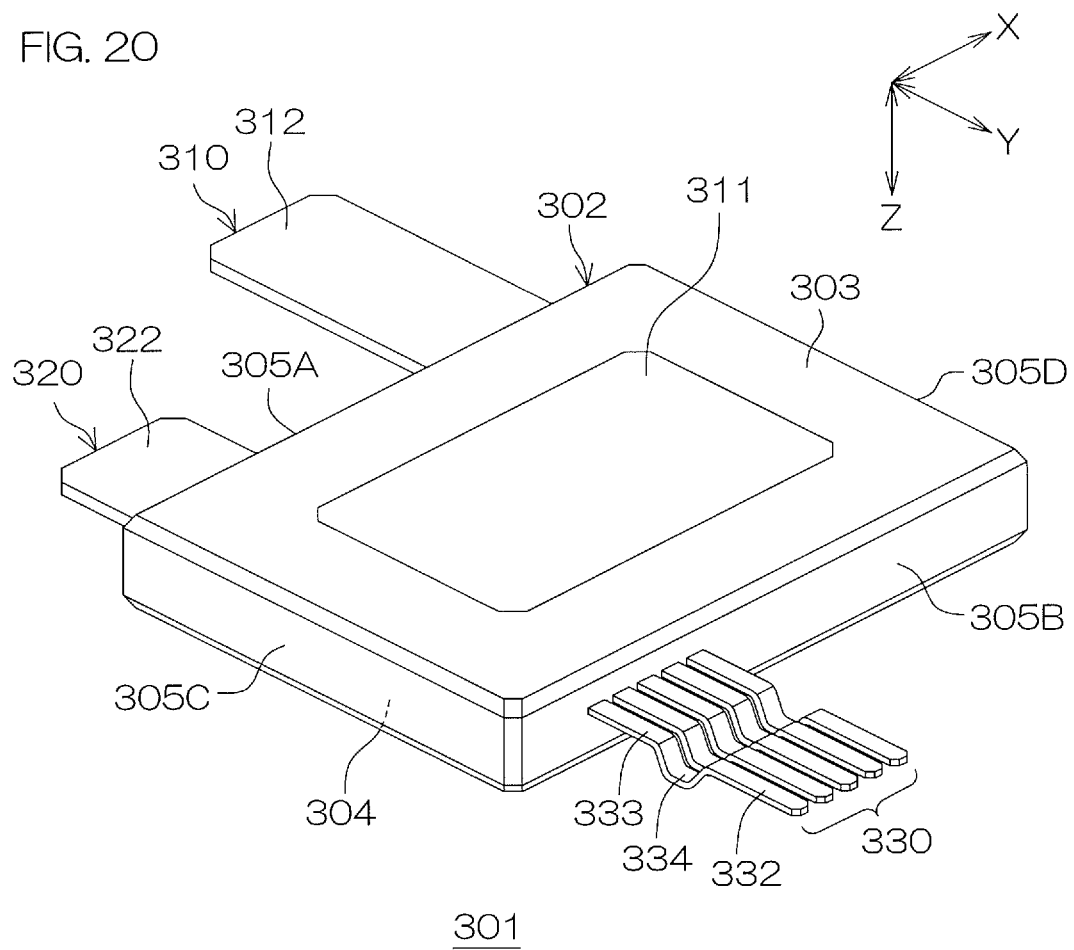
FIG. 20 is a perspective view of the semiconductor package shown in FIG. 18.
Figure 21:
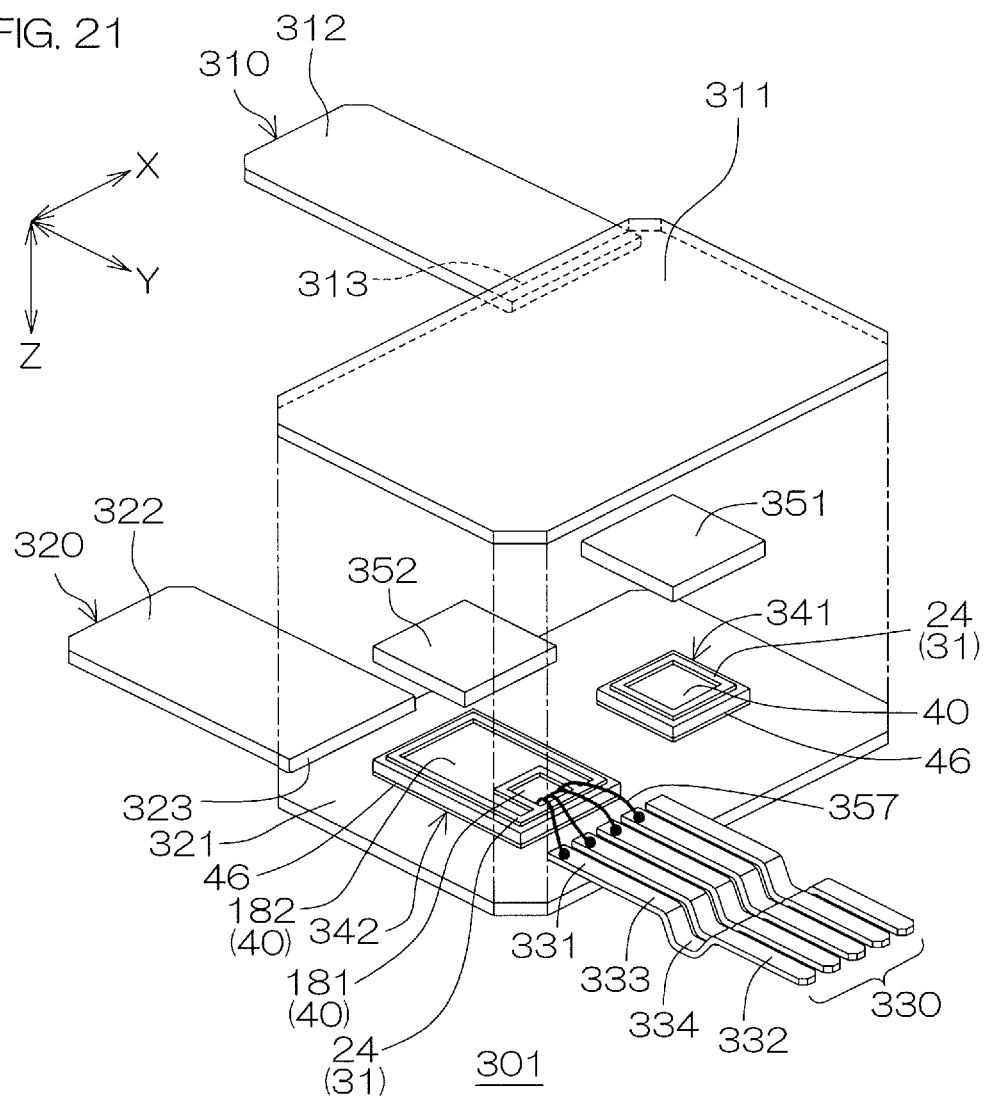
FIG. 21 is an exploded perspective view of the semiconductor package shown in FIG. 18.
Figure 22:
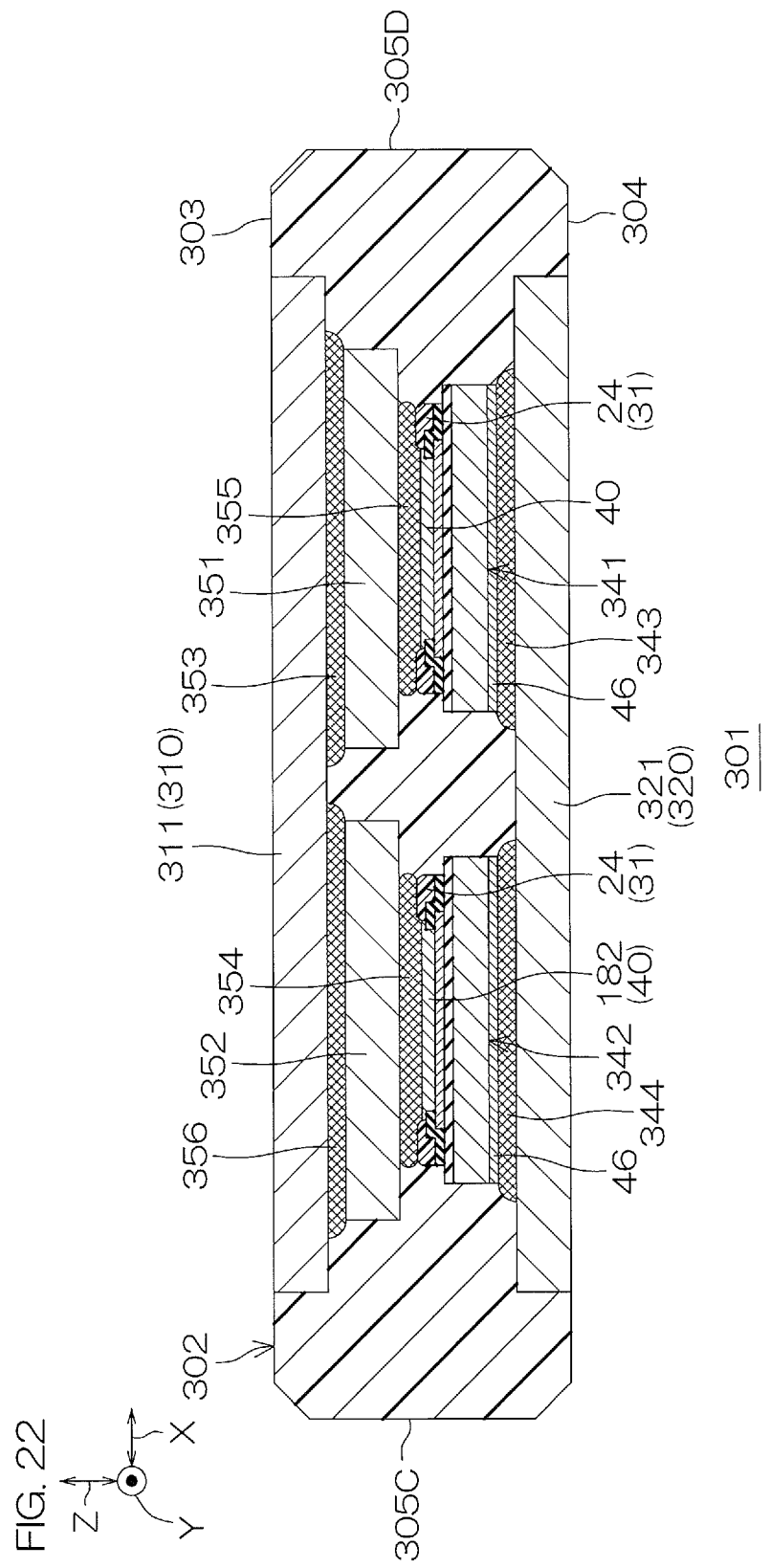
FIG. 22 is a sectional view taken along line XXII-XXII shown in FIG. 18.

FIG. 18 is a plan view as viewed from one side of a semiconductor package 301 in which a semiconductor device (sign omitted) according to any of the first to fourth preferred embodiments is incorporated. FIG. 19 is a plan view as viewed from another side of the semiconductor package 301 shown in FIG. 18. FIG. 20 is a perspective view of the semiconductor package 301 shown in FIG. 18. FIG. 21 is an exploded perspective view of the semiconductor package 301 shown in FIG. 18. FIG. 22 is a sectional view taken along line XXII-XXII shown in FIG. 18. FIG. 23 is a circuit diagram of the semiconductor package 301 shown in FIG. 18.

Referring to FIG. 18 to FIG. 23, in this embodiment, the semiconductor package 301 has a configuration called a power guard. The semiconductor package 301 includes a package main body 302 made of resin. The package main body 302 is constituted of a molding resin that includes a filler (for example, an insulating filler) and a matrix resin. The matrix resin is preferably constituted of an epoxy resin.

The package main body 302 has a first main surface 303 (first surface) at one side, a second main surface 304 (second surface) at another side, and side surfaces 305A to 305D that connect the first main surface 303 and the second main surface 304. The first main surface 303 and the second main surface 304 are formed in quadrilateral shapes (rectangular shapes in this embodiment) in a plan view as viewed in a normal direction Z thereto.

The side surfaces 305A to 305D include the first side surface 305A, the second side surface 305B, the third side surface 305C, and the fourth side surface 305D. The first side surface 305A and the second side surface 305B extend along a first direction X and oppose each other in a second direction Y intersecting the first direction X. The first side surface 305A and the second side surface 305B form long sides of the package main body 302. The third side surface 305C and the fourth side surface 305D extend along the second direction Y and oppose each other in the first direction X. The third side surface 305C and the fourth side surface 305D form short sides of the package main body 302. Specifically, the second direction Y is orthogonal to the first direction X.

The semiconductor package 301 includes a first metal plate 310 that is arranged inside the package main body 302. The first metal plate 310 is arranged at the first main surface 303 side of the package main body 302 and integrally includes a first heat dissipating portion 311 and a first terminal portion 312. The first heat dissipating portion 311 is arranged inside the package main body 302 such as to be exposed from the first main surface 303. The first heat dissipating portion 311 is formed in a rectangular shape that extends along the first direction X in plan view. The first heat dissipating portion 311 has a plane area less than a plane area of the first main surface 303 and is exposed from the first main surface 303 at intervals inward from the side surfaces 305A to 305D.

The first terminal portion 312 is exposed from the first side surface 305A. Specifically, the first terminal portion 312 extends as a band toward the first side surface 305A from the first heat dissipating portion 311, penetrates through the first side surface 305A, and is led out to the outside of the package main body 302. When a central line LC that traverses a central portion of the first side surface 305A (second side surface 305B) in the second direction Y is set, the first heat dissipating portion 311 is positioned at the fourth side surface 305D side with respect to the central line LC.

The first terminal portion 312 has a first length L1 in regard to the second direction Y. A width of the first terminal portion 312 in the first direction X is less than a width of the first heat dissipating portion 311 in the first direction X. The first terminal portion 312 is connected to the first heat dissipating portion 311 via a bent portion 313 that is bent from the first main surface 303 side to the second main surface 304 side inside the package main body 302. The first terminal portion 312 is thereby exposed from the first side surface 305A at an interval toward the second main surface 304 side from the first main surface 303.

The semiconductor package 301 includes a second metal plate 320 that is arranged inside the package main body 302. The second metal plate 320 is arranged at the second main surface 304 side of the package main body 302 at an interval from the first metal plate 310 and integrally includes a second heat dissipating portion 321 and a second terminal portion 322. The second heat dissipating portion 321 is arranged inside the package main body 302 such as to be exposed from the second main surface 304. The second heat dissipating portion 321 is formed in a rectangular shape that extends along the first direction X in plan view. The second heat dissipating portion 321 has a plane area less than a plane area of the second main surface 304 and is exposed from the second main surface 304 at intervals inward from the side surfaces 305A to 305D.

The second terminal portion 322 is exposed from the first side surface 305A. Specifically, the second terminal portion 322 extends as a band toward the first side surface 305A from the second heat dissipating portion 321, penetrates through the first side surface 305A, and is led out to the outside of the package main body 302. The second heat dissipating portion 322 is positioned at the third side surface 305C side with respect to the central line LC.

In this embodiment, the second terminal portion 322 has a second length L2 in regard to the second direction Y that differs from the first length L1 of the first terminal portion 312. The first terminal portion 312 and the second terminal portion 322 are identified by the shapes (lengths) thereof. The second length L2 of the second terminal portion 322 may exceed the first length L1 or may be less than the first length L1. Obviously, the second terminal portion 322 having the second length L2 that is equal to the first length L1 may be formed instead.

A width of the second terminal portion 322 in the first direction X is less than a width of the second heat dissipating portion 321 in the first direction X. The second terminal portion 322 is connected to the second heat dissipating portion 321 via a bent portion 323 that is bent from the second main surface 304 side to the first main surface 303 side inside the package main body 302. The second terminal portion 322 is thereby exposed from the second side surface 305B at an interval toward the first main surface 303 side from the second main surface 304.

In regard to the normal direction Z, the second terminal portion 322 is led out from a thickness position differing from the first terminal portion 312. In this embodiment, the second terminal portion 322 is formed at an interval toward the second main surface 304 side from the first terminal portion 312. The second terminal portion 322 does not oppose the first terminal portion 312 in regard to the first direction X.

The semiconductor package 301 includes one or a plurality (five in this embodiment) of control terminals 330 that are arranged inside the package main body 302. The plurality of control terminals 330 are exposed from the second side surface 305B at the opposite side to the first side surface 305A from which the first terminal portion 312 and the second terminal portion 322 are exposed. The plurality of control terminals 330 are positioned at the third side surface 305C side with respect to the central line LC. The plurality of control terminals 330 are positioned on the same straight line as the second terminal portion 322 of the second metal plate 320 in plan view. The positioning of the plurality of control terminals 330 is arbitrary.

The plurality of control terminals 330 are each formed as a band extending in the second direction Y. Specifically, the plurality of control terminals 330 each include an internal connecting portion 331, an external connecting portion 332, and a band portion 333. The internal connecting portion 331 is arranged inside the package main body 302. The external connecting portion 332 is arranged outside the package main body 302.

From the internal connecting portion 331, the band portion 333 penetrates through the second side surface 305B and extends as a band toward the external connecting portion 332. At a portion positioned outside the package main body 302, the band portion 333 may have a curved portion 334 that is depressed toward the second main surface 304 side. Obviously, the band portion 333 not having the curved portion 334 may be formed instead.

In regard to the normal direction Z, the plurality of control terminals 330 are led out from a thickness position differing from the first heat dissipating portion 311 and the second heat dissipating portion 321. In this embodiment, the plurality of control terminals 330 are arranged at a region between the first heat dissipating portion 311 and the second heat dissipating portion 321 at intervals from the first heat dissipating portion 311 and the second heat dissipating portion 321.

The semiconductor package 301 includes an SBD chip 341 and a MISFET chip 342 that are arranged inside the package main body 302. The SBD chip 341 is constituted of either one of the semiconductor devices (sign omitted) according to the first and second preferred embodiments. The MISFET chip 342 is constituted of either one of the semiconductor devices (sign omitted) according to the third and fourth preferred embodiments.

The SBD chip 341 is arranged at a space inside the package main body 302 that is sandwiched by the first heat dissipating portion 311 and the second heat dissipating portion 321. The SBD chip 341 is arranged at the fourth side surface 305D side of the package main body 302 with respect to the central line LC. The SBD chip 341 is arranged on the second heat dissipating portion 321 in an orientation where the second main surface electrode 46 opposes the second heat dissipating portion 321.

The MISFET chip 342 is arranged at a space inside the package main body 302 that is sandwiched by the first heat dissipating portion 311 and the second heat dissipating portion 321 at an interval from the SBD chip 341. The MISFET chip 342 is arranged at the third side surface 305C side of the package main body 302 with respect to the central line LC. The MISFET chip 342 is arranged on the second heat dissipating portion 321 in an orientation where the second main surface electrode 46 opposes the second heat dissipating portion 321.

The semiconductor package 301 includes a first conductive bonding material 343 and a second conductive bonding material 344. The first conductive bonding material 343 and the second conductive bonding material 344 each contain solder or a metal paste. The first conductive bonding material 343 is interposed between the second main surface electrode 46 of the SBD chip 341 and the second heat dissipating portion 321 and connects the SBD chip 341 and the second heat dissipating portion 321 thermally, mechanically, and electrically. The second conductive bonding material 344 is arranged between the second main surface electrode 46 of the MISFET chip 342 and the second heat dissipating portion 321 and connects the MISFET chip 342 and the second heat dissipating portion 321 thermally, mechanically, and electrically.

A cathode of the SBD chip 341 is thereby electrically connected to a drain of the MISFET chip 342. That is, the second metal plate 320 (second heat dissipating portion 321) functions as a cathode/drain terminal for the SBD chip 341 and the MISFET chip 342.

The semiconductor package 301 includes a first metal spacer 351 and a second metal spacer 352. In this embodiment, the first metal spacer 351 and the second metal spacer 352 are each constituted of a plate member that includes copper. The second metal spacer 352 has a thickness that is equal to a thickness of the first metal spacer 351.

The first metal spacer 351 is interposed between the SBD chip 341 and the first heat dissipating portion 311 and separates the SBD chip 341 from the first heat dissipating portion 311. The second metal spacer 352 is interposed between the MISFET chip 342 and the first heat dissipating portion 311 and separates the MISFET chip 342 from the first heat dissipating portion 311. Although in this embodiment, the first metal spacer 351 and the second metal spacer 352 are separate members, the first metal spacer 351 and the second metal spacer 352 may be formed integrally instead.

The semiconductor package 301 includes a third conductive bonding material 353 and a fourth conductive bonding material 354. The third conductive bonding material 353 and the fourth conductive bonding material 354 each contain solder or a metal paste. Preferably, the third conductive bonding material 353 and the fourth conductive bonding material 354 are each constituted of solder.

The third conductive bonding material 353 is interposed between the pad electrode 40 of the SBD chip 341 and the first metal spacer 351 and connects the SBD chip 341 and the first metal spacer 351 thermally, mechanically, and electrically. The fourth conductive bonding material 354 is interposed between the source pad electrode 182 of the MISFET chip 342 and the second metal spacer 352 and connects the MISFET chip 342 and the second metal spacer 352 thermally, mechanically, and electrically.

The semiconductor package 301 includes a fifth conductive bonding material 355 and a sixth conductive bonding material 356. The fifth conductive bonding material 355 and the sixth conductive bonding material 356 each contain solder or a metal paste. The fifth conductive bonding material 355 is interposed between the first heat dissipating portion 311 and the first metal spacer 351 and connects the first heat dissipating portion 311 and the first metal spacer 351 thermally, mechanically, and electrically. The sixth conductive bonding material 356 is interposed between the first heat dissipating portion 311 and the second metal spacer 352 and connects the first heat dissipating portion 311 and the second metal spacer 352 thermally, mechanically, and electrically.

An anode of the SBD chip 341 is thereby electrically connected to a source of the MISFET chip 342. That is, the first metal plate 310 (first heat dissipating portion 311) functions as an anode/source terminal for the SBD chip 341 and the MISFET chip 342.

The semiconductor package 301 includes one or a plurality (five in this embodiment) of lead wires 357. The lead wires 357 are also called bonding wires. The lead wires 357 may be constituted of gold wires, copper wires, or aluminum wires. The plurality of lead wires 357 are respectively connected to the gate pad electrode 181 of the MISFET chip 342 and the internal connecting portions 331 of the plurality of control terminals 330.

A gate of the MISFET chip 342 is thereby electrically connected to the plurality of control terminals 330. That is, the plurality of control terminals 330 each function as a gate terminal of the MISFET chip 342. It is not necessary for the lead wires 357 to connect all of the control terminals 330 and the gate pad electrode 181. Any of the control terminals 330 may be electrically open.

As described above, with the semiconductor package 301, the first conductive bonding material 343 is connected to the pad electrode 40 of the SBD chip 341. As described with the first and second preferred embodiments, the pad electrode 40 of the SBD chip 341 includes the Ni plating layer 41 and the outer surface plating layer 42. The first conductive bonding material 343 can thereby be connected appropriately to the pad electrode 40 of the SBD chip 341. The SBD chip 341 can thereby be thermally, mechanically, and electrically connected appropriately to the first heat dissipating portion 311 and the second heat dissipating portion 321.

If the SBD chip 341 does not include the organic insulating layer 31, cracking, peeling, etc., may occur in the pad electrode 40, etc., of the SBD chip 341 due to the filler contained in the package main body 302. This type of problem is called filler attack and is a cause of decrease in reliability of the pad electrode 40, etc. Thus, with the SBD chip 341, the organic insulating layer 31 is formed on the inorganic insulating layer 30. The organic insulating layer 31 thereby becomes a cushion with respect to the filler and therefore, the pad electrode 40, etc., can be protected appropriately from filler attack.

Further, the SBD chip 341 has, in the structure that includes the organic insulating layer 31, the structure where the Ni plating layer 41 is connected to the inner peripheral edge 38 of the inorganic insulating layer 30 as described with the first and second preferred embodiments. Cracking, peeling, etc., of the Ni plating layer 41 (outer surface plating layer 42) due to filler attack can also be suppressed appropriately thereby.

With the semiconductor package 301, the second conductive bonding material 344 is connected to the source pad electrode 182 of the MISFET chip 342. As described with the third and fourth preferred embodiments, the source pad electrode 182 of the MISFET chip 342 includes the second Ni plating layer 193 and the second outer surface plating layer 194. The second conductive bonding material 344 can thereby be connected appropriately to the source pad electrode 182 of the MISFET chip 342. The MISFET chip 342 can thereby be thermally, mechanically, and electrically connected appropriately to the first heat dissipating portion 311 and the second heat dissipating portion 321.

If the MISFET chip 342 does not include the organic insulating layer 31, cracking, peeling, etc., may occur in the source pad electrode 182, etc., of the MISFET chip 342 due to the filler contained in the package main body 302. This type of problem is called filler attack and is a cause of decrease in reliability of the source pad electrode 182, etc. Thus, with the MISFET chip 342, the organic insulating layer 31 is formed on the inorganic insulating layer 30. The organic insulating layer 31 thereby becomes a cushion with respect to the filler and therefore, the source pad electrode 182, etc., can be protected appropriately from filler attack.

Further, the MISFET chip 342 has, in the structure that includes the organic insulating layer 31, the structure where the second Ni plating layer 193 is connected to the first source inner wall 164 of the inorganic insulating layer 30 as described with the third and fourth preferred embodiments. Cracking, peeling, etc., of the second Ni plating layer 193 (second outer surface plating layer 194) due to filler attack can also be suppressed appropriately thereby. With the MISFET 342, the same effects as the effects at the source pad electrode 182 side can also be exhibited at the gate pad electrode 181 side.

With this embodiment, an example where the semiconductor package 301 includes the SBD chip 341 and the MISFET chip 342 was described. However, the semiconductor package 301 that includes just one of either of the SBD chip 341 and the MISFET chip 342 may be adopted instead. The semiconductor package 301 that includes a plurality of the SBD chips 341 and a plurality of the MISFET chips 342 may be adopted instead.

The preferred embodiments of the present invention may be implemented in yet other embodiments.

If, in the third and fourth preferred embodiments described above, increase in the gate threshold voltage Vth is not emphasized, the gate electrodes 107 may include an n-type polysilicon doped with an n-type impurity in place of the p-type polysilicon. In this case, the first low resistance layer 112 that is constituted of an n-type polycide is formed. With such a structure, the gate resistance can be reduced further.

In the third and fourth preferred embodiments described above, an n-type polysilicon doped with an n-type impurity may be contained in place of the p-type polysilicon. In the third and fourth preferred embodiments described above, a structure where one of either or both of the first low resistance layer 112 and the second low resistance layer 131 is or are not formed may be adopted.

In the third and fourth preferred embodiments described above, a collector region of a p$^+$ type may be adopted in place of the drain region of the n$^+$-type. With this structure, an IGBT (insulated gate bipolar transistor) can be provided in place of the MISFET. In this case, in the third and fourth preferred embodiments described above, the "source" of the MISFET is replaced by an "emitter" of the IGBT and the "drain" of the MISFET is replaced by a "collector" of the IGBT.

In each of the preferred embodiments described above, an Si chip constituted of an Si monocrystal may be adopted in place of the SiC chip 2. That is, the semiconductor device (sign omitted) according to each of the preferred embodiments may be an Si semiconductor device instead. In each of the preferred embodiments described above, a structure with which the conductivity types of the respective semiconductor portions are inverted may be adopted. That is, a portion of the p-type may be made to be of the n-type and a portion of the n-type may be made to be of the p-type.

Examples of features extracted from the present description and drawings are indicated below. Each of [A1] to [A20] in the following provides a semiconductor device with which, in a structure where an Ni plating layer is formed on an electrode exposed from an opening of an organic insulating layer, reliability of the Ni plating layer can be improved.

[A1] A semiconductor device comprising: a chip; an electrode that is formed on the chip; an inorganic insulating layer that covers the electrode and has a first opening exposing the electrode; an organic insulating layer that covers the inorganic insulating layer, has a second opening surrounding the first opening at an interval from the first opening, and exposes an inner peripheral edge of the inorganic insulating layer in a region between the first opening and the second opening; and an Ni plating layer that covers the electrode inside the first opening and covers the inner peripheral edge of the inorganic insulating layer inside the second opening.

[A2] The semiconductor device according to A1, wherein the Ni plating layer covers the organic insulating layer inside the second opening.

[A3] The semiconductor device according to A2, wherein the Ni plating layer is formed at an interval toward the inorganic insulating layer side from an opening end of the second opening.

[A4] The semiconductor device according to A2 or A3, wherein the Ni plating layer covers the organic insulating layer such that an exposed area of the organic insulating layer exceeds a hidden area of the organic insulating layer inside the second opening.

[A5] The semiconductor device according to any one of A2 to A4, wherein the inner peripheral edge of the inorganic insulating layer has a width that is not more than a thickness of the inorganic insulating layer.

[A6] The semiconductor device according to any one of A2 to A5, further comprising: an outer surface plating layer that covers an outer surface of the Ni plating layer inside the second opening.

[A7] The semiconductor device according to A6, wherein the outer surface plating layer covers the organic insulating layer inside the second opening.

[A8] The semiconductor device according to A6 or A7, wherein the outer surface plating layer covers the Ni plating layer at an interval toward the inorganic insulating layer side from an opening end of the second opening.

[A9] The semiconductor device according to any one of A6 to A8, wherein the outer surface plating layer has a thickness less than a thickness of the Ni plating layer.

[A10] The semiconductor device according to A1, wherein the Ni plating layer covers the inner peripheral edge of the inorganic insulating layer at an interval from the organic insulating layer inside the second opening.

[A11] The semiconductor device according to A10, wherein the Ni plating layer is formed at an interval toward the inorganic insulating layer side from an opening end of the second opening.

[A12] The semiconductor device according to A10 or A11, wherein the inner peripheral edge of the inorganic insulating layer has a width that exceeds a thickness of the inorganic insulating layer.

[A13] The semiconductor device according to any one of A10 to A12, further comprising: an outer surface plating layer that covers an outer surface of the Ni plating layer inside the second opening.

[A14] The semiconductor device according to A13, wherein the outer surface plating layer covers the inner peripheral edge of the inorganic insulating layer.

[A15] The semiconductor device according to A13 or A14, wherein the outer surface plating layer covers the Ni plating layer at an interval from the organic insulating layer.

[A16] The semiconductor device according to any one of A13 to A15, wherein the outer surface plating layer covers the Ni plating layer at an interval toward the inorganic insulating layer side from an opening end of the second opening.

[A17] The semiconductor device according to any one of A13 to A16, wherein the outer surface plating layer has a thickness less than a thickness of the Ni plating layer.

[A18] The semiconductor device according to any one of A1 to A17, wherein the chip is constituted of an SiC chip.

[A19] A semiconductor package comprising: a package main body that is made of resin and has a first surface at one side, a second surface at another side, and a side surface; a first metal plate that is arranged inside the package main body and has a first heat dissipating portion exposed from the first surface and a first terminal portion exposed from the side surface; a second metal plate that is arranged inside the package main body at an interval toward the second surface side from the first metal plate and has a second heat dissipating portion exposed from the second surface and a second terminal portion exposed from the side surface; and the semiconductor device according to any one of A1 to A18 that is arranged at a space sandwiched by the first heat dissipating portion and the second heat dissipating portion inside the package main body.

The present application corresponds to Japanese Patent Application No. 2019-180861 filed on Sep. 30, 2019 in the Japan Patent Office, and the entire disclosure of this applications is incorporated herein by reference. While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST 1 semiconductor device
2 SiC chip (chip)
21 first main surface electrode (electrode)
30 inorganic insulating layer
31 organic insulating layer
34 first opening
37 second opening
38 inner peripheral edge of inorganic insulating layer
41 Ni plating layer
42 outer surface plating layer
61 semiconductor device
101 semiconductor device
153 gate main surface electrode (electrode)
155 source main surface electrode (electrode)
166 first gate opening (first opening)
167 first source opening (first opening)
171 second gate opening (second opening)
172 gate inner peripheral edge of inorganic insulating layer
173 second source opening (second opening)
174 source inner peripheral edge of inorganic insulating layer
183 first Ni plating layer
184 first outer surface plating layer
193 second Ni plating layer
194 second outer surface plating layer
201 semiconductor device
301 semiconductor package
302 package main body
303 first main surface (first surface)
304 second main surface (second surface)
305A side surface
305B side surface
305C side surface
305D side surface
310 first metal plate
311 first heat dissipating portion
312 first terminal portion
320 second metal plate
321 second heat dissipating portion
322 second terminal portion
341 SBD chip (semiconductor device)
342 MISFET chip (semiconductor device)
351 first metal spacer
352 second metal spacer
T2 thickness of inorganic insulating layer
T4 thickness of Ni plating layer
T5 thickness of outer surface plating layer
W width of inner peripheral edge of inorganic insulating layer
WG width of gate inner peripheral edge of inorganic insulating layer
WS width of source inner peripheral edge of inorganic insulating layer

The invention claimed is:

1. A semiconductor device comprising:
a chip;
an electrode that is formed on the chip;
an inorganic insulating layer that covers the electrode and exposes the electrode from a first opening;
an organic insulating layer that covers the inorganic insulating layer, has a second opening having an opening end that is formed at an interval from an opening end of the first opening, and exposes an inner peripheral edge of the inorganic insulating layer in a region between the first opening and the second opening; and
an Ni plating layer that covers the electrode inside the first opening and covers the inner peripheral edge of the inorganic insulating layer inside the second opening, wherein
the inorganic insulating layer has a first outer wall, and
the organic insulating layer has a second outer wall positioned more inward than the first outer wall of the inorganic insulating layer.

2. The semiconductor device according to claim 1, wherein the Ni plating layer is formed at an interval toward an inorganic insulating layer side from the opening end of the second opening.

3. The semiconductor device according to claim 1, further comprising:
an outer surface plating layer that covers an outer surface of the Ni plating layer inside the second opening.

4. The semiconductor device according to claim 3, wherein the outer surface plating layer covers the Ni plating layer at an interval toward the inorganic insulating layer side from the opening end of the second opening.

5. The semiconductor device according to claim 3, wherein the outer surface plating layer has a thickness less than a thickness of the Ni plating layer.

6. The semiconductor device according to claim 1, wherein the Ni plating layer covers the inner peripheral edge of the inorganic insulating layer at an interval from the organic insulating layer inside the second opening.

7. The semiconductor device according to claim 1, wherein the inner peripheral edge of the inorganic insulating layer has a width that exceeds a thickness of the inorganic insulating layer.

8. The semiconductor device according to claim 3, wherein the outer surface plating layer has a portion that covers the inner peripheral edge of the inorganic insulating layer.

9. The semiconductor device according to claim 3, wherein the outer surface plating layer covers the Ni plating layer at an interval from the organic insulating layer.

10. The semiconductor device according to claim 1, wherein the chip is constituted of an SiC chip.

11. The semiconductor device according to claim 1, wherein the second outer wall of the organic insulating layer is formed in a curved shape depressed toward the inorganic insulating layer.

12. The semiconductor device according to claim 1, further comprising:

a transistor that is formed in the chip.

13. The semiconductor device according to claim 12, wherein the transistor includes unit cells that extend in a stripe shape.

14. The semiconductor device according to claim 13, wherein the transistor includes trench gate structures that extend in a stripe shape along the unit cells.

15. The semiconductor device according to claim 14, wherein
the chip has a rectangular shape as viewed in a plan view, and
the trench gate structures extends along a short side of the chip.

16. The semiconductor device according to claim 1, wherein the chip has a rectangular shape as viewed in a plan view.

17. The semiconductor device according to claim 1, wherein
the chip that has a first main surface on one side and a second main surface on the other side,
the electrode covers the first main surface,
a back surface electrode covers the second main surface, and
the back surface electrode includes a Ti layer.

18. The semiconductor device according to claim 1, wherein
the chip has a first main surface on one side and a second main surface on the other side,
the electrode covers the first main surface,
a back surface electrode covers the second main surface, and
the back surface electrode includes an Ni layer.

19. A semiconductor package comprising:
a package main body that is made of resin;
a plate shaped member that includes copper and that is arranged in the package main body; and
the semiconductor device according to claim 1 that is arranged in the package main body.

20. The semiconductor package according to claim 19, wherein
the electrode includes a source pad electrode, and
the plate shaped member is electrically connected to the source pad electrode.

* * * * *